(12) United States Patent
Tanuma et al.

(10) Patent No.: US 9,458,982 B2
(45) Date of Patent: Oct. 4, 2016

(54) LIGHT EMITTING DEVICE

(71) Applicant: ROHM CO., LTD., Kyoto-shi, Kyoto (JP)

(72) Inventors: Yuki Tanuma, Kyoto (JP); Tomoharu Horio, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 88 days.

(21) Appl. No.: 14/486,385

(22) Filed: Sep. 15, 2014

(65) Prior Publication Data

US 2015/0003077 A1 Jan. 1, 2015

Related U.S. Application Data

(63) Continuation of application No. 13/852,639, filed on Mar. 28, 2013, now Pat. No. 8,860,064, which is a continuation of application No. 12/872,895, filed on Aug. 31, 2010, now Pat. No. 8,426,886.

(30) Foreign Application Priority Data

| Sep. 11, 2009 | (JP) | 2009-209901 |
| Sep. 14, 2009 | (JP) | 2009-211238 |
| Sep. 30, 2009 | (JP) | 2009-227440 |
| May 26, 2010 | (JP) | 2010-120379 |

(51) Int. Cl.
*F21V 3/00* (2015.01)
*F21V 5/00* (2015.01)
(Continued)

(52) U.S. Cl.
CPC .............. *F21V 5/04* (2013.01); *H01L 24/97* (2013.01); *H01L 33/486* (2013.01); *H05B 33/02* (2013.01);
(Continued)

(58) Field of Classification Search
CPC ....... F21V 5/04; H01L 33/486; H01L 24/97; H01L 33/58; H01L 33/60; H01L 33/62; H01L 2224/48227; H01L 2224/48465; H01L 2224/48091; H01L 2924/3025; H01L 2924/12042; H05B 33/02; F21Y 2101/02; F21Y 2105/00
USPC .................. 362/311.1, 458, 311.01, 311.02; 257/98, 99, 100
See application file for complete search history.

(56) References Cited

U.S. PATENT DOCUMENTS 5,947,592 A * 9/1999 Barlow ................... F21V 29/02
362/294
6,822,269 B2 11/2004 Horiuchi et al.
(Continued)

FOREIGN PATENT DOCUMENTS

| JP | 2-100374 A | 4/1990 |
| JP | 5-327021 A | 12/1993 |

(Continued)

OTHER PUBLICATIONS

Office Action issued in counterpart Japanese Patent Application on Oct. 13, 2015 (15 pages).

*Primary Examiner* — Anh Mai
*Assistant Examiner* — Glenn Zimmerman
(74) *Attorney, Agent, or Firm* — Hamre, Schumann, Mueller & Larson, P.C.

(57) ABSTRACT

A light emitting device includes a light emitting element, a wire, and a substrate. The substrate is formed with a first recess and a second recess that are open in a common surface of the substrate. The first recess includes a first bottom surface and a first side surface connected to the first bottom surface. The light emitting element is disposed on the first bottom surface. The second recess includes a second bottom surface and a second side surface connected to the second bottom surface. The wire is bonded to the second bottom surface. Both of the first side surface and the second side surface reach the common surface. The first side surface is connected to both of the second bottom surface and the second side surface. The opening area of the first recess is larger than the opening area of the second recess.

9 Claims, 42 Drawing Sheets

(51) Int. Cl.
  *F21V 5/04* (2006.01)
  *H01L 33/48* (2010.01)
  *H05B 33/02* (2006.01)
  *H01L 23/00* (2006.01)
  *H01L 33/58* (2010.01)
  *H01L 33/60* (2010.01)
  *H01L 33/62* (2010.01)
  *F21Y 101/02* (2006.01)
  *F21Y 105/00* (2016.01)

(52) U.S. Cl.
  CPC ......... *F21Y 2101/02* (2013.01); *F21Y 2105/00* (2013.01); *H01L 33/58* (2013.01); *H01L 33/60* (2013.01); *H01L 33/62* (2013.01); *H01L 2224/48091* (2013.01); *H01L 2224/48227* (2013.01); *H01L 2224/48465* (2013.01); *H01L 2924/12042* (2013.01); *H01L 2924/3025* (2013.01)

(56) References Cited

U.S. PATENT DOCUMENTS

| | | | |
|---|---|---|---|
| 6,850,001 B2 | 2/2005 | Takekuma | |
| 7,038,195 B2 | 5/2006 | Kida et al. | |
| 7,247,940 B2 | 7/2007 | Hofer et al. | |
| 2003/0098459 A1* | 5/2003 | Horiuchi | H01L 33/486 257/81 |
| 2004/0016873 A1* | 1/2004 | Kida | H01L 31/0203 250/214 R |
| 2004/0075100 A1 | 4/2004 | Bogner et al. | |
| 2004/0201987 A1 | 10/2004 | Omata | |
| 2007/0007540 A1* | 1/2007 | Hashimoto | H01L 33/642 257/94 |
| 2007/0108436 A1* | 5/2007 | Sanmyo | H01L 33/62 257/13 |
| 2007/0145393 A1* | 6/2007 | Darbinian | H01L 33/483 257/98 |
| 2007/0152229 A1* | 7/2007 | Yoshida | B29C 45/14655 257/98 |
| 2007/0269927 A1 | 11/2007 | Hofer et al. | |
| 2010/0177519 A1* | 7/2010 | Schlitz | F04B 17/00 362/294 |
| 2010/0237383 A1 | 9/2010 | Lai | |
| 2011/0157891 A1* | 6/2011 | Davis | B29C 45/14467 362/244 |

FOREIGN PATENT DOCUMENTS

| | | |
|---|---|---|
| JP | 7-15046 | 1/1995 |
| JP | 7-254623 A | 10/1995 |
| JP | 11-74420 | 3/1999 |
| JP | 11-340257 A | 12/1999 |
| JP | 2000-68531 A | 3/2000 |
| JP | 2001-203396 A | 7/2001 |
| JP | 2002-152226 A | 5/2002 |
| JP | 2003-46137 A | 2/2003 |
| JP | 2003-124525 A | 4/2003 |
| JP | 2003-163378 A | 6/2003 |
| JP | 2003-324217 A | 11/2003 |
| JP | 2005-322680 A | 11/2005 |
| JP | 2006-514434 A | 4/2006 |
| JP | 2007-81063 A | 3/2007 |
| JP | 3133674 A | 6/2007 |
| JP | 2007-184377 | 7/2007 |

* cited by examiner

FIG.1
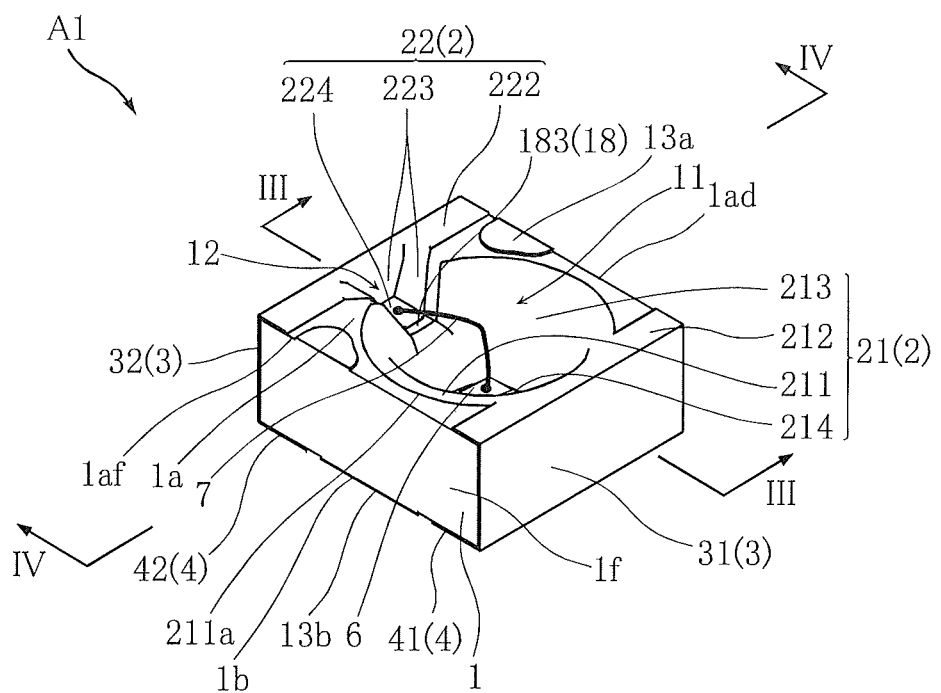
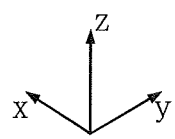

LIGHT EMITTING DEVICE

This application is a Continuation of U.S. Ser. No. 13/852,639, filed Mar. 28, 2013, which is a Continuation of U.S. Ser. No. 12/872,895 filed Aug. 31, 2010, which applications are incorporated herein by reference.

BACKGROUND OF THE INVENTION

1. Field of the Invention

The present invention relates to a light emitting device.

2. Description of the Related Art

Examples of conventional light emitting devices include those disclosed in JP-A-7-15046 and JP-A-2007-184377. The conventional light emitting devices disclosed in these documents are described below.

FIGS. 55 and 56 illustrate the light emitting device disclosed in JP-A-7-15046. The illustrated light emitting device 9A includes a substrate 91, a first conductor pattern 92, a second conductor pattern 93, a light emitting element 94 and a wire 95.

The front surface 91a of the substrate 91 is formed with a recess 911, and a recess 912 which is larger than the recess 911. The recess 911 is formed in the bottom surface 912a of the recess 912. The side surface 911b of the recess 911 is a reflective surface which reflects the light emitted from the light emitting element 94. The first conductor pattern 92 extends from the front surface 91a of the substrate 91 onto the bottom surface 911a of the recess 911. The second conductor pattern 93 extends from the front surface 91a of the substrate 91 onto the bottom surface 912a of the recess 912. The light emitting element 94 is disposed on the bottom surface 911a of the recess 911 and electrically connected to an end of the first conductor pattern 92. The wire 95 is connected to the light emitting element 94 and to the second conductor pattern 93.

In the above-described light emitting device 9A, it may be desired to increase the intensity of light emitted toward the front while maintaining a desired directivity angle. As a means to achieve this, it may be considered to increase the area of the reflective surface (side surface) 911b by increasing the depth of the recess 911. However, since the recess 911 is formed in the bottom surface 912a of the recess 912, the depth of the recess 911 can be increased only within a limited range. As a result, the area of the side surface 911b may not be increased sufficiently.

FIG. 57 illustrates a light emitting device (an LED module) disclosed in JP-A-2007-184377. The illustrated light emitting element 9B includes an LED element 581, a case 582 having a main surface 583, a first lead 586 to which the LED element 581 is bonded, and a second lead 589 connected to the LED element 581 by way of a wire 593. The main surface 583 is formed with a recess 585 including a reflective surface 584. The first lead 586 includes an inner lead portion 587 extending from one side of the case 582 to near the center of the recess 585. The inner lead portion 587 includes a leading end (rectangular die pad portion) to which the LED element 581 is bonded to face the reflective surface 584. Specifically, the LED element 581 is bonded with a conductive adhesive, with its four corners positioned correspondingly to the corners of the die pad portion, respectively. The second lead 589 includes an inner lead portion 590 extending from the other side of the case 582 to near the inner lead portion 587 of the first lead 586. The recess 585 is filled with light-transmitting resin 592.

In manufacturing the LED module 9B, the light-transmitting resin 592 in the liquid state is loaded into the recess 585. Thereafter, as the light-transmitting resin 592 hardens, the inner lead portions 587, 590 of the first and the second leads 586, 589 are bonded to the surface of the light-transmitting resin 592. The outer lead portions 588 and 591 are bent by forming to extend from the main surface 583 along the side surfaces and then along the bottom surface of the case 582. Of the outer lead portions 588 and 591 bent in this way, the portions which extend along the bottom surface of the case 582 are used as electrode terminals.

The light emitted from the LED element 581 is reflected at the reflective surface 584 of the recess 585, passes through the light-transmitting resin 592, and is then emitted to the outside of the case 582. In this process, the inner lead portion 587 and 590 act as a light shielding portion which blocks the light traveling toward the outside. Therefore, in terms of enhancing the brightness, it is preferable that the inner lead portions 587 and 590 are as narrow as possible. In bonding the LED element 581 to the die pad portion of the first lead 586 by way of a conductive adhesive, the conductive adhesive tends to be pressed out of the four sides of the LED element 581. Thus, to secure a sufficient space around the LED element 581, it is demanded that each side of the die pad portion has a large dimension. However, this demand is incompatible with the demand for a reduction in width of the inner lead portion 587.

Further, when the inner lead portion 587 and 590 of the LED module 9B is narrow, the surface area of the portion which is in contact with the light-transmitting resin 592 is small, which leads to deteriorated bonding strength to the light-transmitting resin 592. In such a case, there is a risk that the inner lead portions 587 and 590 separate from the light-transmitting resin 592 due to the elastic recovery of the outer lead portions 588 and 591 which have been bent by forming.

SUMMARY OF THE INVENTION

The present invention has been proposed under the circumstances described above. It is therefore an object of the present invention to provide a light emitting device which is capable of enhancing the intensity of front illumination or increasing the brightness.

A light emitting device provided according to a first aspect of the present invention includes a light emitting element, a wire connected to the light emitting element, and a substrate supporting the light emitting element. The substrate is formed with a first recess and a second recess that are open in a common surface of the substrate. The first recess includes a first bottom surface and a first side surface connected to the first bottom surface, and the light emitting element is disposed on the first bottom surface. The second recess includes a second bottom surface and a second side surface connected to the second bottom surface, and the wire is bonded to the second bottom surface. Both of the first side surface and the second side surface reach the common surface. The first side surface is connected to both of the second bottom surface and the second side surface. The opening area of the first recess is larger than the opening area of the second recess.

Preferably, the light emitting device according to the present invention further includes a back conductor layer formed on a back surface of the substrate. The substrate includes a back covered portion and a back exposed portion. The back covered portion is covered with the back conductor layer. The back exposed portion constitutes the back surface and is exposed from the back conductor layer. The back covered portion and the back exposed portion are made of a same material.

Preferably, the light emitting device according to the present invention further includes a front conductor layer electrically connected to the light emitting element and covering the common surface only partially. The substrate includes a front covered portion and a front exposed portion. The front covered portion is covered with the front conductor layer. The front exposed portion constitutes the common surface and is exposed from the front conductor layer. The front covered portion and the front exposed portion are made of a same material.

Preferably, the front conductor layer includes a first front electrode at least part of which is formed on the first side surface. The first front electrode includes a frame portion surrounding the first recess.

Preferably, the frame portion includes an outer edge conforming to the edge of the opening of the first recess.

Preferably, the common surface includes a first edge that is positioned closer to the first recess than to the second recess in a first direction in which the first recess and the second recess are aligned and that extends in a second direction crossing the first direction. The first front electrode includes a first strip-like portion elongated along the first edge.

Preferably, the distance between the edge of the opening of the first recess and the first edge is smaller than the size of the first strip-like portion in the first direction.

Preferably, the front conductor layer includes a second front electrode at least part of which is formed on the second bottom surface and which is insulated from the first front electrode. The front exposed portion includes a bottom exposed region. The bottom exposed region is positioned at an end, of the second bottom surface, which is closer to the first recess, and flanked by the first front electrode and the second front electrode.

Preferably, the substrate includes a side surface oriented in a second direction crossing a first direction in which the first recess and the second recess are aligned. The back conductor layer includes an edge oriented in the second direction, and the edge includes a portion spaced apart from the side surface.

Preferably, the edge includes a portion that is positioned at an end of the back surface in the first direction and that is flush with the side surface.

Preferably, the second front electrode includes a gap extending from the second recess away from the first recess.

Preferably, the light emitting device according to the present invention further includes a lens including a convex surface. The convex surface bulges in the direction in which the first recess opens and overlaps the first recess as viewed in the direction in which the first recess opens.

Preferably, the lens includes a plate portion positioned between the first recess and the convex surface and covering the first recess.

Preferably, the plate portion includes a first surface that faces the first recess and that is flat.

Preferably, the plate portion includes a first surface that faces the first recess and that bulges toward the first recess.

Preferably, the plate portion includes a lens side surface that is oriented in a first direction in which the first recess and the second recess are aligned and that is a rough surface.

Preferably, the plate portion includes a second surface that is opposite to the first surface and that is a rough surface.

Preferably, the lens includes a tapered surface connected to the convex surface and surrounding the convex surface as viewed in a direction in which the first recess opens.

Preferably, the tapered surface is a mirror surface.

Preferably, the substrate includes a raised portion formed on the common surface side and raised in the direction in which the first recess opens.

Preferably, the light emitting device according to the present invention further includes an adhesive layer that fixes the lens to the substrate.

Preferably, the adhesive layer comprises a bonding sheet.

Preferably, the adhesive layer comprises a liquid adhesive.

Preferably, the light emitting device according to the present invention further includes a resin portion covering the light emitting element.

Preferably, the resin portion includes a light emitting surface through which light from the light emitting element is emitted, and the light emitting surface bulges in the direction in which the first recess opens.

Preferably, the edge of the opening of the first recess is circular as viewed in the depth direction of the first recess. The distance between the center of the first recess and the edge of the opening of the first recess is larger than the distance between the center and the bottom exposed region.

Preferably, the boundary region between the second bottom surface and the first side surface of the first recess comprises a flat surface or a curved surface.

Preferably, the first recess has a parabolic shape.

Preferably, the second recess is shaped like a truncated quadrangular pyramid.

Preferably, the first recess and the second recess occupy 70 to 90% of the area of the common surface of the substrate.

Other features and advantages of the present invention will become more apparent from detailed description given below with reference to the accompanying drawings.

BRIEF DESCRIPTION OF THE DRAWINGS

FIG. 1 is a perspective view illustrating a light emitting device according to a first embodiment of the invention;

DETAILED DESCRIPTION OF THE PREFERRED EMBODIMENTS

Figure 2:
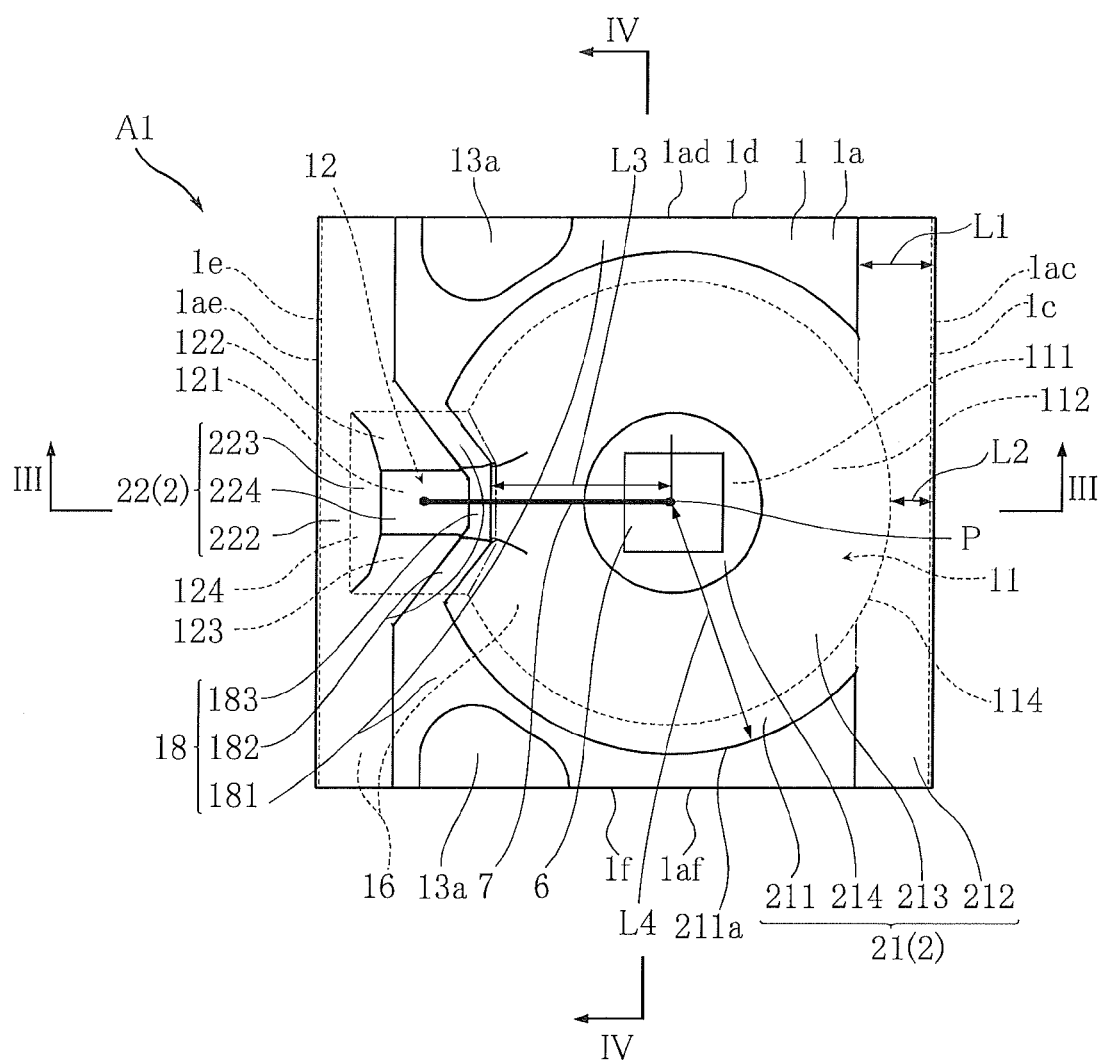
FIG. 2 is a plan view illustrating the light emitting device of FIG. 1.

Preferred embodiments of the present invention are described below with reference to the accompanying drawings.

FIGS. 1-5 illustrate a light emitting device according to a first embodiment of the present invention. The illustrated light emitting device A1 is used for e.g. a cell phone as the light source for emitting infrared light. The light emitting device A1 includes a substrate 1, a front conductor layer 2, a side conductor layer 3, a back conductor layer 4, a light emitting element 6 and a connection wire 7. The size of the light emitting device A1 is about 2.3 mm in direction x, about 2.1 mm in direction y and about 0.95 mm in direction z.

Figure 3:
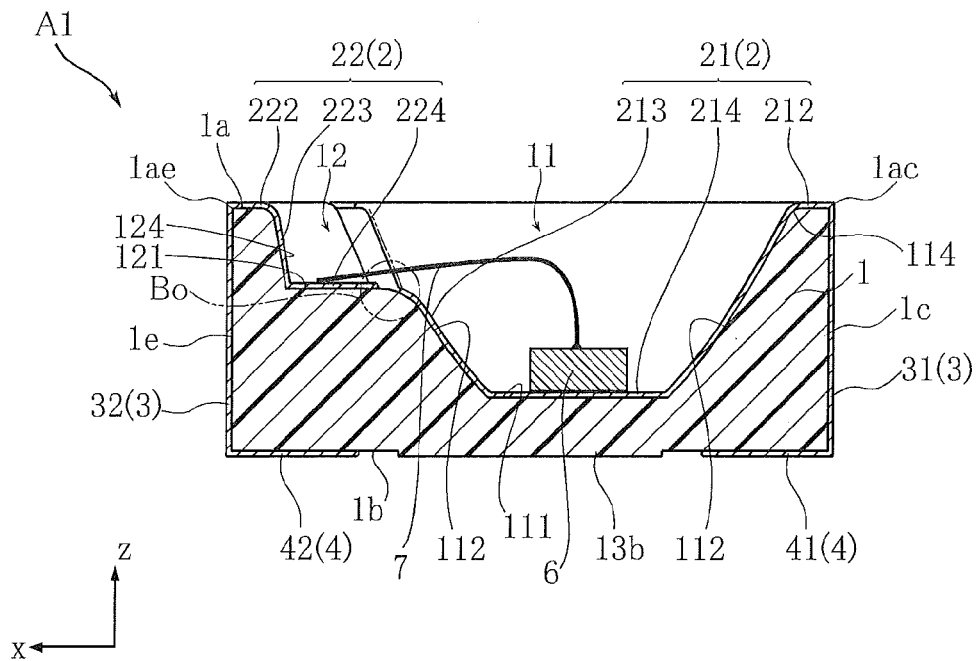
FIG. 3 is a sectional view taken along lines in FIGS. 1 and 2.
Figure 4:
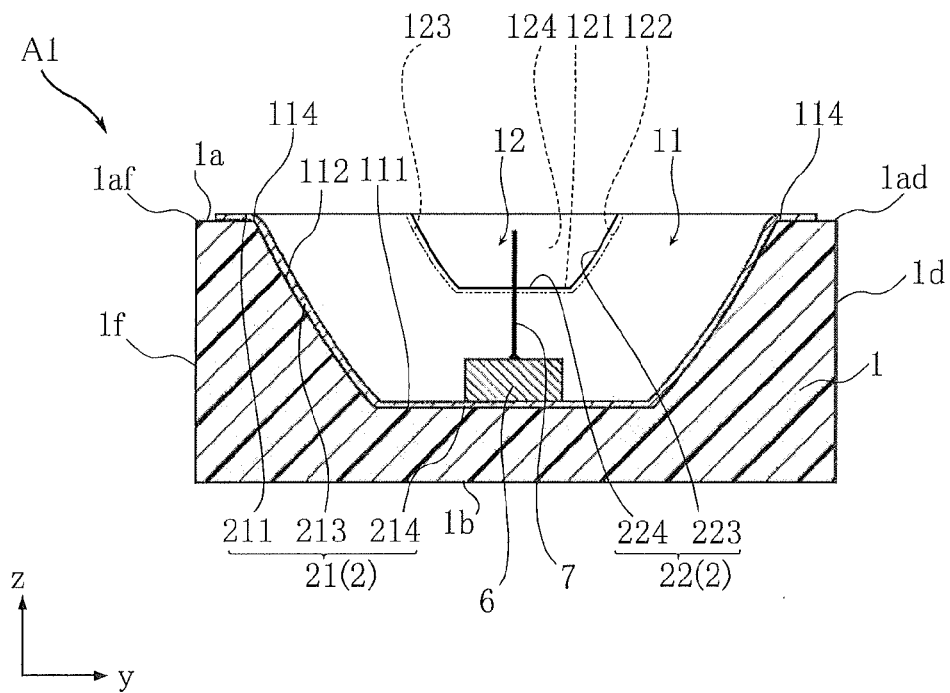
FIG. 4 is a sectional view taken along lines IV-IV in FIGS. 1 and 2.

As illustrated in FIGS. 1-5, the substrate 1 is in the form of a rectangular parallelepiped. The substrate 1 is made of an insulating resin to which plating easily adheres. Examples of such a plating-adherable resin includes liquid crystal polymer. As illustrated in FIGS. 2-4, the substrate 1 includes a front surface 1a, a back surface 1b, and side surfaces 1c, 1d, 1e, 1f. In FIGS. 1-5, the boundaries between the front surface 1a and the side surfaces 1c, 1d, 1e and 1f are defined as edges 1ac, 1ad, 1ae and 1af, respectively.

As illustrated in FIGS. 1-4, the substrate 1 is formed with two recesses which open on the front surface 1a side, namely, a first recess 11 and a second recess 12. The first recess 11 has a parabolic shape and has a volume larger than that of the second recess 12. The first recess 11 may have a shape other than a parabolic shape, such as a truncated quadrangular pyramid, for example.

As illustrated in FIGS. 2-4, the first recess 11 includes a flat bottom surface 111, and a side surface 112 extending upward from the periphery of the bottom surface 111. The bottom surface 111 has a circular shape having a diameter of e.g. about 0.653 mm. As illustrated in FIGS. 3 and 4, the side surface 112 includes a portion extending from the bottom surface 111 to reach the front surface 1a of the substrate 1, and a relatively low portion which also extends from the bottom surface 111 but does not reach the front surface 1a. As illustrated in FIG. 2, the boundary between the side surface 112 and the front surface 1a is the edge (edge of the opening) 114 of the first recess 11. Although the edge 114 is circular in x-y plan view, the edge 114 is partially cut away due to the presence of the second recess 12. In plan view (FIG. 2), the total area of the first recess 11 and the second recess 12 (the sum of the opening areas of the two recesses in the front surface 1a of the substrate 1) is set to 70 to 90% of the area of the rectangular substrate 1.

As illustrated in FIGS. 1-3, the second recess 12 is aligned with the first recess 11 in direction x. The second recess 12 is in the form of a truncated quadrangular pyramid and communicates with the first recess 11, with part of the side surface 112 of the first recess 11 cut away. The second recess 12 is not limited to a truncated quadrangular pyramidal one, but may be in the form of a truncated cone, for example. The second recess 12 includes a bottom surface 121 and three side surfaces 122, 123, 124. The inclination of each side surface 122, 123, 124 may be equal to the inclination of the side surface 112 of the first recess 11.

The bottom surface 121 has an elongated rectangular shape having a size of about 0.32 mm in direction x and a size of about 0.26 mm in direction y. The area of the bottom surface 121 is considerably smaller than that of the bottom surface 111. The opening area of the first recess 11 is larger than that of the second recess 12. As illustrated in FIGS. 3 and 4, the bottom surface 121 is located closer to the front surface 1a side (upper side in the figures) than the bottom surface 111 is. As indicated by circle Bo in FIG. 3, the boundary region between the bottom surface 121 of the second recess 12 and the side surface 112 of the first recess 11 comprises a curved surface. However, the present invention is not limited to this, and the boundary region may have other configuration such as a flat surface (beveled surface).

As illustrated in FIGS. 2 and 4, the side surfaces 122 and 123 face each other. The side surfaces 122 and 123 extend, from edges of the bottom surface 121 which extend in direction x, up to the front surface 1a of the substrate 1. As illustrated in FIG. 4, the side surfaces 122 and 123 form an angle of e.g. 120 degrees to the bottom surface 121. As illustrated in FIGS. 2 and 3, the side surface 124 extends, from an edge of the bottom surface 121 which extends in direction y, up to the front surface 1a of the substrate 1. The side surface 124 is connected to the side surfaces 122 and 123. As illustrated in FIG. 3, the side surface 124 forms an angle of e.g. 100 degrees to the bottom surface 121.

As illustrated in FIGS. 2-4, the bottom surface 121 is connected to a portion, of the side surface 112 of the first recess 11, which does not reach the front surface 1a and which hence has a relatively low height. Each of the side surfaces 122 and 123 is connected to a portion, of the side surface 112, which extends up to the front surface 1a. In this way, the second recess 12 is connected to the first recess 11.

As illustrated in FIGS. 1-3 and FIG. 5, the substrate 1 is formed with raised portions 13a and 13b. The raised portions 13a are provided on the front surface 1a side of the substrate 1 and raised in direction z (i.e., the direction in which the first recess 11 opens). As illustrated in FIGS. 1 and 2, in plan view, each of the raised portions 13a has a shape obtained by halving a triangle with rounded angles. The raised portion 13b is provided on the back surface 1b side of the substrate 1 and raised in a direction opposite to direction z. The raised portion 13b is elongated in direction y. In the manufacturing process of the light emitting device A1, which will be described later, the raised portions 13a and 13b are utilized as a base for attaching a sheet for protecting the light emitting element 6, the wire 7 and so on against dust.

As illustrated in FIGS. 1-4, the front conductor layer 2 is formed on the front surface 1a side of the substrate 1. The front conductor layer 2 is formed by successively laminating a Cu layer, an Ni layer and an Au layer on the substrate 1. The front conductor layer 2 includes a first front electrode 21 and a second front electrode 22. The first front electrode 21 is arranged on the right side in FIG. 2, whereas the second front electrode 22 is arranged on the left side in FIG. 2. The first front electrode 21 and the second front electrode 22 are insulated from each other.

The first front electrode 21 includes a frame portion 211, a strip-like portion 212, an inner electrode 213 and a bottom electrode 214.

As illustrated in FIGS. 3 and 4, the bottom electrode 214 is formed on the bottom surface 111 of the first recess 11. The inner electrode 213 is formed on the side surface 112 of the first recess 11. The inner electrode 213 is formed also at portions, of the bottom surface 121 and side surfaces 122, 123 of the second recess 12, which are close to the first recess 11. As illustrated in FIG. 2, the frame portion 211 surrounds the edge 114 of the first recess 11. The frame portion 211 is formed outside the first recess 11 and connected to the inner electrode 213. The frame portion 211 has a generally ring-like shape surrounding the edge 114 of the first recess 11. The outer edge 211a of the frame portion 211 conforms to the edge 114 of the first recess 11.

As illustrated in FIG. 2, the strip-like portion 212 is provided at an end of the substrate 1 in direction x, or the end on the edge 1ac side. The strip-like portion 212 extends from the edge 1af to the edge 1ad in direction y. The strip-like portion 212 is connected to the inner electrode 213 and the frame portion 211. The width L1 of the strip-like portion 212 (size in direction x) is larger than the distance L2 between the edge 1ac and the edge 114 of the first recess 11. For instance, the width L1 is 0.29 mm, whereas the distance L2 is 0.17 mm.

As illustrated in FIGS. 1-4, the second front electrode includes a strip-like portion 222, an inner electrode 223 and a bottom electrode 224.

As illustrated in FIGS. 2 and 3, the bottom electrode 224 is formed on the bottom surface 121 of the second recess 12. The bottom electrode 224 is formed to reach a portion, of the bottom surface 121, which is close to the first recess 11. However, the bottom electrode 224 is spaced apart from the inner electrode 213. The inner electrode 223 is formed on the side surfaces 122, 123, 124 of the second recess 12. The inner electrode 223 covers the entirety of the side surface 124. The inner electrode 223 is formed to reach a portion, of the side surfaces surface 122 and 123, which is close to the first recess 11. However, the inner electrode 223 is spaced apart from the inner electrode 213. The inner electrode 223 is connected to the bottom electrode 224.

As illustrated in FIG. 2, the strip-like portion 222 is provided at an end of the substrate 1 in direction x, or the end on the edge 1ae side. The strip-like portion 222 extends from the edge 1af to the edge 1ad in direction y. The strip-like portion 222 is connected to the inner electrode 223.

As illustrated in FIG. 2, the portion, of the substrate 1, which is covered with the front conductor layer 2, is a front covered portion 16. The portion, of the front surface 1a side of the substrate 1, which is not covered with the front conductor layer 2, is a front exposed portion 18. By the presence of the front exposed portion 18, the first front electrode 21 and the second front electrode 22 are insulated from each other. As will be described later, the formation of the front conductor layer 2 at an appropriate region of the substrate 1 is achieved by laser patterning, not by making the substrate 1 out of a plating-adherable resin and a non-plating-adherable resin. Thus, the front exposed portion 18 and the front covered portion 16 are made of a same plating-adherable resin. The front exposed portion 18 includes front-surface exposed regions 181, inner exposed regions 182 and a bottom exposed region 183.

The front-surface exposed regions 181 are the region, of the front surface 1a of the substrate 1, which is not covered with the front conductor layer 2. The front exposed regions 181 are located on each side of the first and the second recesses 11 and 12 in direction y (upper side and lower side in FIG. 2). Each of the front-surface exposed regions 181 is surrounded by the frame portion 211, the strip-like portion 212, the strip-like portion 222 and the edge 1af or 1ad.

The inner exposed regions 182 are the regions, of the side surfaces 122 and 123 of the second recess 12, which are not covered with the front conductor layer 2. The inner exposed regions 182 exist due to the separation of the inner electrode 223 and the inner electrode 213. The inner exposed regions 182 have a shape conforming to the portion where the first recess 11 and the second recess 12 adjoin to each other. The inner exposed regions 182 extend from the front surface 1a of the substrate 1 to reach the bottom surface 121.

The bottom exposed region 183 is the region, of the bottom surface 121 of the second recess 12, which is not covered with the front conductor layer 2. The bottom exposed region 183 is positioned at an end of the bottom surface 121 which is closer to the first recess 11. The bottom exposed region 183 exists due to the separation of the bottom electrode 224 and the inner electrode 213. That is, the bottom exposed region 183 is a region flanked by the bottom electrode 224 and the inner electrode 213. The bottom exposed region 183 has a strip-like form extending in direction y. The bottom exposed region 183 is connected to the inner exposed regions 182. As illustrated in FIG. 2, in x-y plan view, the distance L3 between the bottom exposed region 183 and the center P of the circle defined by the edge 114 of the first recess 11 is smaller than the distance L4 between the edge 114 of the first recess 11 and the center P.

As illustrated in FIGS. 1 and 3, the side conductor layer 3 includes a first side electrode 31 and a second side electrode 32. The first side electrode 31 is provided on the side surface 1c of the substrate 1. As illustrated in FIG. 1, the first side electrode 31 covers the entirety of the side surface 1c. The first side electrode 31 is connected to the strip-like portion 212. Thus, the first side electrode 31 is electrically connected to the first front electrode 21.

The second side electrode 32 is provided on the side surface 1e of the substrate 1. The second side electrode 32 covers the entirety of the side surface 1e. The second side electrode 32 is connected to the strip-like portion 222. Thus, the second side electrode 32 is electrically connected to the second front electrode 22.

Figure 5:
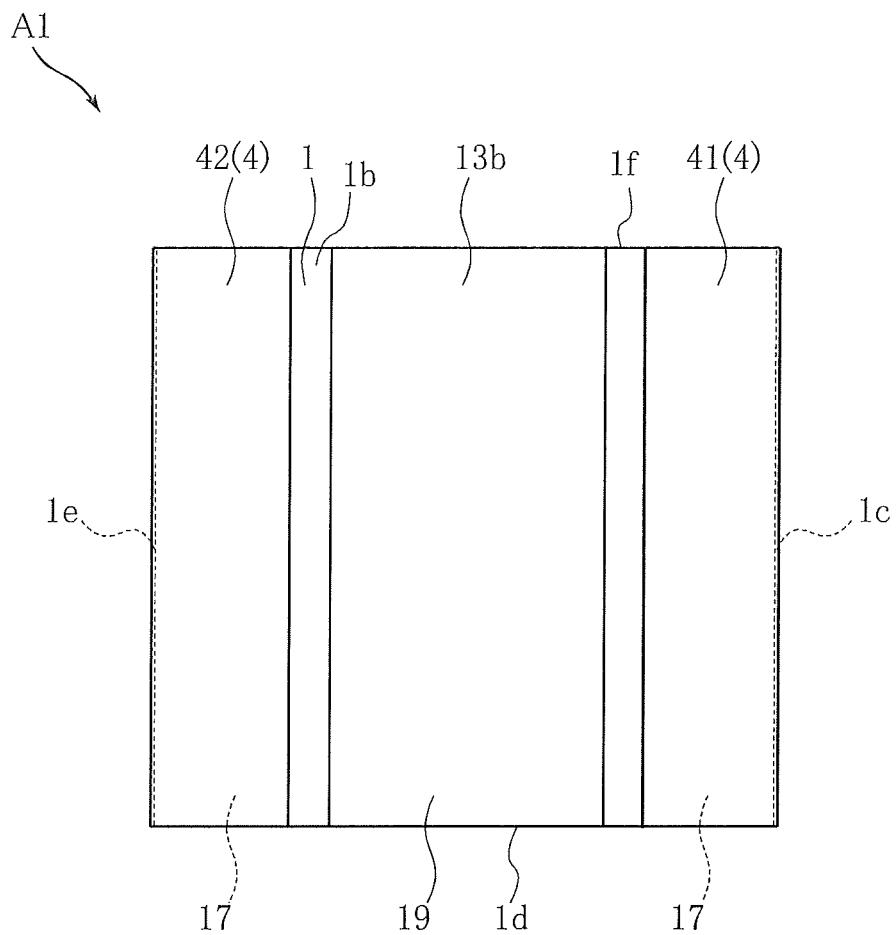
FIG. 5 is a bottom view illustrating the light emitting device of FIG. 1.

As illustrated in FIGS. 1, 3 and 5, the back conductor layer 4 is formed on the back surface 1b of the substrate 1. The back conductor layer 4 includes a first back electrode 41 and a second back electrode 42. As illustrated in FIG. 5, both of the first back electrode 41 and the second back electrode 42 have a strip-like form extending in direction y along the entire edges 1c or 1e of the back surface 1b of the substrate 1. It is preferable that the first back electrode 41 and the second back electrode 42 have a large width of e.g. about 0.5 mm. The first back electrode 41 is connected to the first side electrode 31. Thus, the first back electrode 41, the first side electrode 31 and the first front electrode 21 are electrically connected to each other. The second back electrode 42 is connected to the second side electrode 32. Thus, the second back electrode 42, the second side electrode 32 and the second front electrode 22 are electrically connected to each other.

Both of the side conductor layer 3 and the back conductor layer 4 have a laminated structure which is similar to that of the front conductor layer 2, i.e., the laminated structure made up of a Cu layer, an Ni layer and an Au layer.

As illustrated in FIG. 5, the portion, of the substrate 1, which is covered with the back conductor layer 4, is a back covered portion 17. The portion, of the back surface 1b side of the substrate 1, which is not covered with the back conductor layer 4 is a back exposed portion 19. As will be described later, the formation of the back conductor layer 4 at an appropriate region of the substrate 1 is achieved by laser patterning, not by making the substrate 1 out of a plating-adherable resin and a non-plating-adherable resin. Thus, the back exposed portion 19 and the back covered portion 17 are made of a same plating-adherable resin.

As illustrated in FIGS. 1-4, the light emitting element 6 is disposed on the bottom surface 111 of the first recess 11. The light emitting element 6 is e.g. an LED element which is capable of emitting infrared light. Depending on the applications, a light emitting element which is capable of emitting e.g. visible light may be employed as the light emitting element 6. In this embodiment, the cathode terminal of the light emitting element 6 is connected to the bottom electrode 214. Thus, in this embodiment, the first front electrode 21, the first side electrode 31 and the first back electrode 41 can be called a cathode electrode.

The wire 7 is connected to the light emitting element 6. In this embodiment, the wire 7 is connected to the anode terminal of the light emitting element 6. The wire 7 is bonded to the bottom electrode 224. Thus, the bottom electrode 224 and the anode terminal of the light emitting element 6 are electrically connected to each other. Thus, in this embodiment, the second front electrode 22, the second side electrode 32 and the second back electrode 42 can be called an anode electrode.

The first recess 11 and the second recess 12 are filled with non-illustrated resin, whereby the light emitting element 6 and the wire 7 are protected and fixed.

A method for manufacturing the light emitting device A1 according to the present embodiment is described below with reference to FIGS. 6-11. In the manufacturing method of the light emitting device A1, laser patterning is employed. The details are as follows.

Figure 6:
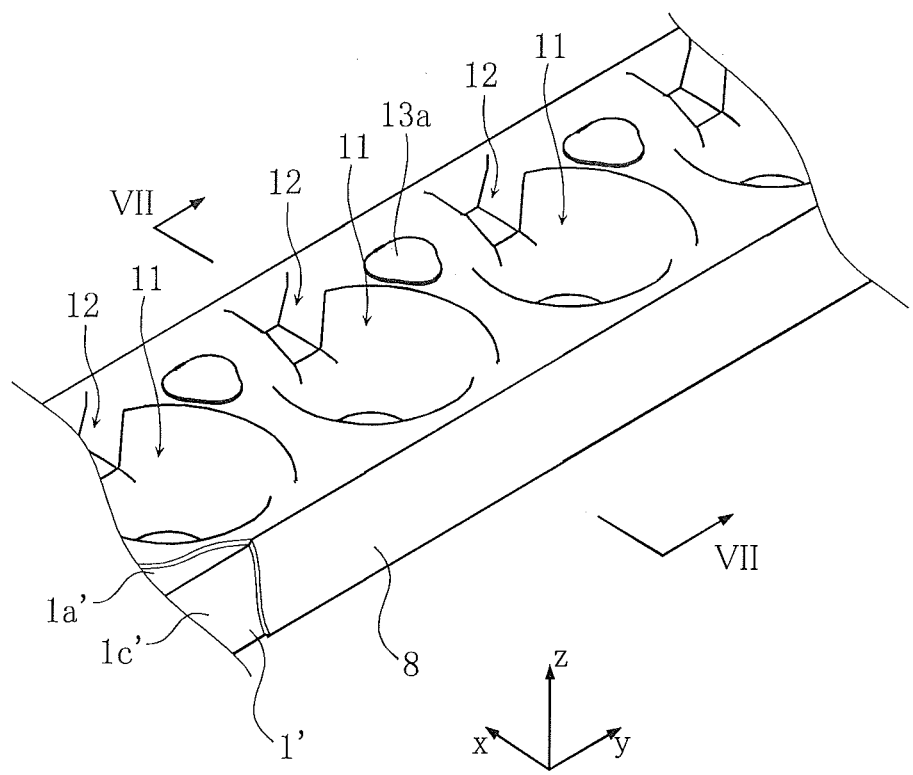
FIG. 6 is a perspective view illustrating a step of a method for manufacturing the light emitting device according to the first embodiment of the present invention.
Figure 7:
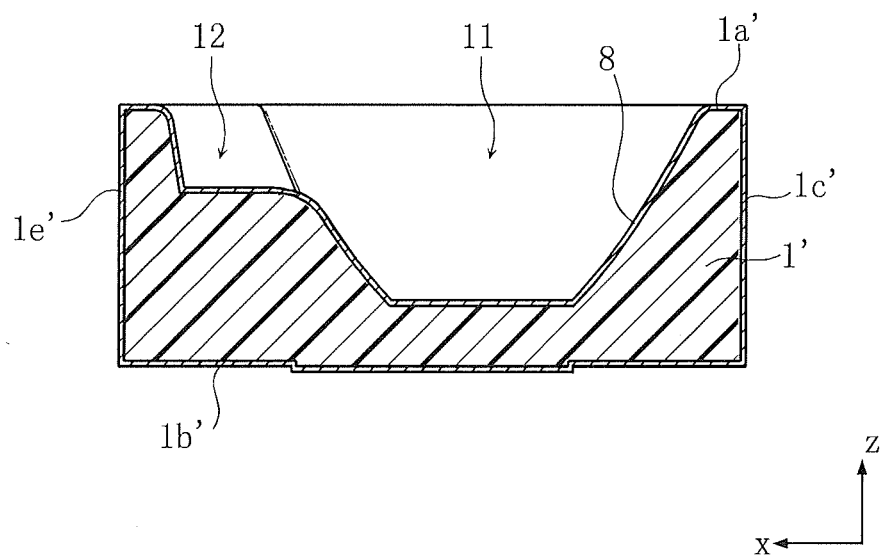
FIG. 7 is a sectional view taken along lines VII-VII in FIG. 6.

FIG. 6 is a perspective view illustrating a step of a method for manufacturing the light emitting device A1. FIG. 7 is a sectional view taken along lines VII-VII in FIG. 6. First, as illustrated in FIGS. 6 and 7, a material substrate 1' extending in direction y is prepared. The material substrate 1' is formed with a plurality of pairs of first and second recesses 11 and 12 arranged side by side in direction y. The first recess 11 and the second recess 12 in each pair are connected to each other. Then, metalizing is performed with respect to the material substrate 1'. In the metalizing step, a conductive film 8 is formed on the entire surface of the material substrate 1', including the front surface 1a', the back surface 1b', the side surfaces 1c' and 1e', and the inner surfaces of the first recess 11 and the second recess 12. The conductive film 8 is made of e.g. Cu.

Figure 8:
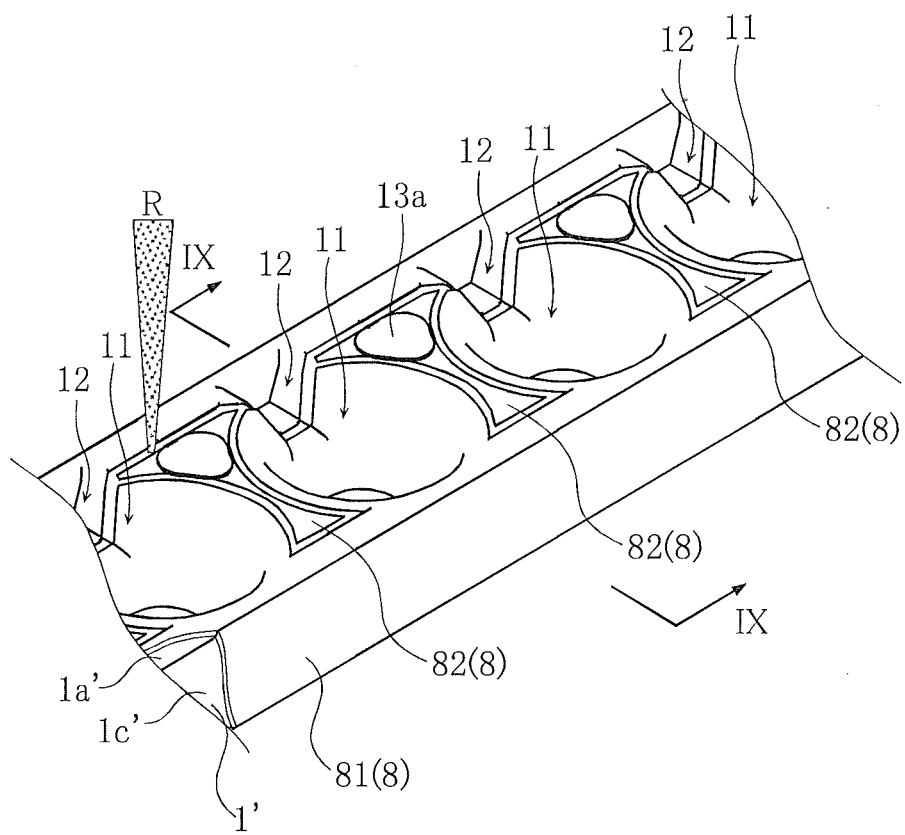
FIG. 8 illustrates a step subsequent to the step of FIG. 6.
Figure 9:
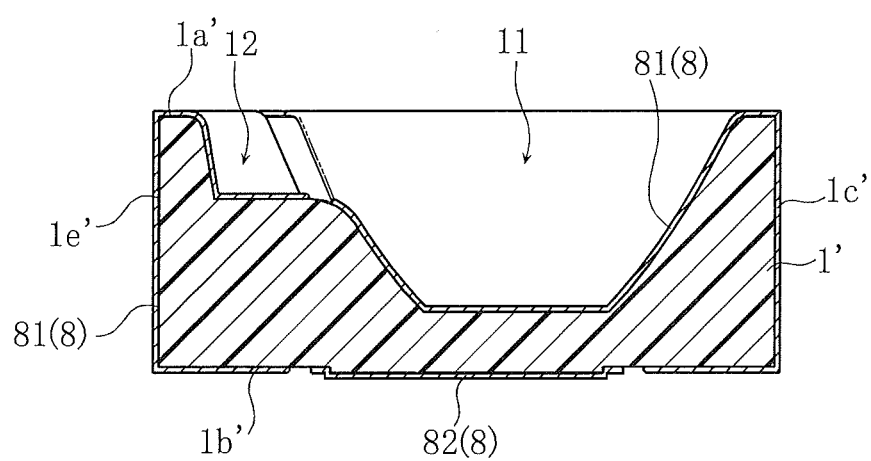
FIG. 9 is a sectional view taken along lines IX-IX in FIG. 8.

FIG. 8 is a perspective view illustrating the step subsequent to the step shown in FIG. 6. FIG. 9 is a sectional view taken along lines IX-IX in FIG. 8. As illustrated in FIGS. 8 and 9, patterning is performed by irradiating the front surface 1a' and the back surface 1b' of the material substrate 1' with laser R. By the irradiation of laser R, part of the conductor film 8 is removed along the contour of the front conductor layer 2 and the back conductor layer 4 illustrated in FIGS. 1-5. By this partial removal of the conductor film 8, the conductor film 8 is divided into a circuit portion 81 and a non-circuit portion 82. Herein, the circuit portion 81 denotes the portion which is to become the front conductor layer 2, the back conductor layer 4 or the side conductor layer 3. Then, Cu electroplating is performed to deposit Cu only on the circuit portion 81.

Figure 10:
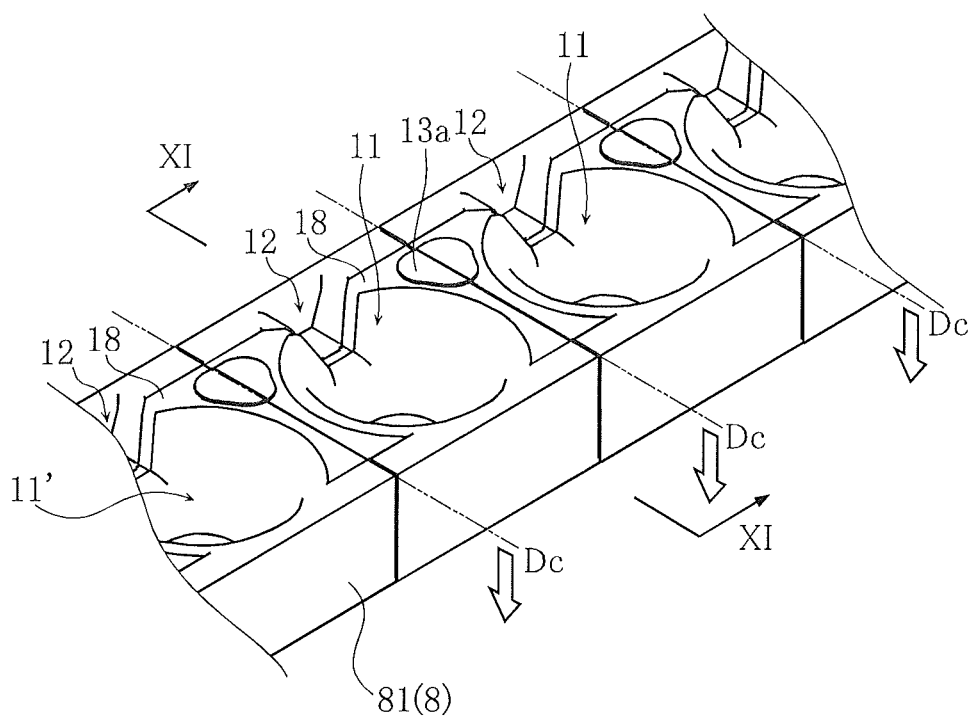
FIG. 10 illustrates a step subsequent to the step of FIG. 8.
Figure 11:
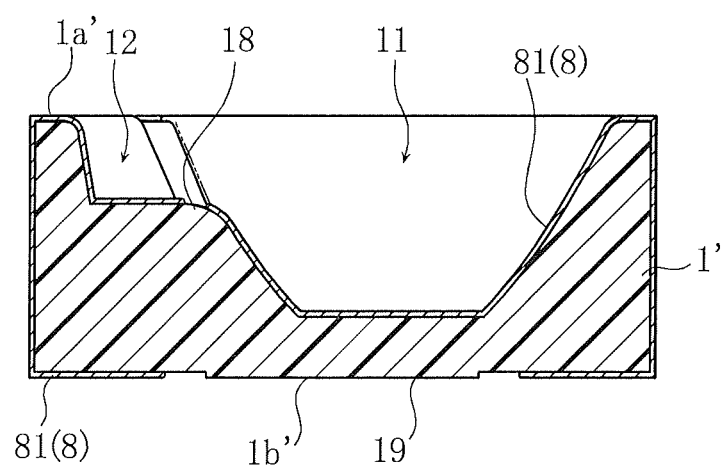
FIG. 11 is a sectional view taken along lines XI-XI in FIG. 10.

FIG. 10 is a perspective view illustrating the step subsequent to the step shown in FIG. 8. FIG. 11 is a sectional view taken along lines XI-XI in FIG. 10. As illustrated in FIGS. 10 and 11, soft etching is performed to remove the non-circuit portion 82 of the conductor film 8. By this process, the front exposed portion 18 and the back exposed portion 19 are formed. Then, Ni plating and then Au plating are performed with respect to the circuit portion 81, whereby an Ni layer and an Au layer are laminated on the circuit portion 81 made of Cu. Thus, the front conductor layer 2, the side conductor layer 3 and the back conductor layer 4 illustrated in FIGS. 1-5 are formed. Then, the light emitting element 6 and the wire 7 as illustrated in FIGS. 1-4 are bonded (not shown). Then, the material substrate 1' is cut along lines Dc indicated in FIG. 10. Thus, the manufacture of the light emitting device A1 is completed.

The advantages of the light emitting device A1 according to the present embodiment are described below.

In the light emitting device A1, the side surface 112 of the first recess 11 reaches the front surface 1a of the substrate 1 except at the portion where the side surface 112 is connected to the bottom surface 121 of the second recess 12. Thus, according to the light emitting device A1, the height of the side surface 112 can be made high (in other words, the depth of the recess 11 can be made deep) except at the portion where the side surface 112 is connected to the bottom surface 121 of the second recess 12. Thus, in the light emitting device A1, the intensity of light emitted toward the front is enhanced. Further, the directivity angle of the light emitting device A1 can be made narrow.

As noted in the description of the manufacturing method of the light emitting device A1, laser patterning is used to form the conductor layer 8 only at a desired region of the material substrate 1' while removing an unnecessary conductor portion. Thus, it is not necessary to make the back surface 1b' from a non-plating-adherable resin to enable selective formation of the conductor film 8 only at a desired portion of the back surface 1b' of the material substrate 1'. Thus, the size (thickness) of the material substrate 1 in direction z can be reduced as much, which leads to thickness reduction of the light emitting device A1.

As illustrated in FIG. 2, the first front electrode 21 includes a frame portion 211. The frame portion 211 is provided as a result of irradiating the outside of the first recess 11 with laser R in the laser R irradiation process illustrated in FIG. 8. By applying laser to the outside the first recess 11 in this way, the side surface 112 of the first recess 11 is prevented from being irradiated with laser even when the irradiation position of the laser R is slightly deviated.

As illustrated in FIG. 2, the bottom exposed region 183 is positioned at an end of the bottom surface 121 which is closer to the first recess 11. This arrangement is suitable for increasing the size, in direction x, of the bottom electrode 224, which is the wire bonding area.

The distance L3 between the bottom exposed region 183 and the center P of the circle defined by the edge 114 of the first recess 11 is smaller than the distance between the edge 114 of the first recess 11 and the center P. This arrangement allows reducing the length of the wire 7 while making the size of the side surface 112 large.

The width L1 of the strip-like portion 212 is larger than the distance L2 between the edge 114 of the first recess 11 and the edge 1ac. In other words, the first recess 11 is arranged close to the edge 1ac. This arrangement is suitable for reducing the size of the light emitting device A1 in x-y plan view.

As indicated by circle Bo in FIG. 3, the boundary between the bottom surface 121 of the second recess 12 and the side surface 112 of the first recess 11 comprises a curved surface. With this arrangement, the wire 7 is prevented from coming into contact with the inner electrode 213.

A second embodiment of the present invention is described below with reference to FIGS. 12-20. In this embodiment and its variations, the elements which are identical or similar to those of the first embodiment are designated by the same reference signs as those used for the first embodiment, and the description thereof is appropriately omitted.

The light emitting device A2 illustrated in these figures includes a substrate 1, a front conductor layer 2, a side conductor layer 3, a back conductor layer 4, a light emitting element 6, a wire 7, a lens 5 and an adhesive layer 85. It is to be noted that the illustration of the lens is omitted in FIG. 18, which is a plan view corresponding to FIG. 12. Since the structure of the substrate 1, the front conductor layer 2, the side conductor layer 3, the light emitting element 6 and the wire 7 is the same as that of the light emitting device A1, the description is omitted. However, it is to be noted that the shape of the raised portions 13a formed on the substrate 1 of the light emitting device A2 is different from that of the light emitting device A1.

Figure 15:
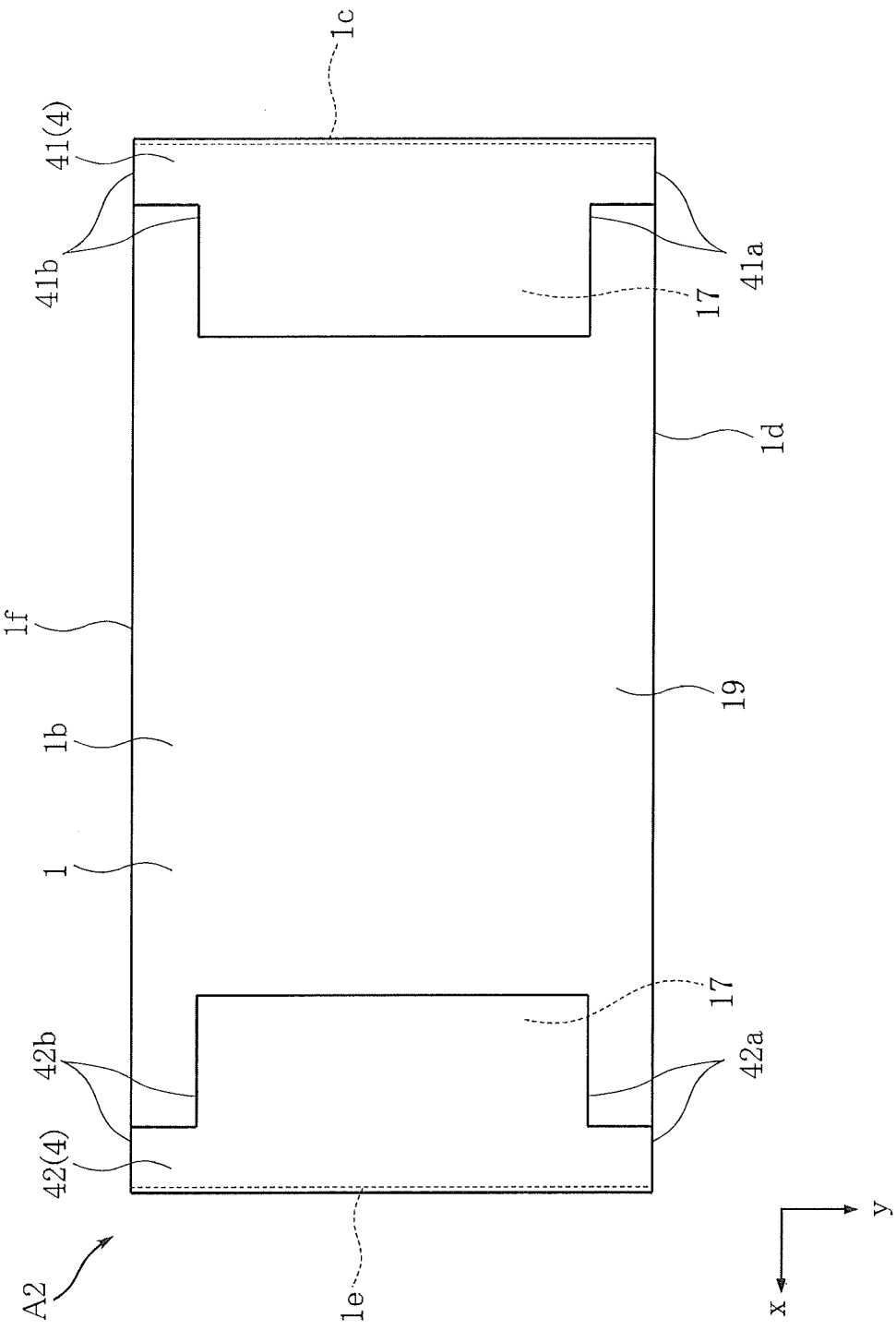
FIG. 15 is a bottom view illustrating the light emitting device of FIG. 12.

In this embodiment, as illustrated in FIG. 15, each of the first back electrode 41 and the second back electrode 42 of the back conductor layer 4 projects toward the center of the back surface 1b of the substrate 1. Specifically, the first back electrode 41 includes edges 41a and 41b. The edge 41a is oriented in the same direction as the side surface 1d of the substrate 1. The edge 41a includes a portion spaced apart from the side surface 1d and a portion which is flash with the side surface 1d. The portion of the edge 41a which is flash with the side surface 1d is positioned at an end of the back surface 1b in direction x.

Similarly, the edge 41b is oriented in the same direction as the side surface 1f of the substrate 1. The edge 41b includes a portion spaced apart from the side surface 1f and a portion which is flash with the side surface 1f. Similarly, the second back electrode 42 includes edges 42a and 42b. The edge 42a is oriented in the same direction as the side surface 1d of the substrate 1. The edge 42a includes a portion spaced apart from the side surface 1d and a portion which is flash with the side surface 1d. The edge 42b is oriented in the same direction as the side surface 1f of the substrate 1. The edge 42b includes a portion spaced apart from the side surface 1f and a portion which is flash with the side surface 1f.

Figure 16:
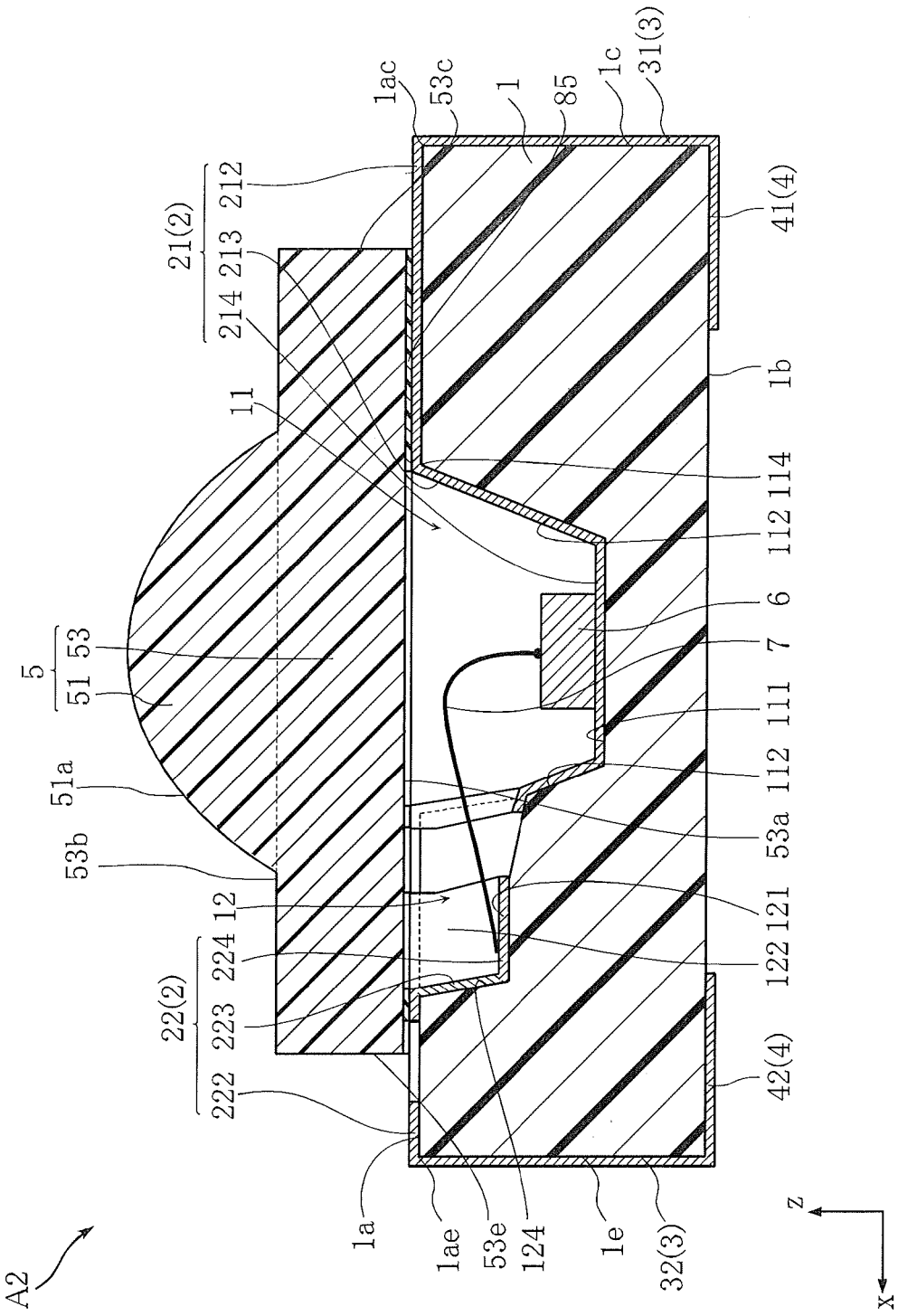
FIG. 16 is a sectional view taken along lines XVI-XVI in FIG. 12.

As illustrated in FIG. 16, the lens 5 is disposed on the front surface 1a side of the substrate 1. The lens 5 serves to enhance the intensity of light emitted from the light emitting element 6 toward the front. The lens 5 is made of e.g. a thermosetting epoxy resin. For instance, black resin which blocks visible light may be used as the material for the lens 5. In this embodiment, the light emitting element 6 emits infrared light. The lens 5 passes the light emitted from the light emitting element 6 (infrared light in this embodiment). The lens 5 includes a convex portion 51 and a plate portion 53.

Figure 12:
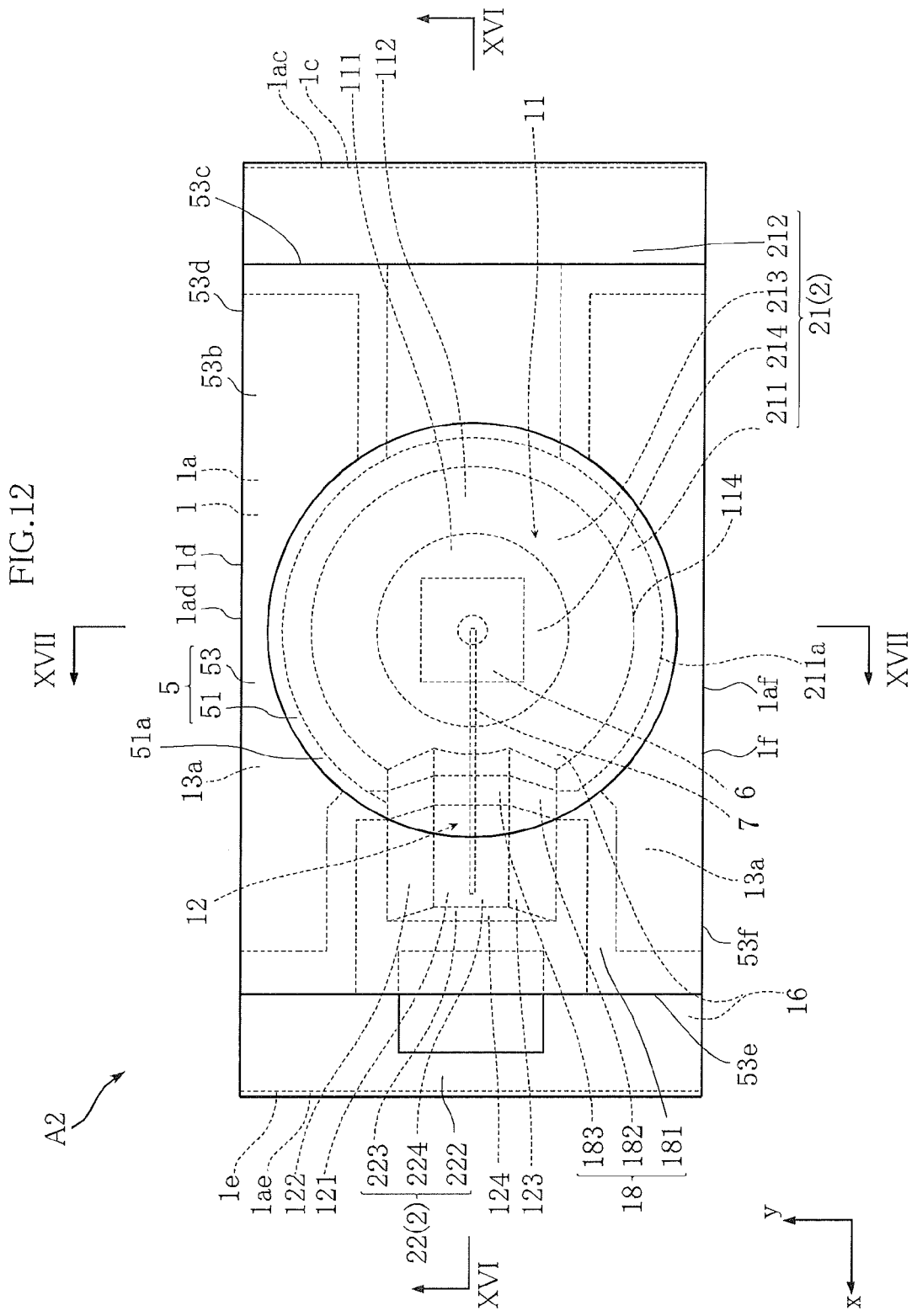
FIG. 12 is a plan view illustrating a light emitting device according to a second embodiment of the invention.
Figure 13:
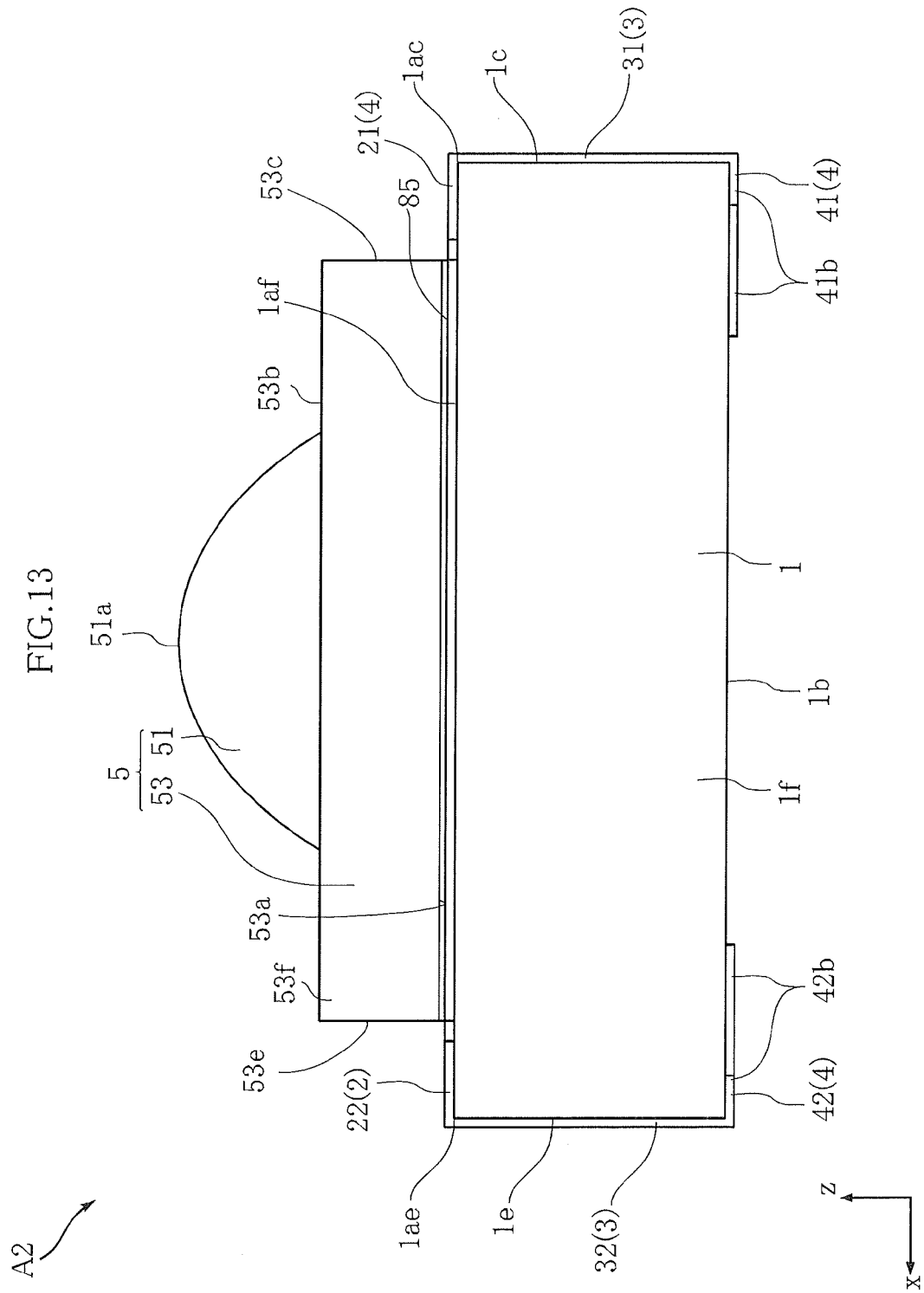
FIG. 13 is a front view illustrating the light emitting device of FIG. 12.

The convex portion 51 includes a convex surface 51a. The convex surface 51a bulges in direction z. As illustrated in FIG. 12, the convex surface 51a overlaps the first recess 11 as viewed indirection z. In this embodiment, the convex surface 51a is circular as viewed in direction z. Since the light from the light emitting element 6 exits through the convex surface 51a, the convex surface 51a is made a mirror surface. By making the convex surface 51a a mirror surface, the diffusion or scattering of light at the convex surface 51a is suppressed. The curvature of the convex portion 51 is determined in accordance with the configuration of the first recess 11.

As illustrated in FIGS. 12-14, 16 and 17, the plate portion 53 has a plate-like shape covering the first recess 11. The plate portion 53 is positioned between the first recess 11 and the convex surface 51a. The plate portion 53 includes a first surface 53a, a second surface 53b and lens side surfaces 53c, 53d, 53e, 53f.

As illustrated in FIG. 16, the first surface 53a faces the first recess 11. In this embodiment, the first surface 53a is flat. Since the light emitted from the light emitting element 6 enters the lens 5 through the first surface 53a, the first surface 53a is made a mirror surface. By making the first surface 53a a mirror surface, the diffusion or scattering of light at the first surface 53a is suppressed.

Figure 14:
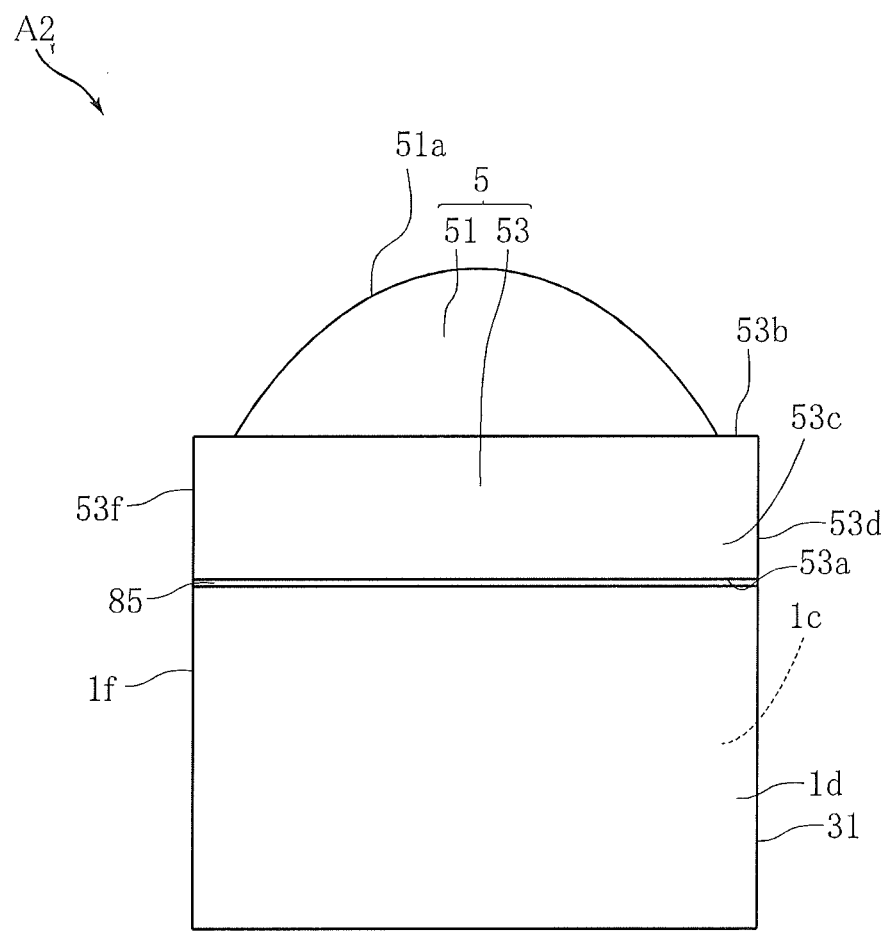
FIG. 14 is a right side view illustrating the light emitting device of FIG. 12.

The second surface 53b faces away from the first surface 53a. The lens side surface 53c is oriented in the same direction as the side surface 1c of the substrate 1. The lens side surface 53e is oriented in the same direction as the side surface 1e of the substrate 1. As illustrated in FIG. 14, the lens side surface 53d is oriented in the same direction as the side surface 1d of the substrate 1 and flush with the side surface 1d. The lens side surface 53f is oriented in the same direction as the side surface 1f of the substrate 1 and flush with the side surface 1f. The second surface 53b and the lens side surfaces 53c and 53e comprise a rough surface with minute irregularities (e.g. satin-finished surface). However, the lens side surfaces 53c and 53e do not need to be a rough surface, but may comprise e.g. a mirror surface. The second surface 53b and the lens side surfaces 53c, 53e comprising a rough surface enhance the removal of a material lens 5' (described later, see FIGS. 19 and 20), which is to become lenses 5, from a mold in molding the material lens 5' in the manufacturing process. The height difference of the minute irregularities in each surface (ten-point average roughness Rz) is e.g. 1 to 2 μm. The side surfaces 53d and 53f are cut surfaces formed by cutting the material lens 5' together with the material substrate 1', which is to become the substrates 1.

The adhesive layer 85 is disposed between the lens 5 and the substrate 1 and bonds the lens 5 to the substrate 1. Specifically, the adhesive layer 85 bonds the lens 5 to the front conductor layer 2 and the raised portions 13a. The adhesive layer 85 may comprise a bonding sheet or a liquid adhesive. Examples of bonding sheet include an epoxy bonding sheet. The bonding sheet may be either a thermo-setting type or a thermoplastic type. The liquid adhesive may be a UV-curable adhesive or an acrylic adhesive.

Figure 17:
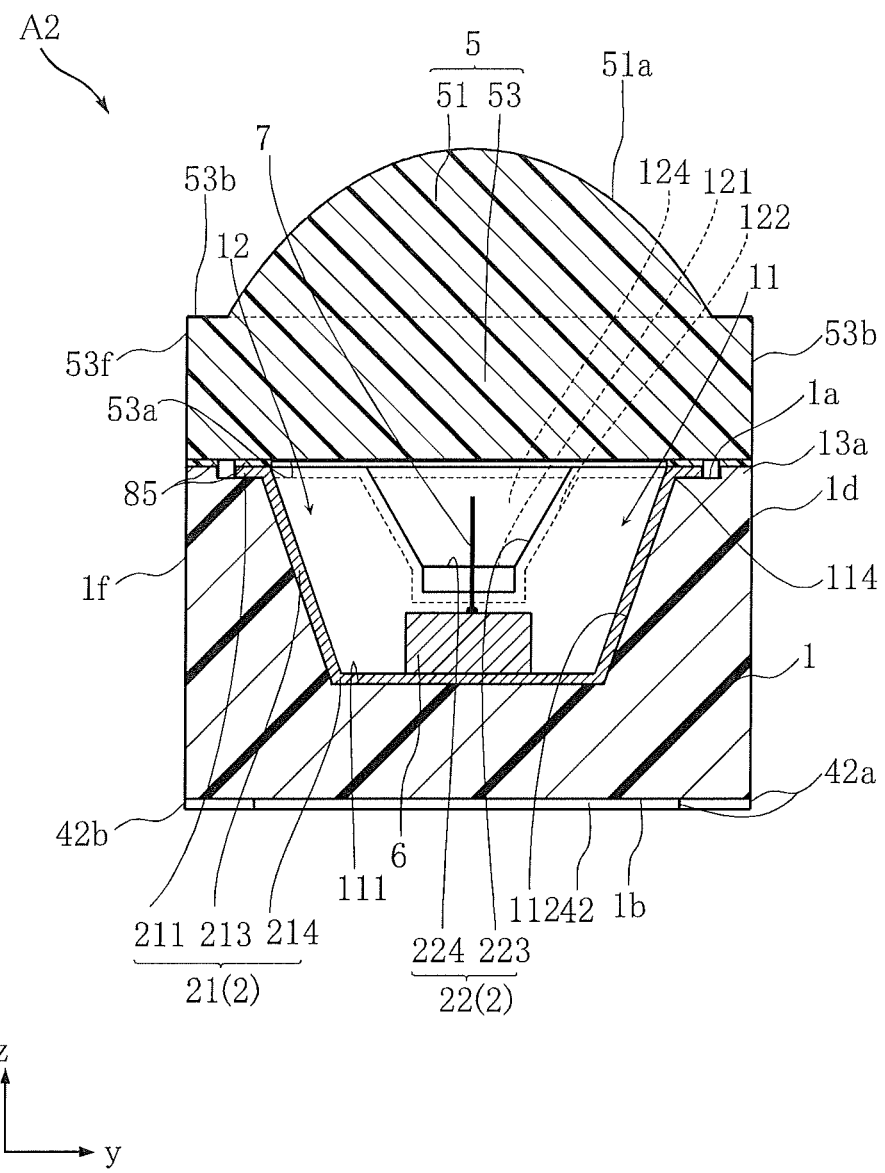
FIG. 17 is a sectional view taken along lines XVII-XVII in FIG. 12.
Figure 18:
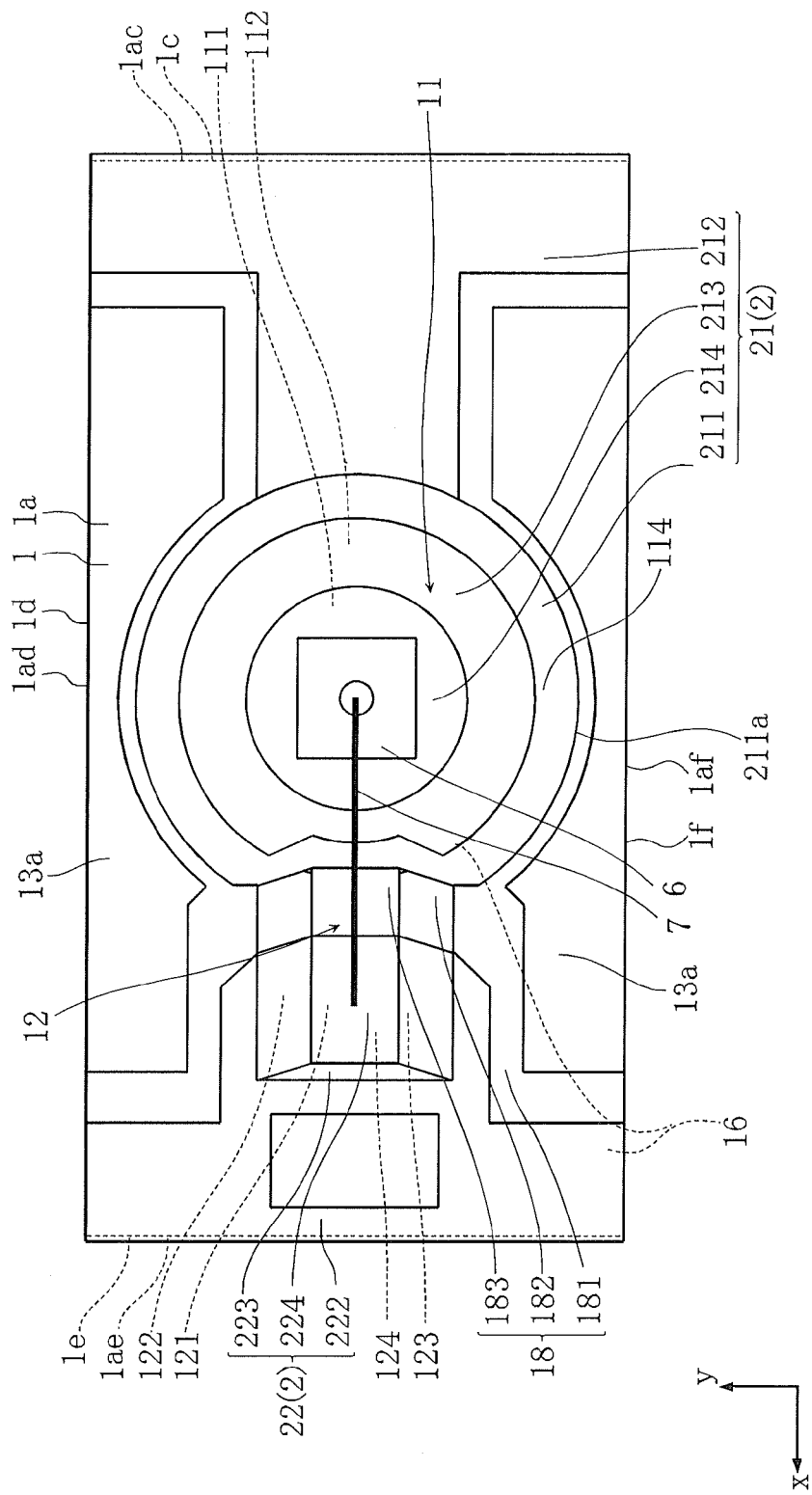
FIG. 18 is a plan view illustrating the light emitting device of FIG. 12, with the illustration of the lens omitted.

In this embodiment, as illustrated in FIGS. 16 and 17, the first recess 11 and the second recess 12 are not filled with resin, and hence are hollow. The light emitting element 6 and the wire 7 are not covered with resin. However, the first recess 11 and the second recess 12 are substantially sealed by the lens 5. Thus, in this embodiment, the light emitting element 6 is not easily deteriorated (e.g. oxidized or sulfurized), though it is not covered with resin. To prevent the deterioration of the light emitting element 6 further reliably, inert gas such as argon or nitrogen may be loaded into the first recess 11 and the second recess 12.

Figure 19:
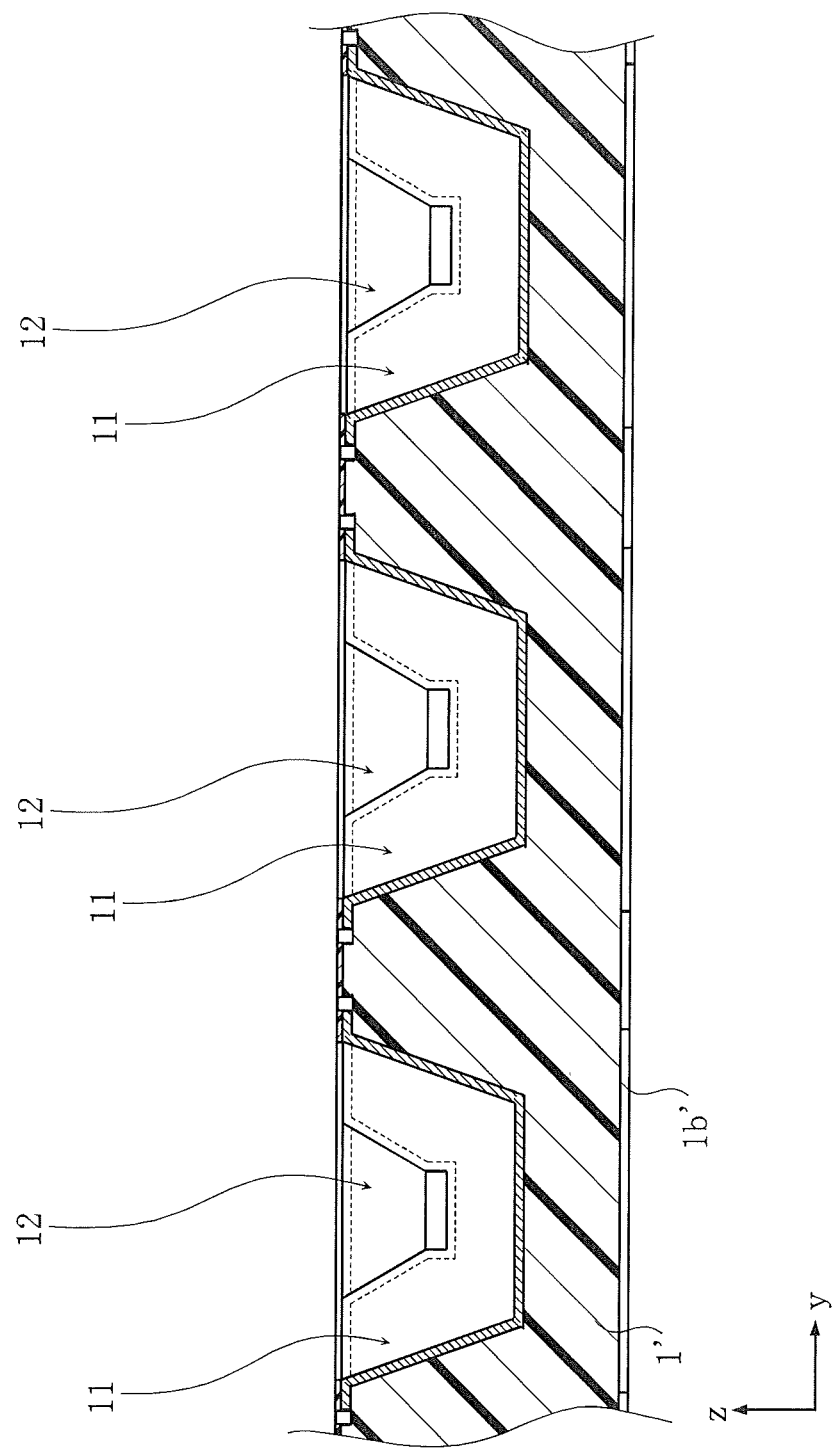
FIG. 19 is a sectional view illustrating a step of a method for manufacturing the light emitting device according to the second embodiment of the present invention.
Figure 20:
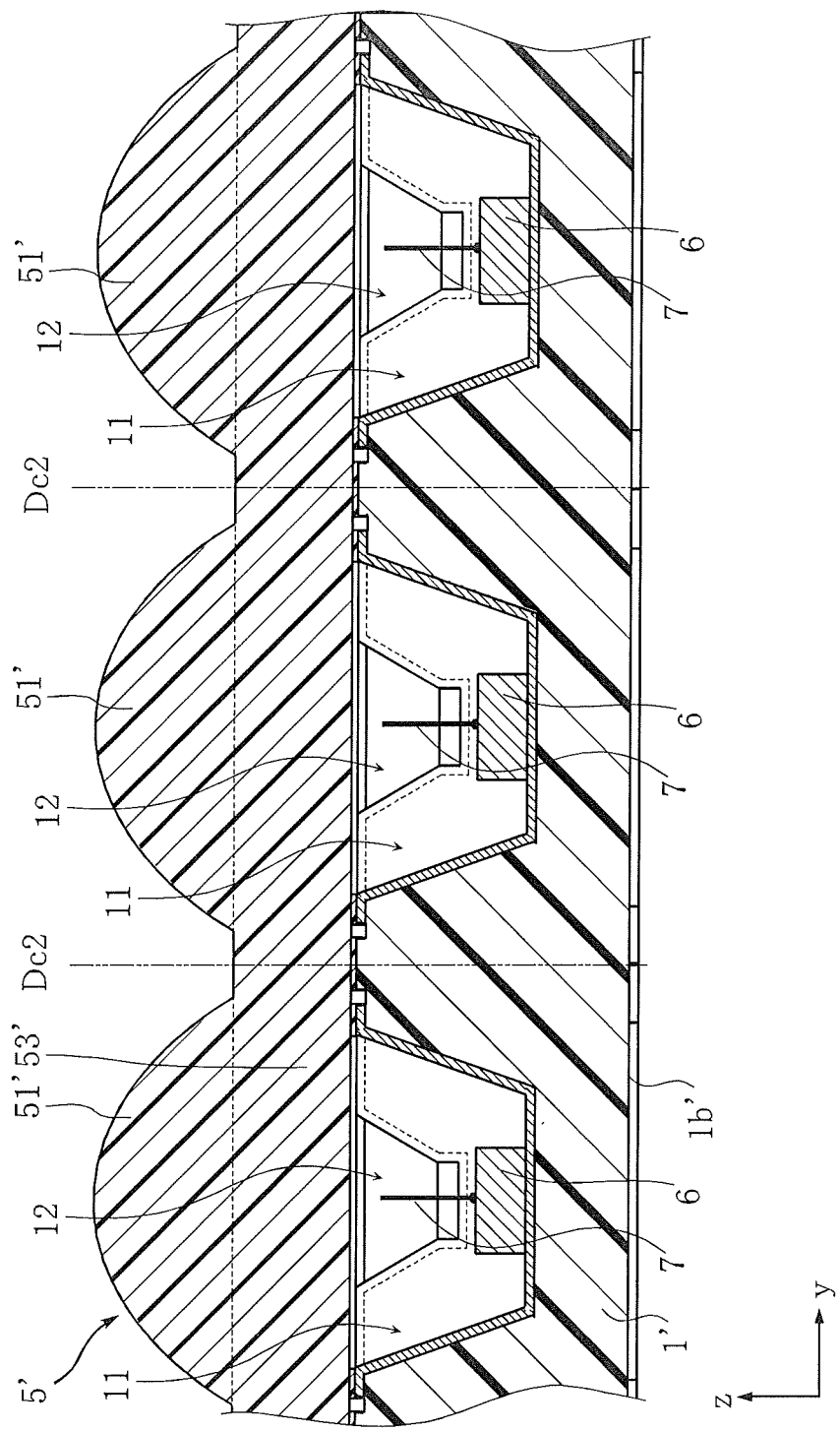
FIG. 20 illustrates a step subsequent to the step of FIG. 19.

To manufacture the light emitting device A2, a product illustrated in FIG. 19, which is similar to the product illustrated in FIG. 10, is prepared through the process similar to that for manufacturing the light emitting device A1. Then, as illustrated in FIG. 20, light emitting elements 6 and wires 7 are bonded. Then, a material lens 5' is bonded to the material substrate 1'. The material lens 5' is later to become a plurality of lenses 5. The material lens 5' includes a plate portion 53', and a plurality of convex portions 51' formed on the plate portion 53'. The plate portion 53' is in the form of a plate extending in direction y, on which the convex portions 51' are arranged side by side in direction y. Then, the material substrate 1' and the material lens 5' are cut together along lines Dc2 indicated in FIG. 20. Thus, the manufacture of the light emitting device A2 is completed. In the above-described process of cutting the material substrate 1' and the material lens 5', the side surfaces 1d and 1f of the substrate 1 and the lens side surface 53d and 53f of the plate portion 53 are obtained.

The advantages of the light emitting device A2 according to the present embodiment are described below.

Since the light emitting device A2 includes a lens 5 having a convex surface 51a, the light emitted from the light emitting element 6 is refracted at the convex surface 51a. As a result, a large amount of light from the light emitting element 6 can be caused to travel in direction z. Thus, the light emitting device A2 is suitable for enhancing the intensity of front illumination.

In the light emitting device A2, the first surface 53a of the plate portion 53 is flat. When the first surface 53a is a convex surface, the first surface 53a may come into contact with the wire 7, which may cause a change in posture of the light emitting element 6. In contrast to this, since the first surface 53a is flat in this embodiment, the first surface 53a does not easily come into contact with the wire 7. Thus, according to the present embodiment, a change in posture of the light emitting element 6 is prevented.

The intensity of front illumination of the light emitting device A2 may reduce when the inner electrode 213 is covered with the adhesive layer 85. By employing the adhesive layer 85 comprising a bonding sheet having a fixed shape, the dropping of a liquid adhesive onto the inner electrode 213 and the resulting covering of part of the inner electrode 213 with the adhesive layer 85 are prevented. Thus, by employing the adhesive layer 85 comprising a boning sheet, the lens 5 can be bonded to the substrate 1 without deteriorating the intensity of front illumination of the light emitting device A2.

The completed light emitting device A2 is subjected to a reflowing process for mounting on e.g. a printed circuit board. The reflowing process is performed at high temperature of about 260° C. When the bonding sheet is of a thermosetting type, the adhesion of the adhesive layer 85 does not deteriorate through the reflowing process performed at high temperature. Thus, by employing a bonding sheet of a thermosetting type, separation of the lens 5 from the substrate 1 in the reflowing process is prevented.

When the adhesive layer 85 comprises a liquid adhesive, the anchoring effect of the liquid adhesive provides strong adhesion between the front conductor layer 2 or the raised portions 13a and the lens 5.

In the light emitting device A2, the side surface 1d is a surface obtained by cutting the material substrate 1' (see FIG. 20). The edge 41a of the back conductor layer 4 includes a portion spaced apart from the side surface 1d. Thus, in cutting the material substrate 1', the dicing blade does not come into contact with the portion of the edge 41a which is spaced apart from the side surface 1d. Thus, burr is not formed at this portion of the edge 41a. Thus, the light emitting device A2 is suitable for suppressing the formation of burr at the edge 41a. For the same reason, the light emitting device A2 is suitable for suppressing the formation of burr also at the edges 41b, 42a and 42b.

In the light emitting device A2, the edge 41a includes a portion which is positioned at an end of the back surface 1b in direction x and which is flash with the side surface 1d. The first back electrode 41 (back conductor layer 4) including such an edge 41a can be formed by performing laser irradiation with respect to only the back surface 1b' of the material substrate 1', and laser irradiation with respect to the side surface 1c' of the material substrate 1' is not necessary. Thus, the light emitting device A2 is suitable for simplifying the manufacturing process.

The provision of the lens 5 of the present embodiment is also applicable to the above-described light emitting device A1.

A first variation of the present embodiment is described below with reference to FIGS. 21-29. The light emitting device A21 illustrated in these figures is different from the light emitting device A2 in that the lens 5 includes a tapered portion 52 and the strip-like portion 222 (i.e., the front conductor layer 2) is formed with a gap 29.

Figure 21:
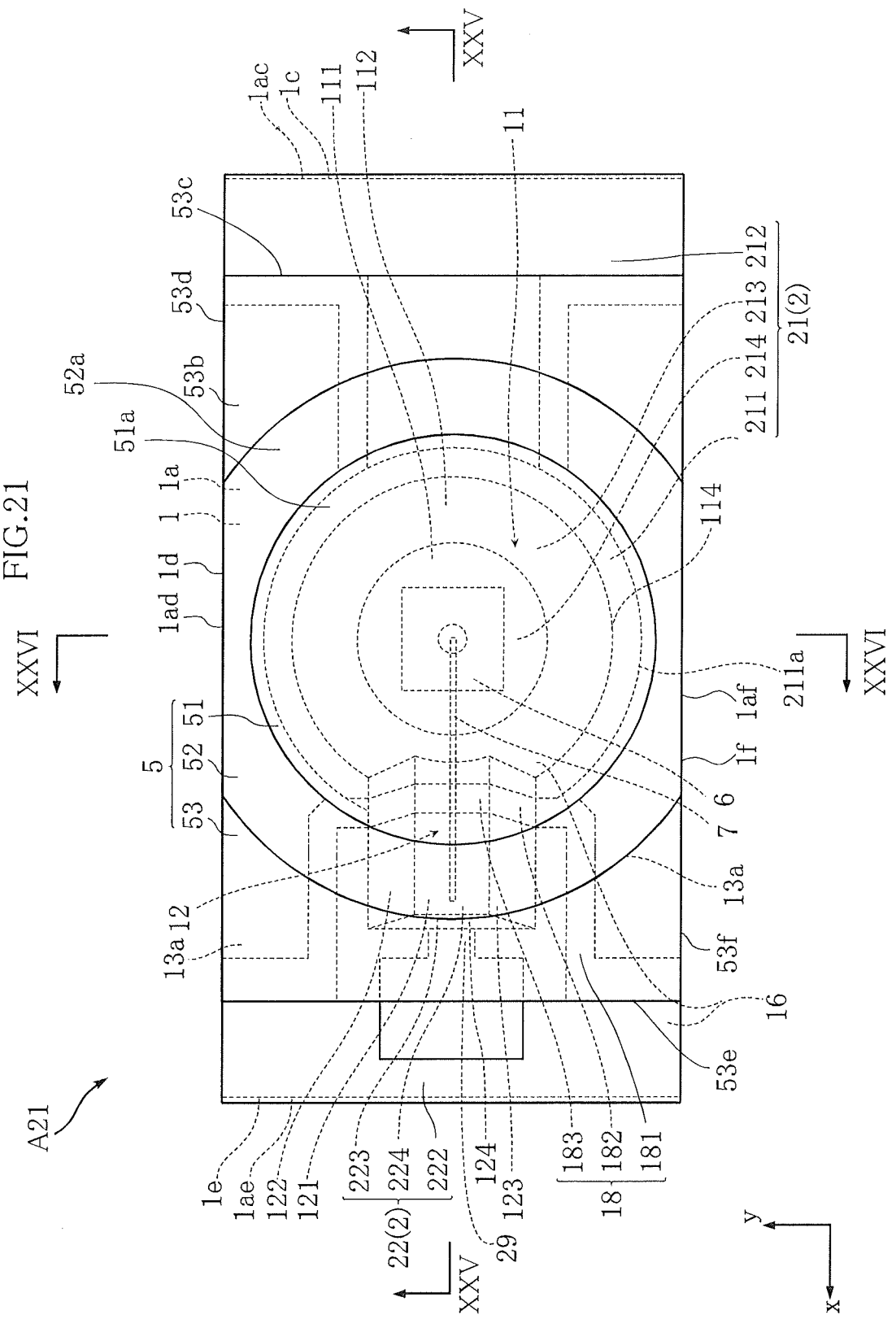
FIG. 21 is a plan view illustrating a light emitting device according to a first variation of the second embodiment of the present invention.
Figure 22:
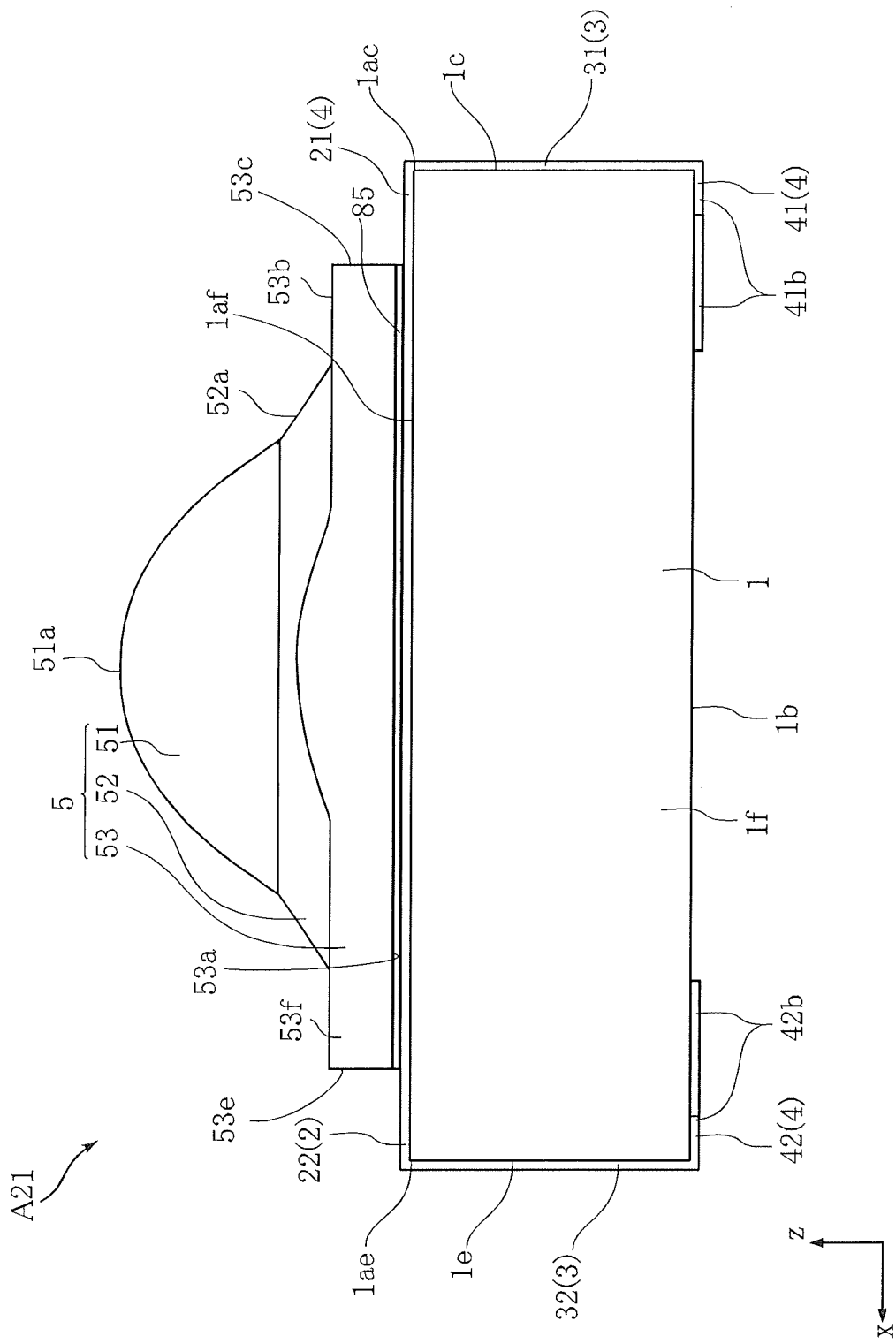
FIG. 22 is a front view illustrating the light emitting device of FIG. 21.
Figure 23:
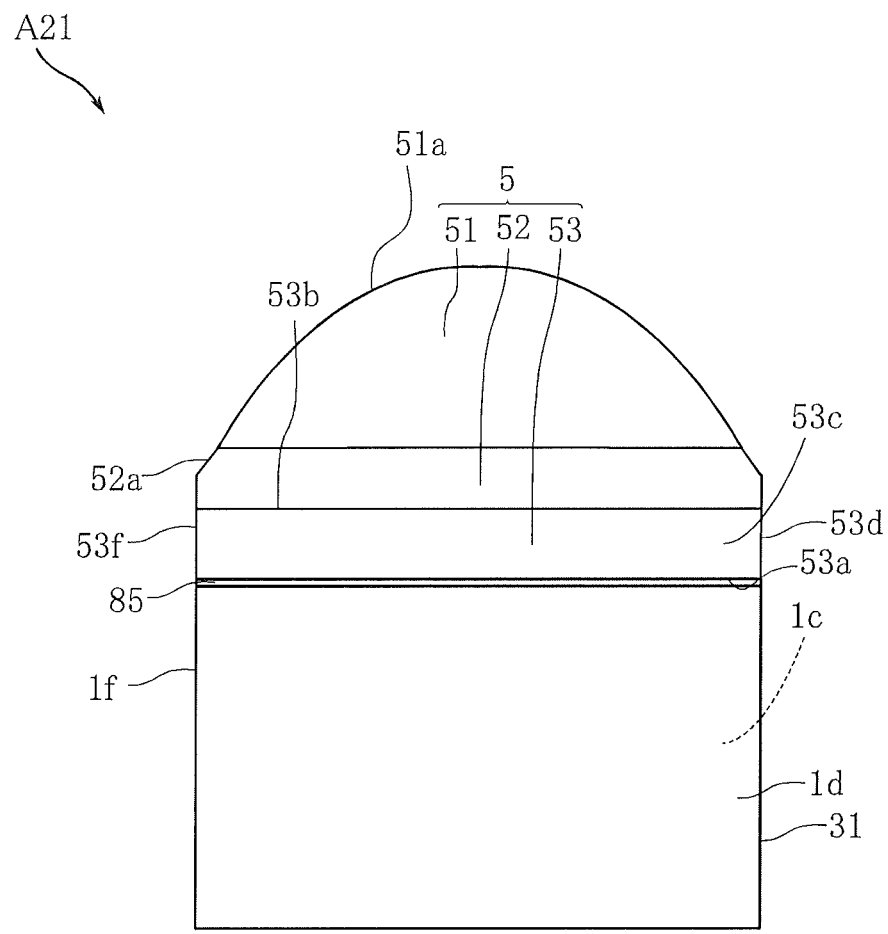
FIG. 23 is a right side view illustrating the light emitting device of FIG. 21.
Figure 24:
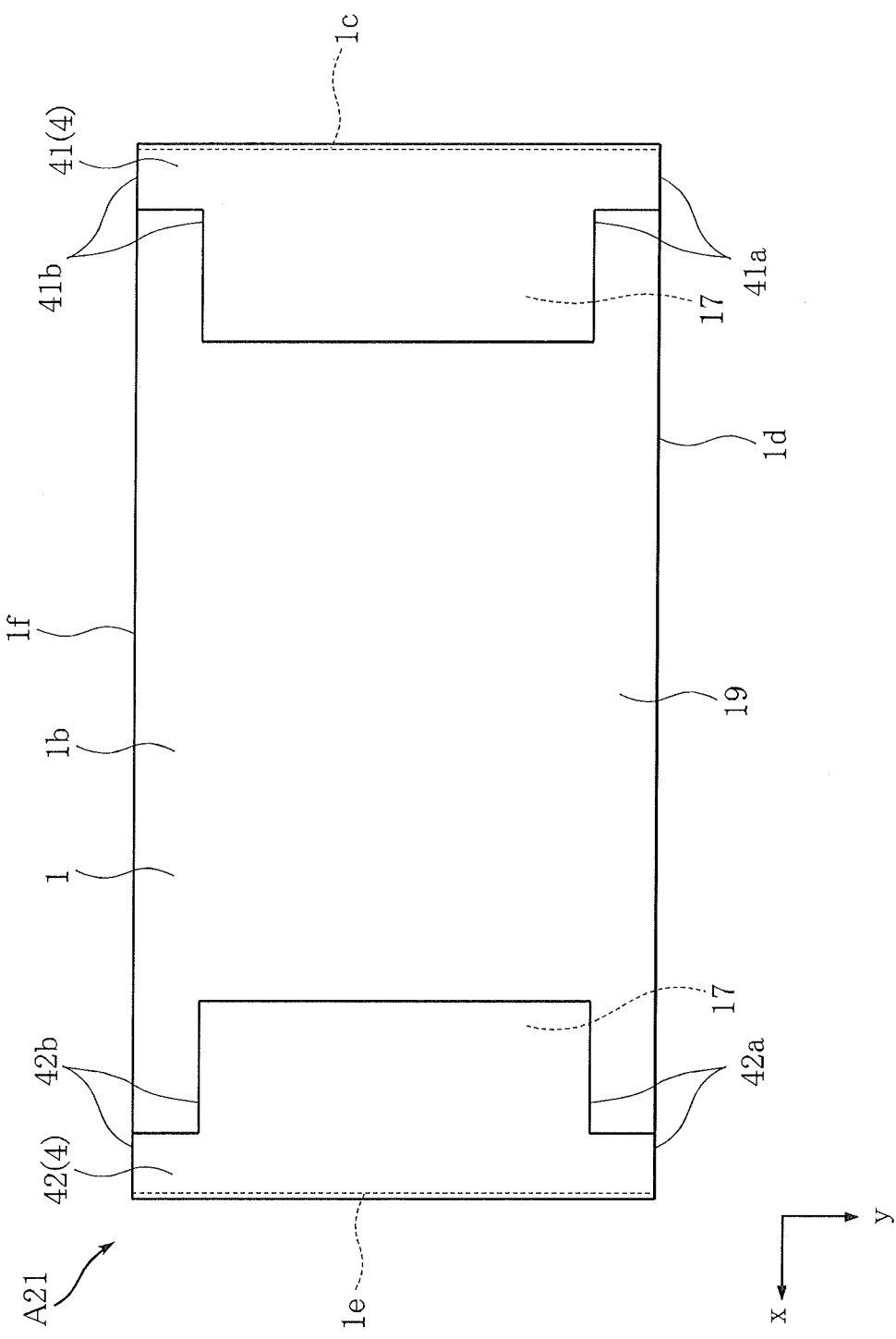
FIG. 24 is a bottom view illustrating the light emitting device of FIG. 21.
Figure 25:
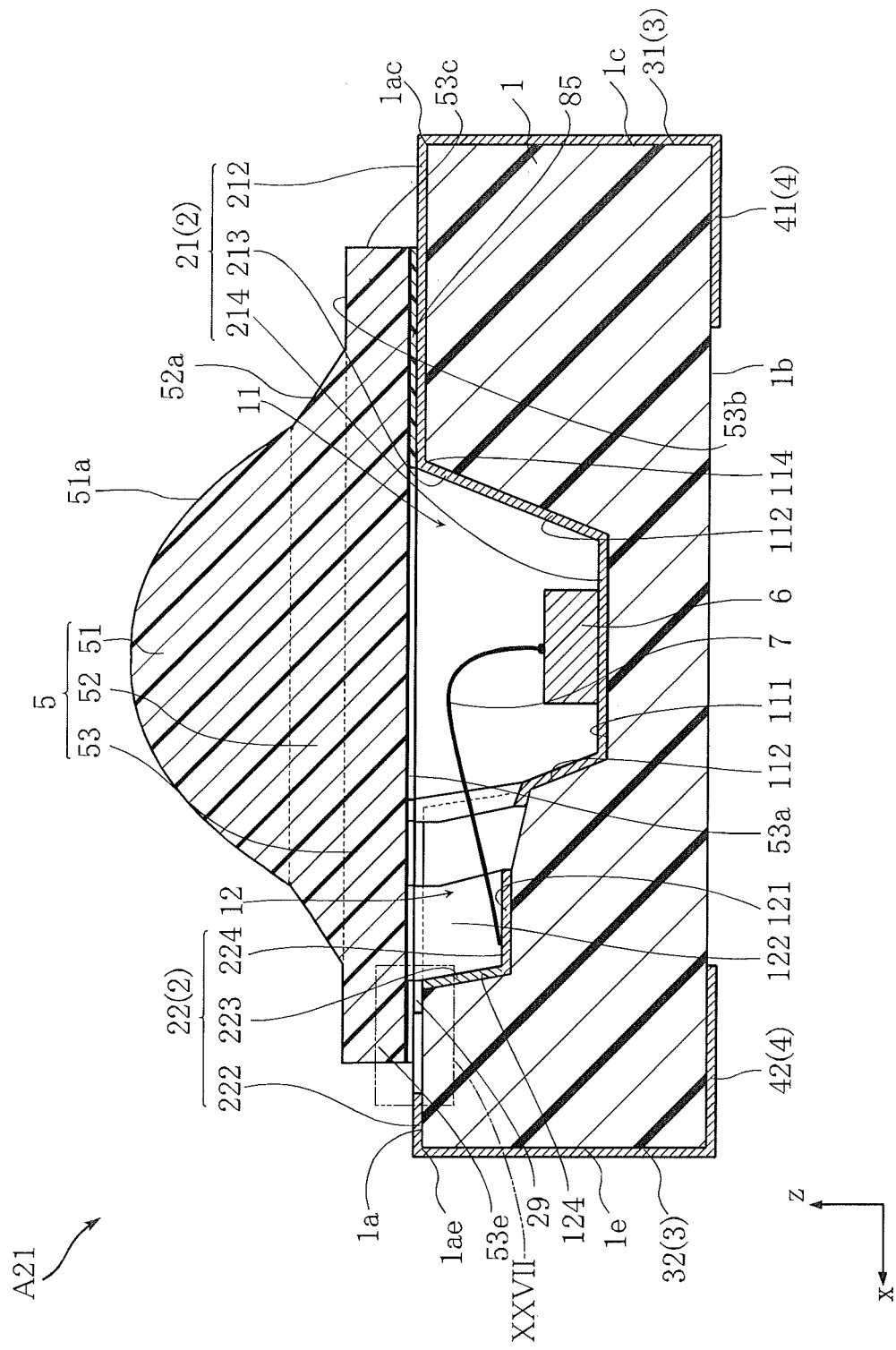
FIG. 25 is a sectional view taken along lines XXV-XXV in FIG. 21.
Figure 26:
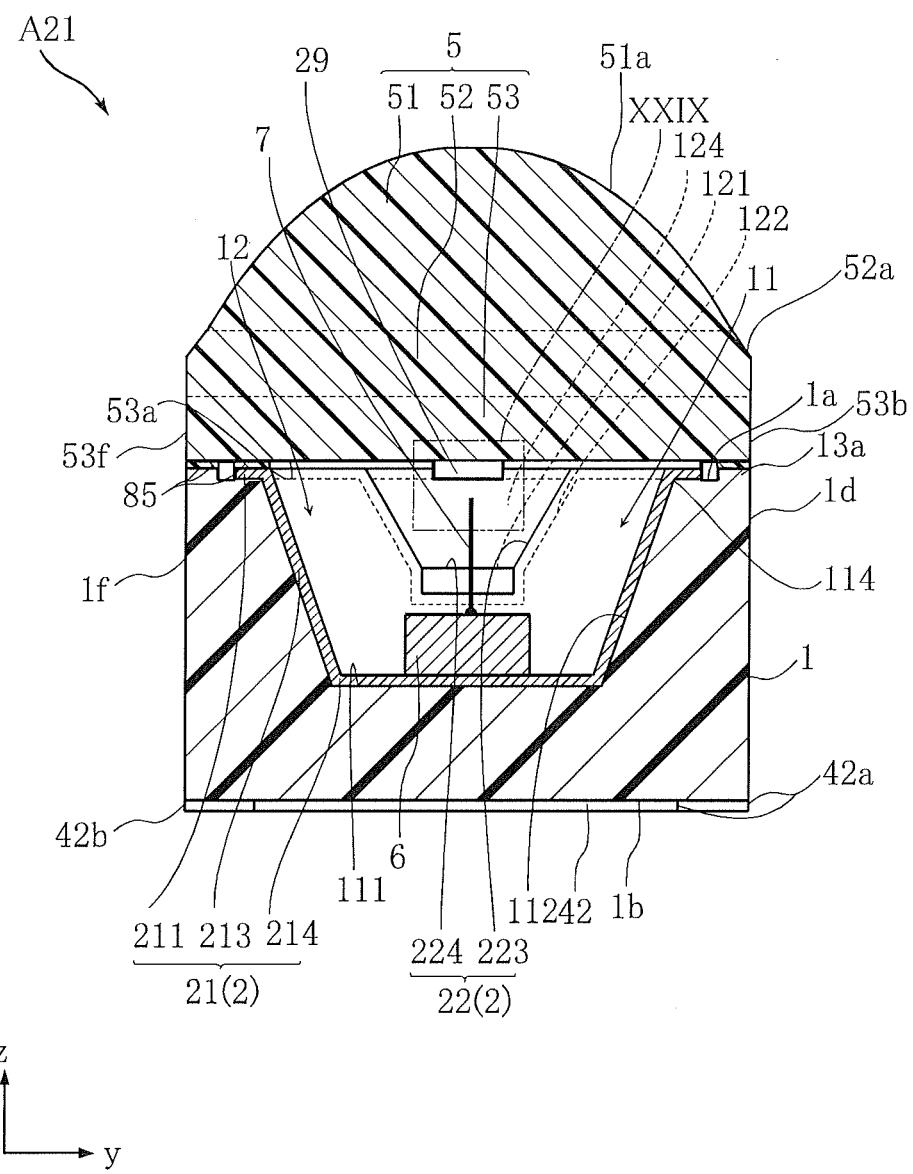
FIG. 26 is a sectional view taken along lines XXVI-XXVI in FIG. 21.
Figure 27:
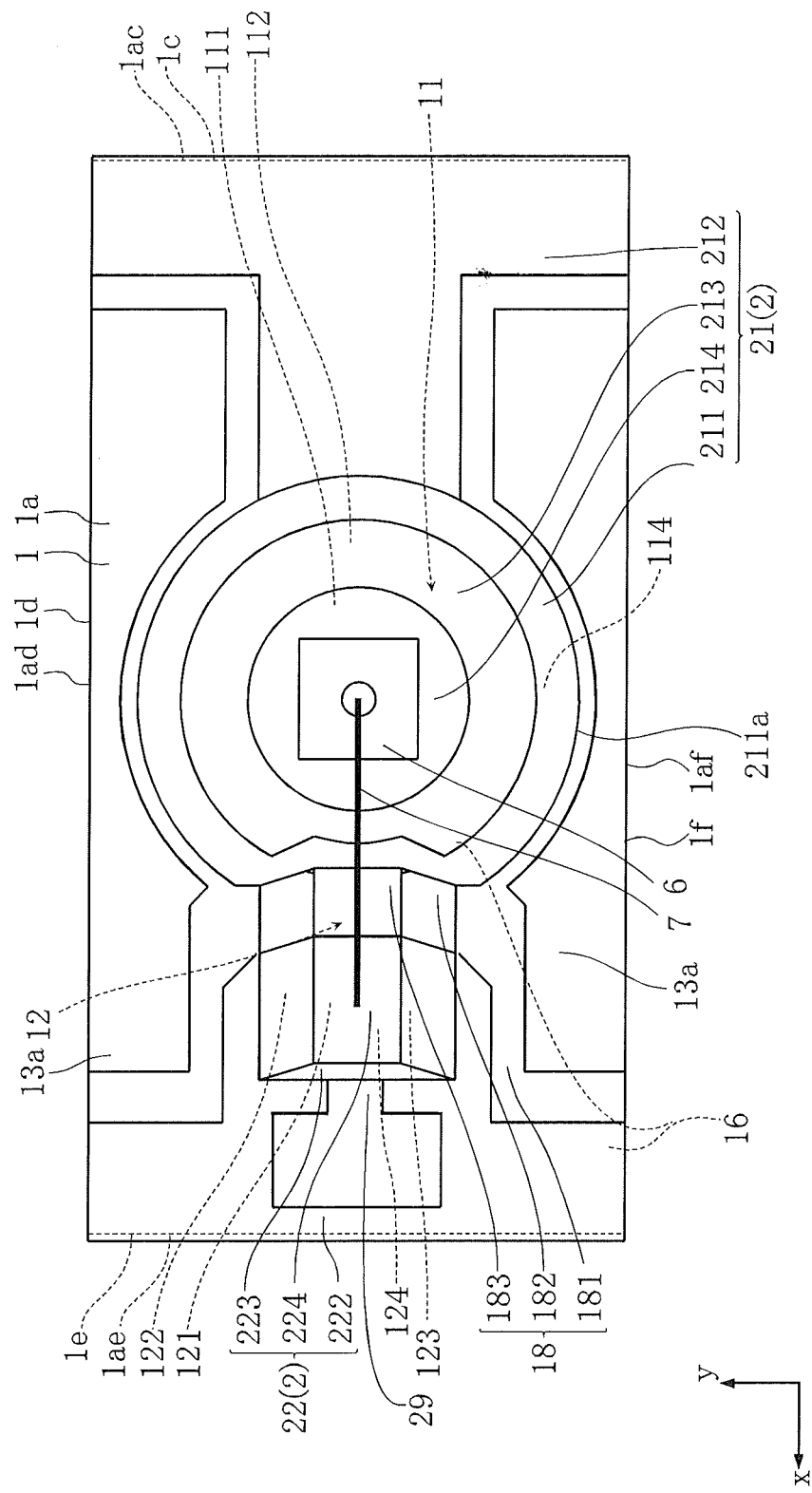
FIG. 27 is a plan view illustrating the light emitting device of FIG. 21, with the illustration of the lens omitted.
Figure 28:
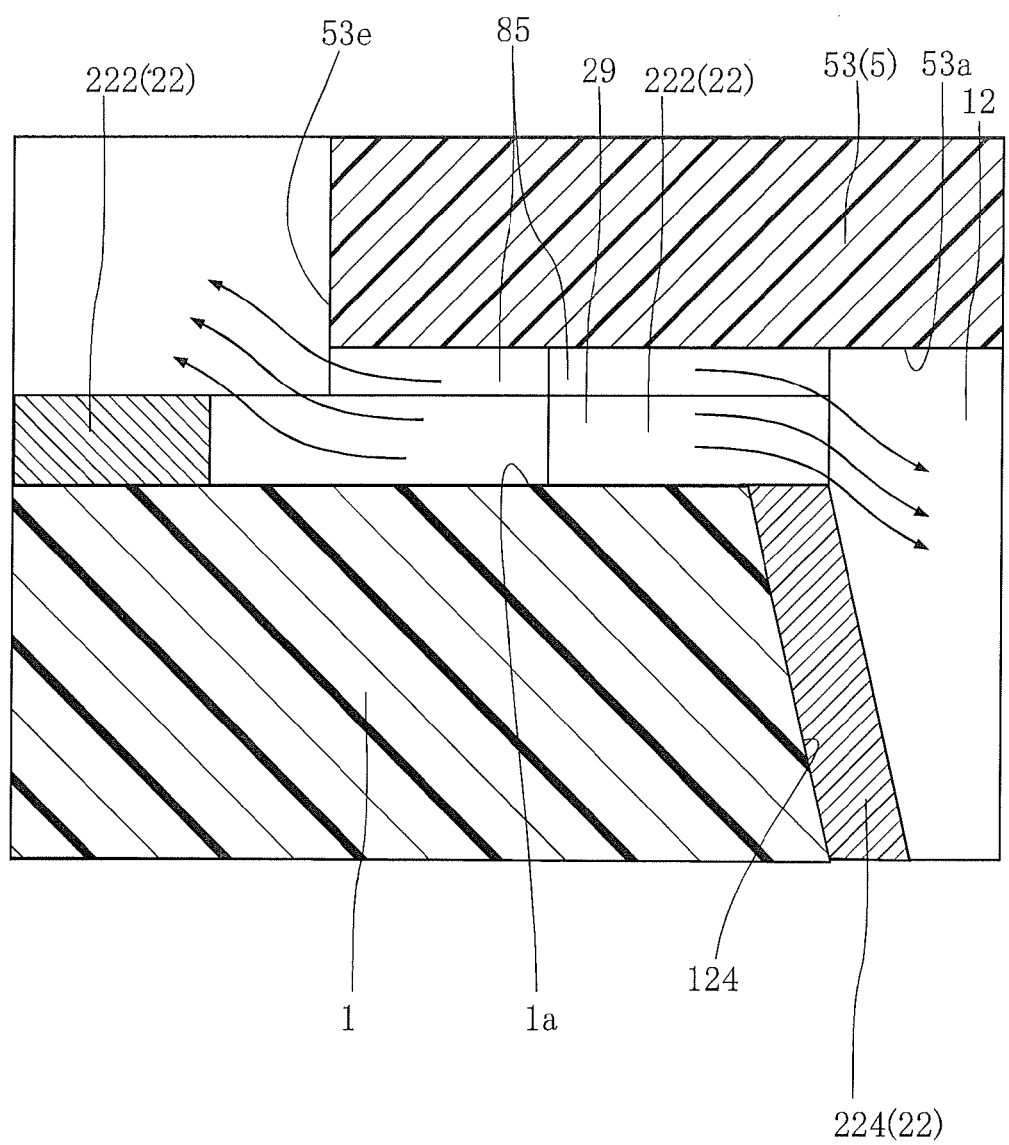
FIG. 28 is an enlarged sectional view illustrating the region XXVII of FIG. 25.
Figure 29:
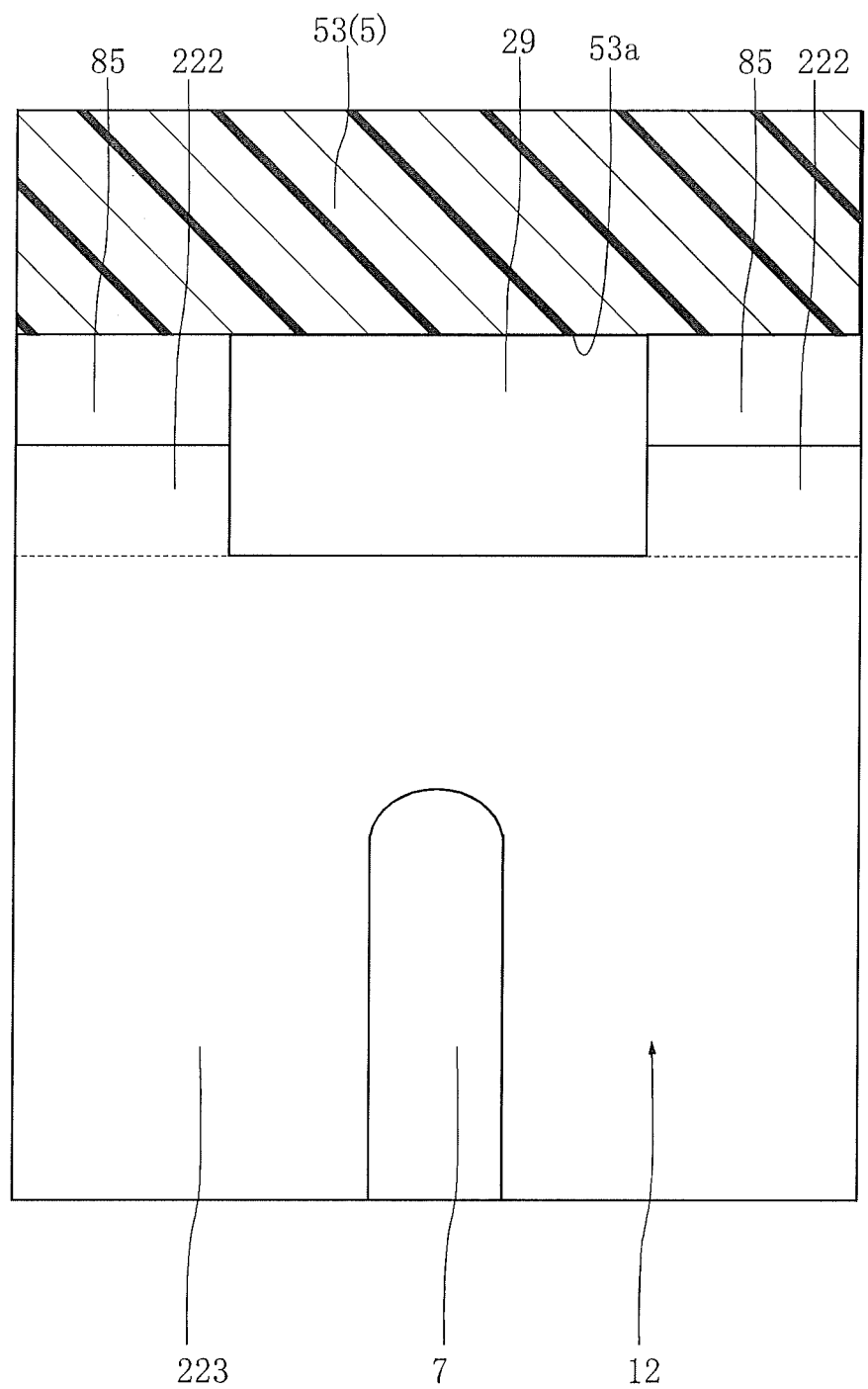
FIG. 29 is an enlarged sectional view illustrating the region XXIX of FIG. 26.

As illustrated in FIGS. 22-25, in the lens 5, the convex portion 51 and the plate portion 53 are connected to each other via the tapered portion 52. The provision of the tapered portion 52 enhances the removal of the material lens 5', which is to become the lens 5, from a mold in molding the material lens 5' in the manufacturing process. The tapered portion 52 includes a tapered surface 52a. The tapered surface 52a is connected to the convex surface 51a. As illustrated in FIG. 21, the tapered surface 52a surrounds the convex surface 51a as viewed in direction z. In this embodiment, the tapered surface 52a increases its diameter as it extends toward the bottom in FIG. 22. The tapered surface 52a may be a mirror surface. The tapered surface 52a comprising a mirror surface allows easy designing of the mold for molding the material lens 5'. Similarly to the second surface 53b and the lens side surfaces 53c and 53e, the tapered surface 52a is a rough surface with minute irregularities. The tapered surface 53b comprising a rough surface allows easy removal of the material lens 5' from the mold in the molding process of the material lens 5' (see FIGS. 19 and 20 of the foregoing embodiment).

As illustrated in FIGS. 25-29, the gap 29 extends from the second recess 12 away from the first recess 11. The gap 29 provides communication between the interior of the first and the second recesses 11, 12 and the outside of the light emitting device 21. Thus, gas can flow between the first and the second recesses 11, 12 and the outside of the light emitting device A21 through the gap 29.

With this arrangement, even when the gas inside the first and the second recesses 11, 12 is thermally expanded due to high temperature in e.g. the reflowing process, the thermally expanded gas flows to the outside of the light emitting device A21 through the gap 29. According to the light emitting device A21, therefore, the pressure inside the first and the second recesses 11 and 12 does not become extremely high. Thus, in the light emitting device A2, separation of the lens 5 from the substrate 1 due to pressure increase in the first and the second recesses 11 and 12 is prevented.

This variation is also applicable to the light emitting device A1.

Figure 30:
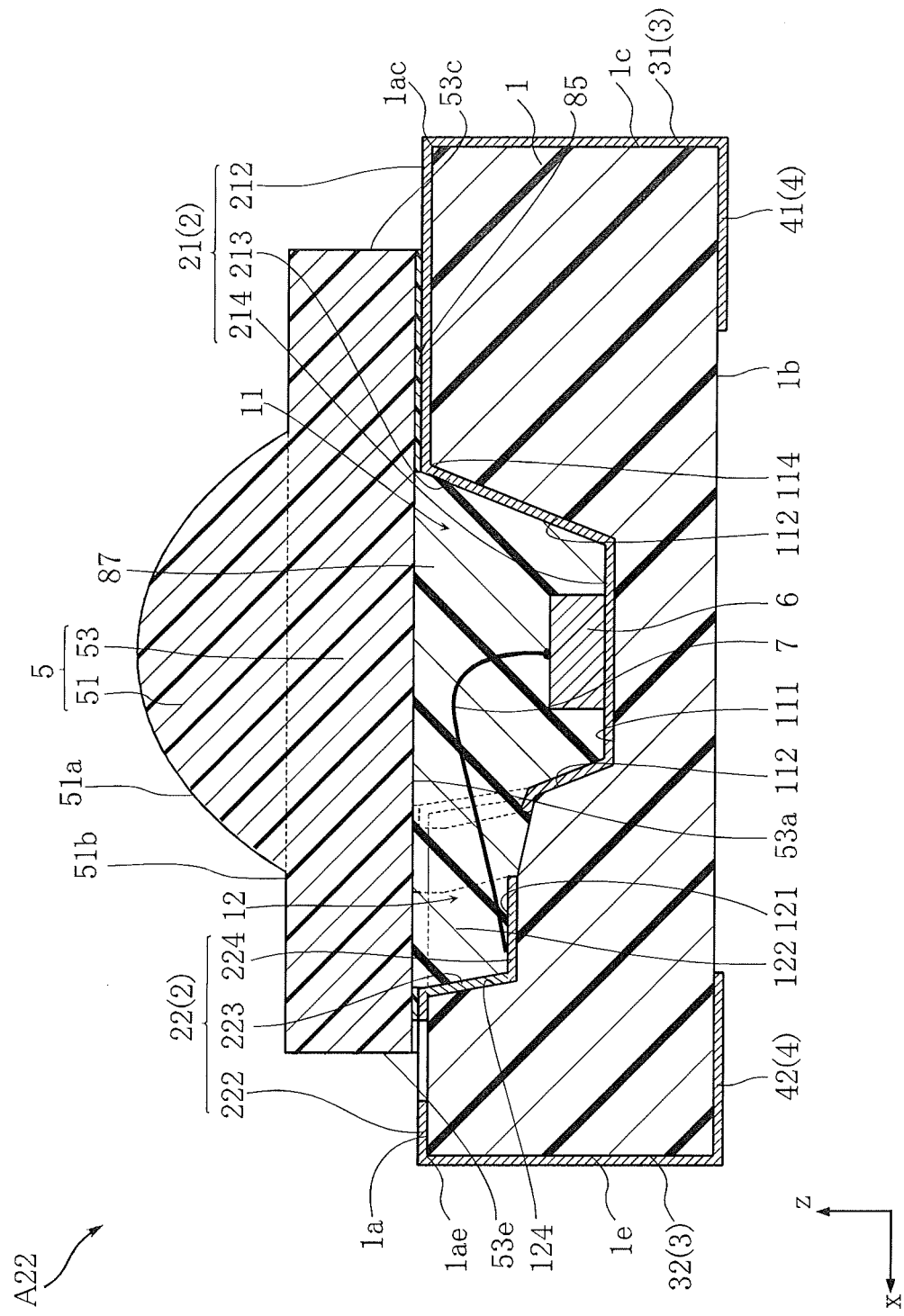
FIG. 30 is a sectional view illustrating a light emitting device according to a second variation of the second embodiment of the present invention.

A second variation of the present embodiment is described below with reference to FIG. 30. The light emitting device A22 illustrated in the figure differs from the light emitting device A2 in that the light emitting device A22 includes a resin portion 87 provided in the first recess 11 and the second recess 12. The resin portion 87 is made of e.g. transparent epoxy resin or silicone resin. The resin portion 87 covers the light emitting element 6 and the wire 7 for protection. In this embodiment, the resin portion 87 fills almost entirety of the first and the second recesses 11 and 12 and is in contact with the first surface 53a of the lens 5.

Figure 31:
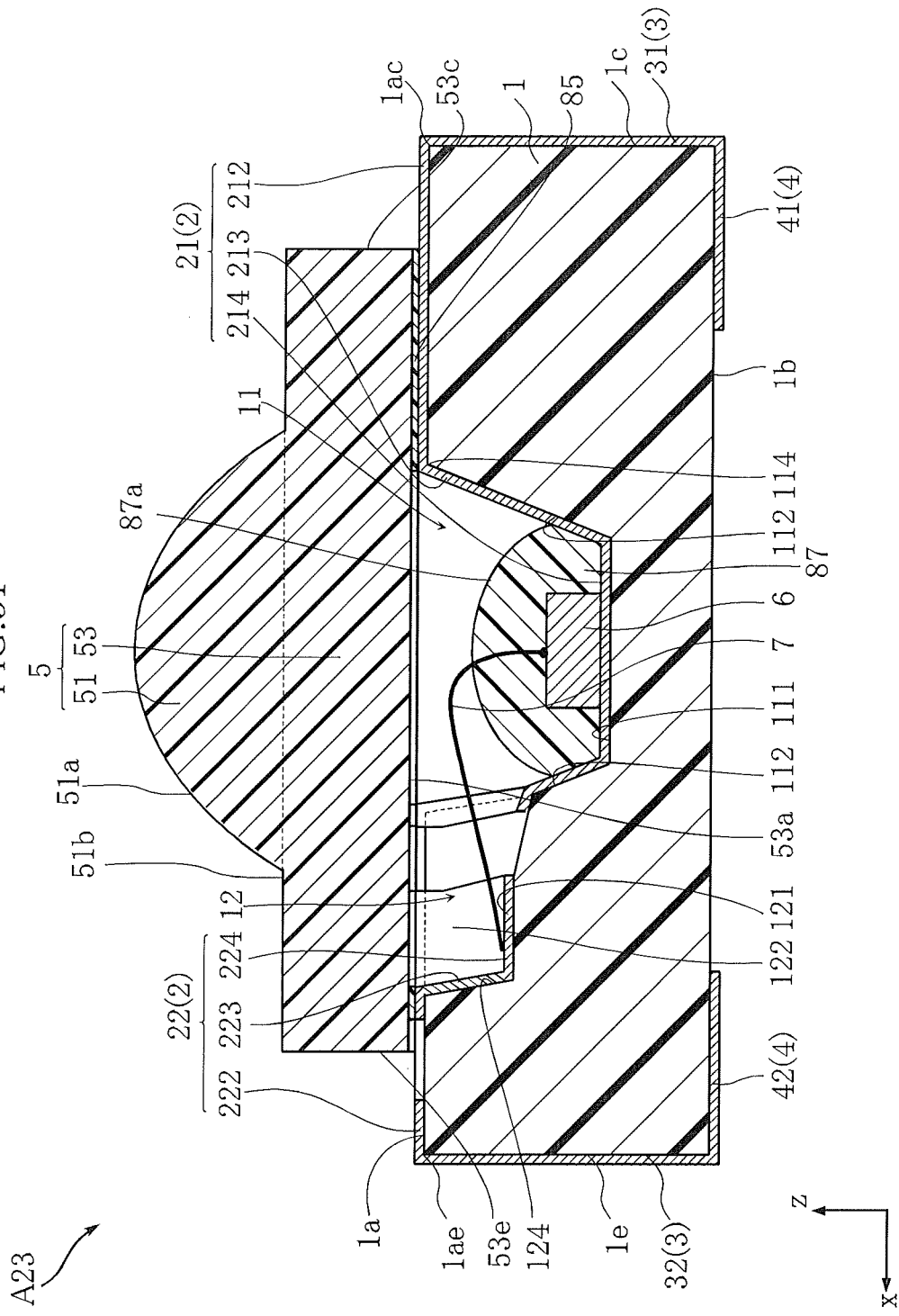
FIG. 31 is a sectional view illustrating a light emitting device according to a third variation of the second embodiment of the present invention.

A third variation of the present embodiment is described below with reference to FIG. 31. The light emitting device A23 illustrated in the figure differs from the light emitting device A22 in that the resin portion 87 does not fill the entirety of the first and the second recesses 11 and 12 and that a space is left between the resin portion 87 and the first surface 53a. The resin portion 87 is provided in the first recess 11 only. The resin portion 87 includes a light emitting surface 87a. In this embodiment, the light emitting surface 87a bulges in direction z.

According to the light emitting device A23, the light emitted from the light emitting element 6 is refracted at the light emitting surface 87a bulging in direction z. As a result, a large amount of light from the light emitting element 6 can be caused to travel in direction z. Thus, the light emitting device A23 is suitable for enhancing the intensity of front illumination.

The arrangement of this variation is also applicable to the light emitting device A21. In particular, it is preferable to apply the structure of this variation to the structure in which the strip-like portion 222 (i.e., the front conductor layer 2) is formed with a gap 29. In this case, although the gas outside the light emitting device enters the first and the second recesses 11 and 12 through the gap 29, the gas does not come into direct contact with the light emitting element 6, because the light emitting element 6 is covered with the resin portion 87. This structure is suitable for suppressing the deterioration of the light emitting element while increasing the intensity of front illumination.

Figure 32:
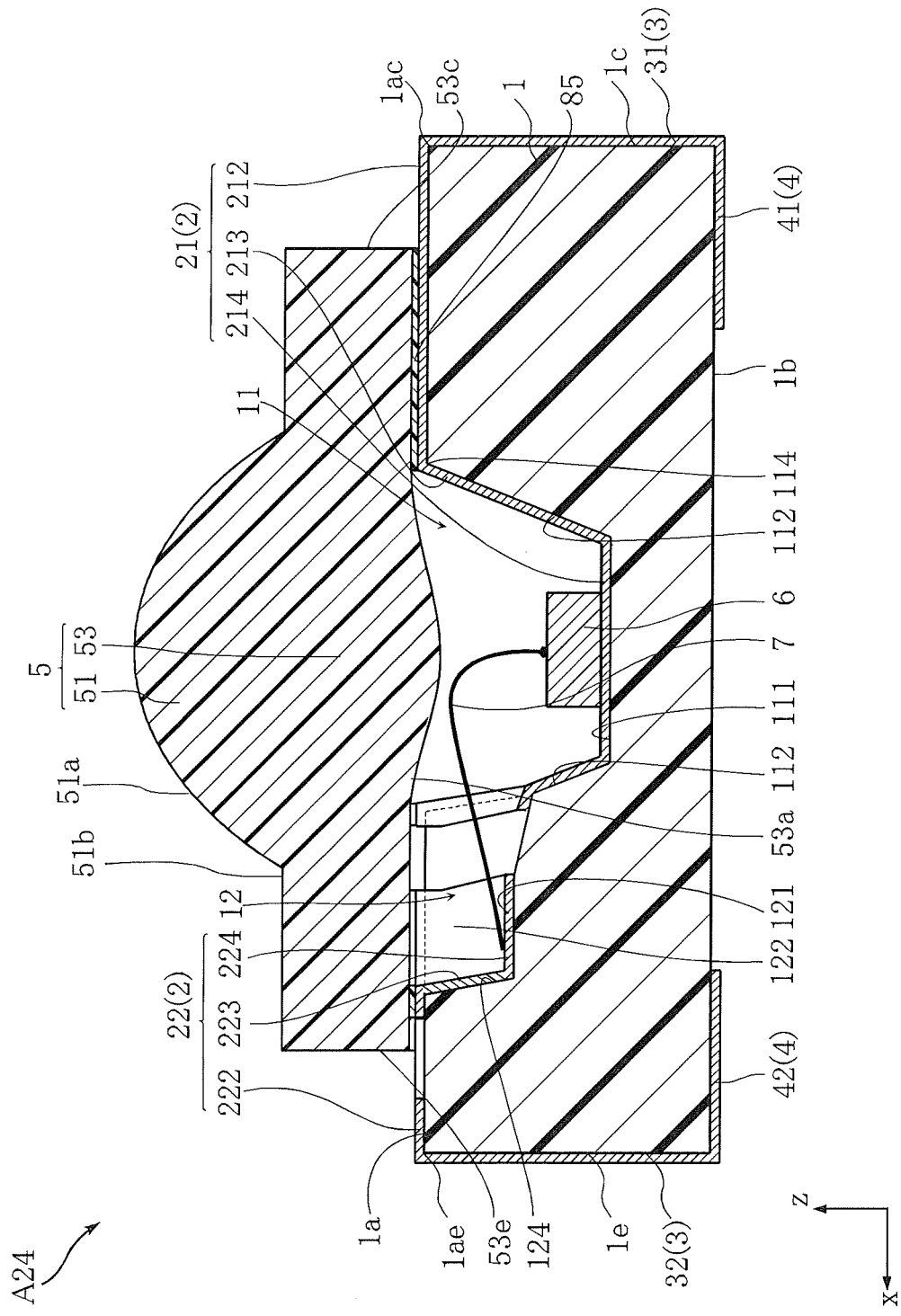
FIG. 32 is a sectional view illustrating a light emitting device according to a fourth variation of the second embodiment of the present invention.
Figure 33:
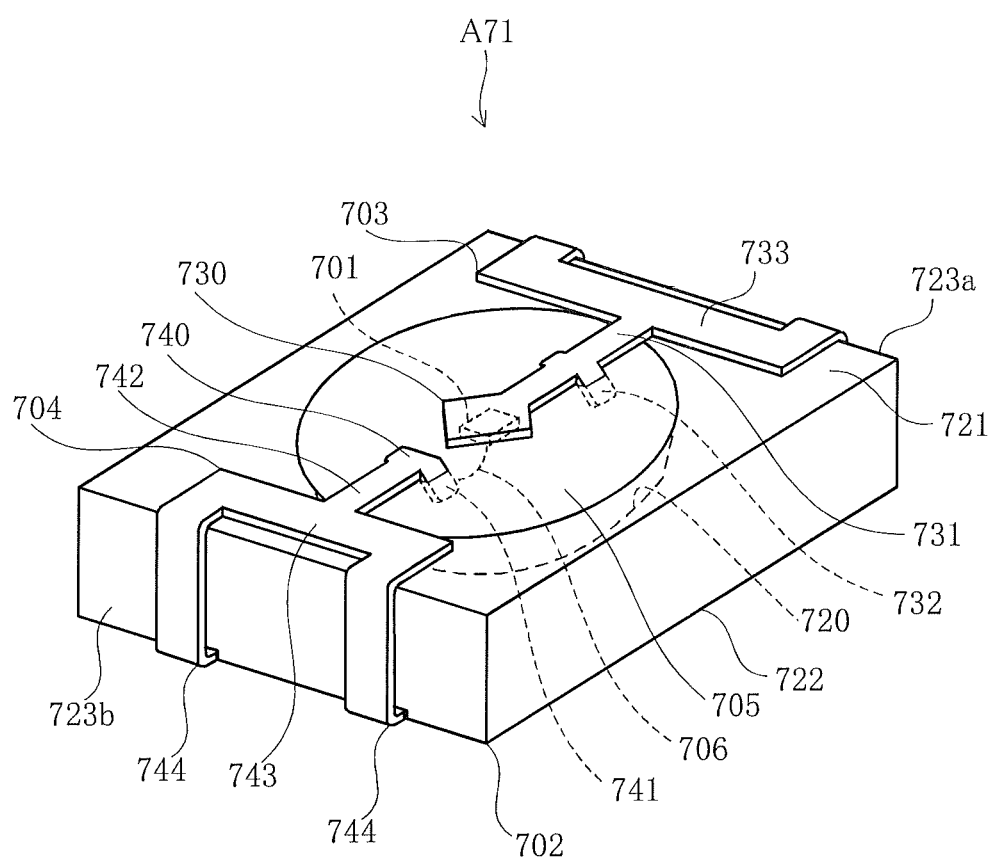
FIG. 33 is a perspective view illustrating a light emitting device according to a third embodiment of the present invention.

A fourth variation of the present embodiment is described below with reference to FIG. 32. The light emitting device A24 illustrated in the figure differs from the light emitting device A2 in that the first surface 53a bulges in the direction opposite to direction z (i.e. bulges toward the first recess 11). According to the light emitting device A24, the light emitted from the light emitting element 6 is refracted at the first surface 53a which is a convex surface. As a result, a large amount of light from the light emitting element 6 can be caused to travel in direction z. Thus, the light emitting device A24 is suitable for enhancing the intensity of front illumination.

The arrangement of this variation is also applicable to each of the light emitting devices A21-A23.

FIGS. 33-36 illustrate a light emitting device according to a third embodiment of the present invention. The illustrated light emitting device A71 is a reflective-type LED module for reflecting the light from the LED element 701 to guide the light to the outside. The LED module A71 includes an LED element 701, a case 702, a first lead 703, a second lead 704 and light transmitting resin 705.

The LED element 701 includes an n-type semiconductor layer, a p-type semiconductor layer, and an active layer for emitting infrared light interposed between the semiconductor layers. The LED element 701 is a semiconductor device which is rectangular in plan view. The LED element 701 is designed to emit light mainly from the main surface (lower surface in FIG. 33) and side surfaces. One side of the LED element 701 is e.g. about 0.3 mm. On the main surface of the LED element 701, a partial electrode is provided, to which an end of the wire 706 is electrically connected. On the bottom surface of the LED element 701, an electrode (not shown) is formed, which is electrically connected to the first lead 703.

The case 702 is formed by e.g. hardening non-light-transmitting epoxy resin or liquid crystal polymer. The case 702 includes a top surface 721, a bottom surface 722, and a first and a second side surfaces 723a and 723b which are connected to the top surface 721 and the bottom surface 722. The top surface 721 is formed, at the center thereof, with a recess which is circular in plan view. The recess includes a concave inner surface processed by e.g. gold plating and thereby serving as a reflective surface 720 for reflecting light. The recess is filled with light transmitting resin 705.

The first lead 703 is made of a metal such as Fe—Ni alloy or Cu alloy. The first lead 703 extends from an end of the bottom surface 722, along the first side surface 723a and the top surface 721, and reaches the position above the center of the reflective surface 720. The first lead 703 includes a die pad portion 730, an inner lead portion 731, projecting portions 732 and an outer lead portion 733.

Figure 34:
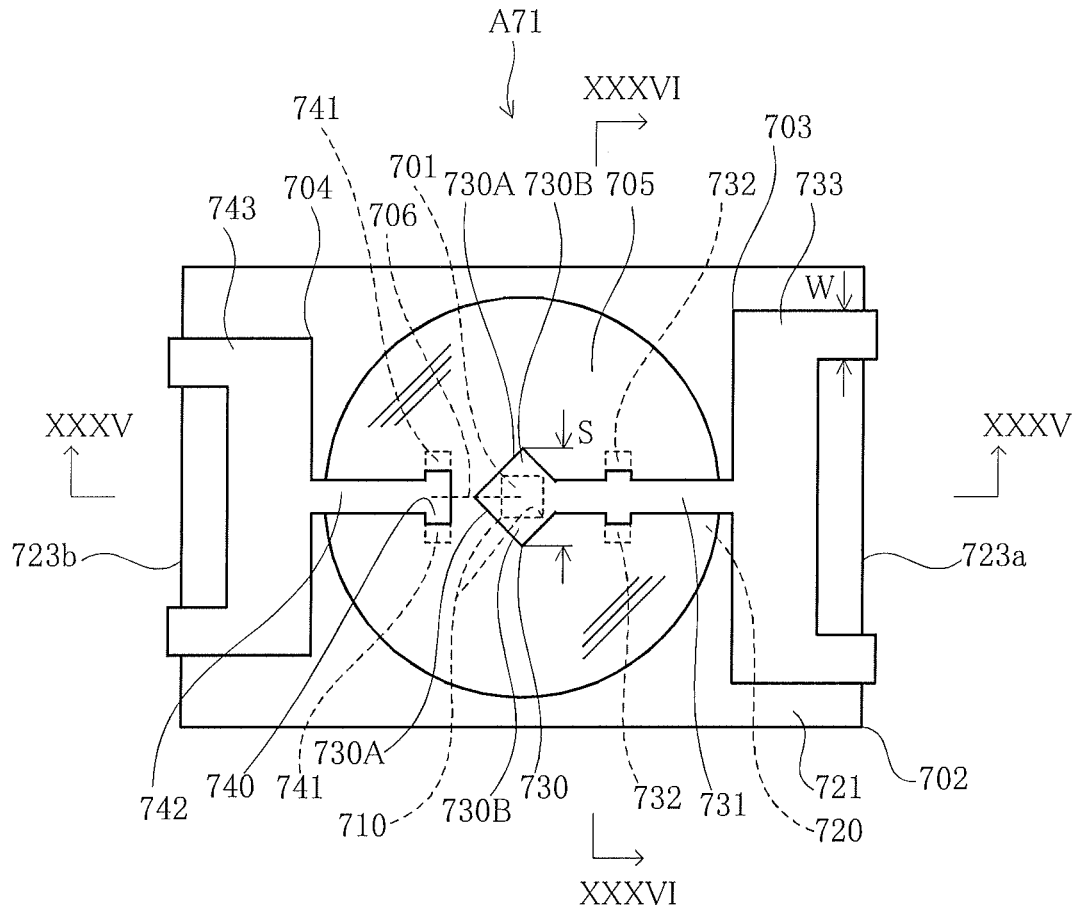
FIG. 34 is a plan view illustrating the light emitting device of FIG. 33.

The die pad portion 730 is positioned almost directly above the center of the reflective surface 720. As illustrated in FIG. 34, the die pad portion 730 is rectangular in plan view and its maximum dimension S along the diagonal is e.g. about 0.71 mm. All the sides 730A of the die pad portion 730 are oblique to the longitudinal direction of the inner lead portion 731. One of the corners of the die pad portion 730 is close to a bonding portion 740 of a second lead 740, which will be described later. On the die pad portion 730, the LED element 701 is bonded to face the reflective surface 720. The LED element 701 is oriented in such a manner that each corner 710 faces a respective one of the sides 730A of the die pad portion 730. The LED element 701 is bonded, at the bottom surface, to the die pad portion 730 with a conductive adhesive. According to this embodiment, a relatively large space 730B is secured in the die pad portion 730 at a portion adjacent to each corner thereof.

Figure 36:
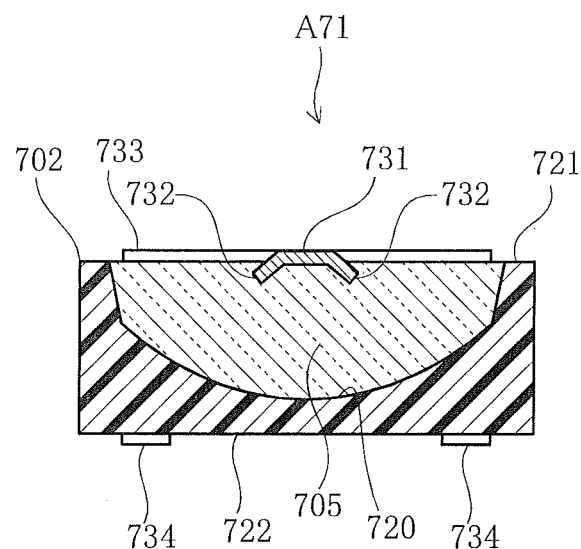
FIG. 36 is a sectional view taken along lines XXXVI-XXXVI in FIG. 34.

The inner lead portion 731 extends, above the reflective surface 720, from the die pad portion 730 onto the top surface 721 of the case 702. The width of the inner lead portion 731 is smaller than the maximum dimension S of the die pad portion 730. As illustrated in FIG. 36, the inner lead portion 731 is provided with the projecting portions 732. The projecting portions 732 are inclined from the surface of the light transmitting resin 705 toward the reflective surface 720. On each side of the inner lead portion 731, the projecting portions 732 are embedded in the light transmitting resin 705.

The outer lead portion 733 extends from the inner lead portion 731 to the upper end of the first side surface 723a, then along the first side surface 723a to the lower end of the side surface 723a, and further onto an end of the bottom surface 722. The leading end of the outer lead portion 733 on the bottom surface 722 serves as an electrode terminal 734, which is to be bonded to a non-illustrated board. The outer lead portion 733 is branched into two portions on the top surface 721. Accordingly, the electrode terminal 734 is made up of two portions. The width W of each of the two branch portions of the outer lead portion 733 is e.g. about 0.35 mm. The total width of the two branch portions (2×W) is smaller than the maximum dimension S of the die pad portion 730.

Similarly to the first lead 703, the second lead 704 is made of a metal such as Fe—Ni alloy or Cu alloy. The second lead 704 extends from an end of the bottom surface 722, along the second side surface 723b, and up to the top surface 721. The second lead 704 further extends to reach the position above the reflective surface 720 and close to the die pad portion 730. The second lead 704 includes a bonding portion 740, projecting portions 741, an inner lead portion 742, and an outer lead portion 743.

Figure 35:
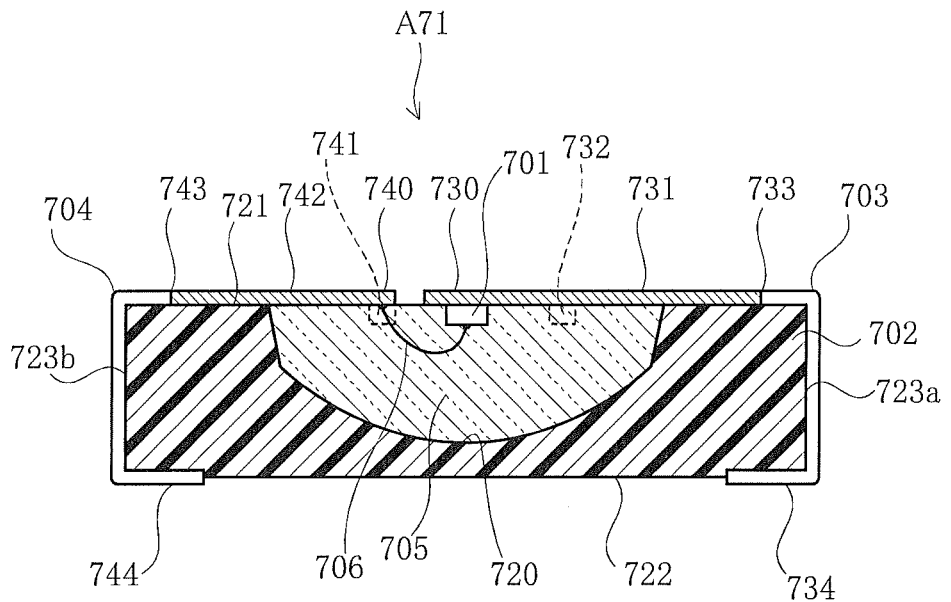
FIG. 35 is a sectional view taken along lines XXXV-XXXV in FIG. 34.

The bonding portion 740 is connected to the LED element 701 by the bonding wire 706. The bonding portion 740 is positioned close to a corner of the die pad portion 730 while being appropriately spaced from the corner. As illustrated in FIG. 35, one end of the bonding wire 706 is bonded to the bonding portion 740. The other end of the bonding wire 706 is bonded to the partial electrode formed on the main surface of the LED element 701. As illustrated in FIG. 34, the bonding portion 740 is provided with the projecting portions 741. The projecting portions 741 are inclined from the surface of the light transmitting resin 705 toward the reflective surface 720. On each side of the bonding portion 740, the projecting portions 741 are embedded in the light transmitting resin 705.

The inner lead portion 742 extends, above the reflective surface 720, from the bonding portion 740 onto the top surface 721 in the direction away from the first lead 703. The width of the inner lead portion 742 is substantially equal to that of the inner lead portion 731 of the first lead 703.

The outer lead portion 743 extends from the inner lead portion 742 to the upper end of the second side surface 723b, then along the second side surface 723b to the lower end of the side surface 723b, and further onto an end of the bottom surface 722. The leading end of the outer lead portion 743 on the bottom surface 722 serves as an electrode terminal 744, which is to be bonded to a non-illustrated board. The outer lead portion 743 is branched into two portions on the top surface 721. Accordingly, the electrode terminal 744 is made up of two portions.

The light transmitting resin 705 comprises e.g. epoxy resin or silicone resin loaded into the recess of the case 702 and hardened. To efficiently guide the light from the LED element 701, it is preferable that the light transmitting resin 705 is transparent. To the surface of the light transmitting resin 705, part of the first and the second leads 703 and 704 (die pad portion 730, inner lead portion 731, bonding portion 740, and inner lead portion 742) is bonded. The light emitted from the LED element 701 passes through the light transmitting resin 705 and is then reflected by the reflective surface 720. The light reflected by the reflective surface 720 again passes through the light transmitting resin 705 to be emitted to the outside through the surface of the light transmitting resin 705. In this process, the die pad portion 730, the inner lead portion 731, the bonding portion 740 and the inner lead portion 742, which lie over the reflective surface 720, act as a light shielding portion.

The advantages of the LED module A71 are described below.

In bonding the LED element 701 onto the die pad portion 730, a larger amount of excess conductive adhesive tends to be pressed out from the four sides of the LED element 701 than from the corners 710. Since a relatively large space 730B is secured in the die pad portion 730 at each corner which faces a respective side of the LED element 701, the excess adhesive is reliably received in the space 730B. Thus, the die pad portion 730 can be made small to such a degree that each side 730A adjoins a respective corner 710 of the LED element 701.

In the manufacturing process, the light transmitting resin 705 loaded in the recess of the case 702 is hardened, with the projecting portions 732 and 741 embedded in the light transmitting resin 705 in a posture inclined with respect to the surface of the light transmitting resin 705. As the light transmitting resin 705 hardens, the light transmitting resin 705 adheres to the projecting portions 732 and 741 so that the projecting portions 732 and 741 become unremovable from the light transmitting resin 705. With this anchoring effect, the inner lead portion 731 and the bonding portion 740, and the die pad portion 730 and the inner lead portion 742 connected to these portions as well, are reliably fixed to the surface of the light transmitting resin 705, and separation from the surface of the light transmitting resin is prevented.

In mounting the LED module A71 onto a non-illustrated board, solder for electrode bonding enters the space between the two branch portions of each of the electrode terminals 734 and 744. Thus, the LED module A71 is reliably and stably bonded.

In the LED module A71, most part of the light emitted from the LED element 701 reaches the reflective surface 720 through the light transmitting resin 705 and is efficiently reflected by the reflective surface 720. The reflected light is emitted to the outside of the case 702 through the light transmitting resin 705.

In this process, part of the light traveling toward the outside is blocked or reflected again toward the reflective surface 720 by the light shielding portion, i.e., the die pad portion 730, the inner lead portion 731, the bonding portion 740 or the inner lead portion 742. According to this embodiment, however, the light shielding portion is made relatively small, because the separation of the light shielding portion is prevented by the anchoring effect of the projecting portions 732 and 741.

In particular, the die pad portion 730 is made small correspondingly to the size of the LED element 701 while securing a sufficient space 730B required for bonding the LED element 701. Thus, the light traveling toward the outside of the case 702 passes through a relatively large exposed region of the surface of the light transmitting resin 705, i.e., the region where the light shielding portion is not provided.

In this way, according to the LED module A71 of this embodiment, of the surface of the light transmitting resin, the area of the exposed region where light is not blocked can be made relatively large. As a result, a large amount of light can be emitted to the outside through the exposed region, so that the brightness of the module is enhanced.

Owing to the above-described anchoring effect, the light shielding portion is reliably prevented from separating from the light transmitting resin even when its area is made small.

FIGS. 37-42 illustrate light emitting devices (LED modules) according to a fourth to an eighth embodiments of the present invention. In these figures, the elements which are identical or similar to those of the third embodiment are designated by the same reference signs as those used for the third embodiment and the description thereof is omitted.

Figure 37:
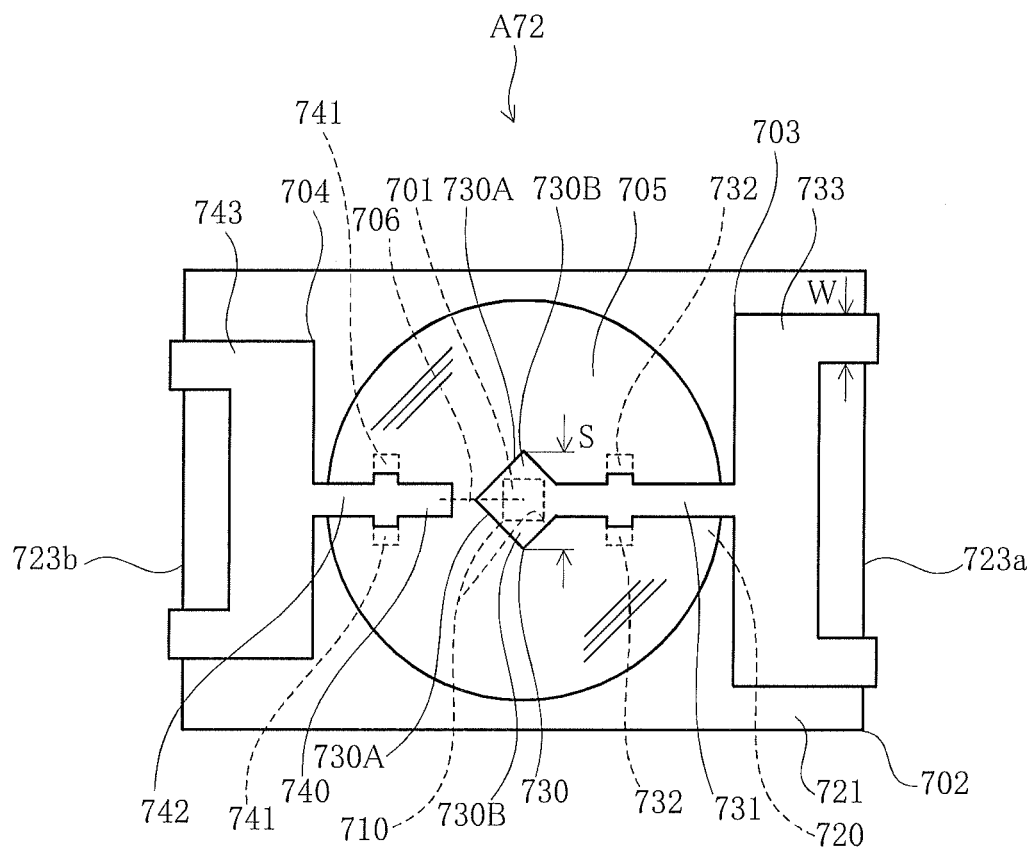
FIG. 37 is a plan view illustrating a light emitting device according to a fourth embodiment of the present invention.

FIG. 37 illustrates an LED module A72 according to a fourth embodiment of the present invention. In the LED module A72 illustrated in the figure, inclined projecting portions 741 are provided at the inner lead portion 742 of the second lead 704. With the LED module A72 again, the inner lead portion 742 is fixed to the surface of the light transmitting resin 705 due to the anchoring effect of the projecting portions 741, so that separation from the surface of the light transmitting resin 705 is reliably prevented.

Figure 38:
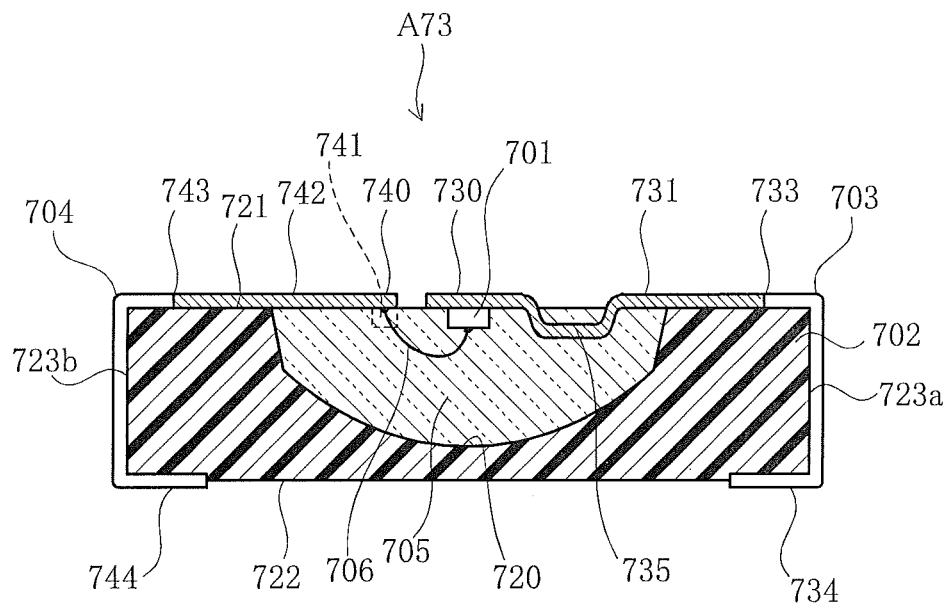
FIG. 38 is a sectional view illustrating a light emitting device according to a fifth embodiment of the present invention.

FIG. 38 illustrates an LED module A73 according to a fifth embodiment of the present invention. In the LED module A73 illustrated in the figure, the inner lead portion 731 is formed with a recess 735 embedded in the light transmitting resin 705. The recess 735 is completely embedded in the light transmitting resin 705 in loading the light transmitting resin 705 into the recess of the case 702 and hardening the light transmitting resin 705. As the light transmitting resin 705 hardens, the light transmitting resin 705 adheres to the outer surface of the recess 735 so that the recess 735 becomes unremovable from the light transmitting resin 705. Thus, with the LED module A73 again, the anchoring effect of the recess 735 reliably fixes the die pad 730 and the inner lead portion 731 to the surface of the light transmitting resin 705. Thus, separation of these portions from the surface of the light transmitting resin 705 is reliably prevented.

Figure 39:
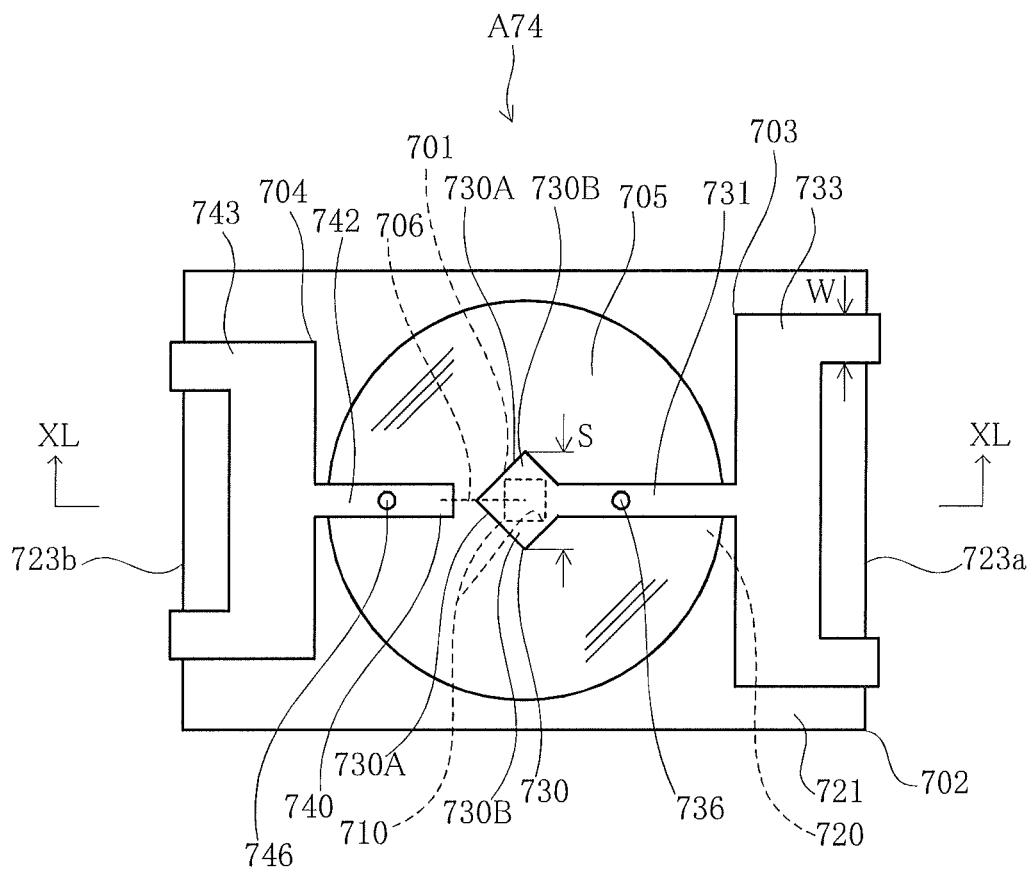
FIG. 39 is a plan view illustrating a light emitting device according to a sixth embodiment of the present invention.
Figure 40:
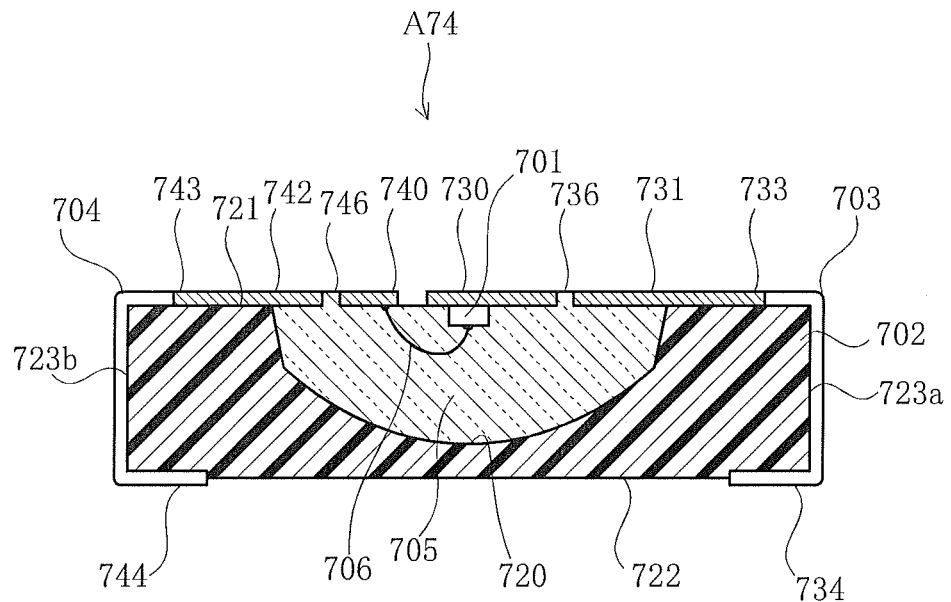
FIG. 40 is a sectional view taken along lines XL-XL in FIG. 39.

FIGS. 39 and 40 illustrate an LED module A74 according to a sixth embodiment of the present invention. In the LED module A74 illustrated in the figures, the inner lead portions 731 and 742 are formed with holes 736 and 746, respectively, for receiving the light transmitting resin 705. When the light transmitting resin 705 is loaded into the recess of the case 702, the light transmitting resin 705 fills or overflows the holes 736 and 746. As the light transmitting resin 705 hardens, the light transmitting resin 705 adheres to the inner surfaces of the holes 736 and 746 to engage with the holes 736 and 746. Thus, with the LED module A74 again, this anchoring effect of the holes 736 and 746 reliably fixes the inner lead portions 731 and 742 to the surface of the light transmitting resin 705. Thus, separation of these portions from the surface of the light transmitting resin 705 is reliably prevented.

Figure 41:
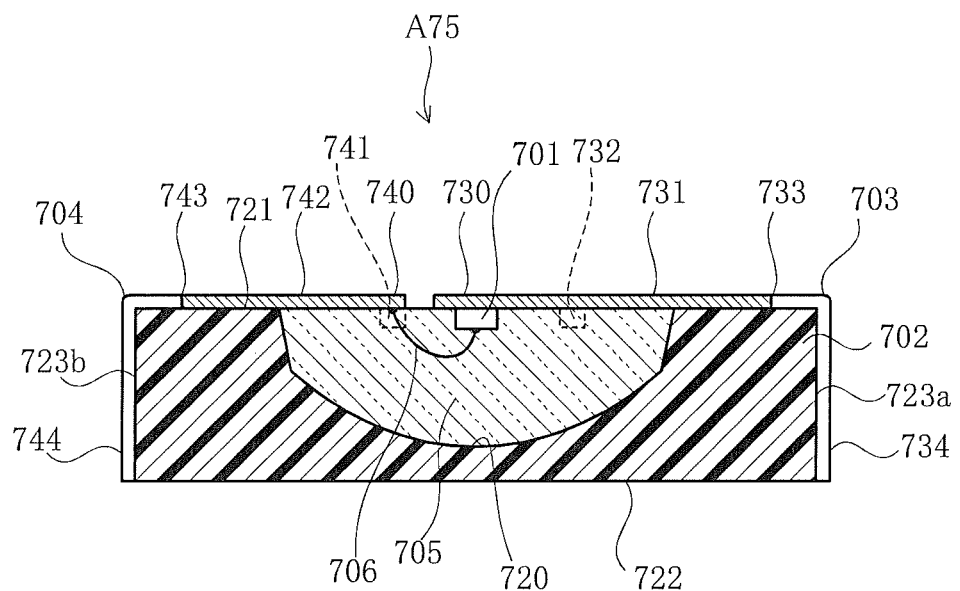
FIG. 41 is a sectional view illustrating a light emitting device according to a seventh embodiment of the present invention.

FIG. 41 illustrates an LED module A75 according to a seventh embodiment of the present invention. In the LED module A75 illustrated in the figure, the respective leading ends of the outer lead portions 733 and 743 are flush with the lower ends of the first side surface 723a and the second side surface 723b, respectively. Of the outer lead portions 733 and 734, the portions which are on the first side surface 723a and the second side surface 723b, respectively, serve as electrode terminals 734 and 744. The electrode terminals 734 and 744 are utilized as side electrodes. In mounting the LED module A75 on a non-illustrated board, solder for electrode bonding is applied to the side electrodes from a side of the case 702. In the LED module A75 again, the solder enters the space between the two branch portions of each of the electrode terminals 734 and 744. Thus, the LED module A75 is reliably and stably bonded.

Figure 42:
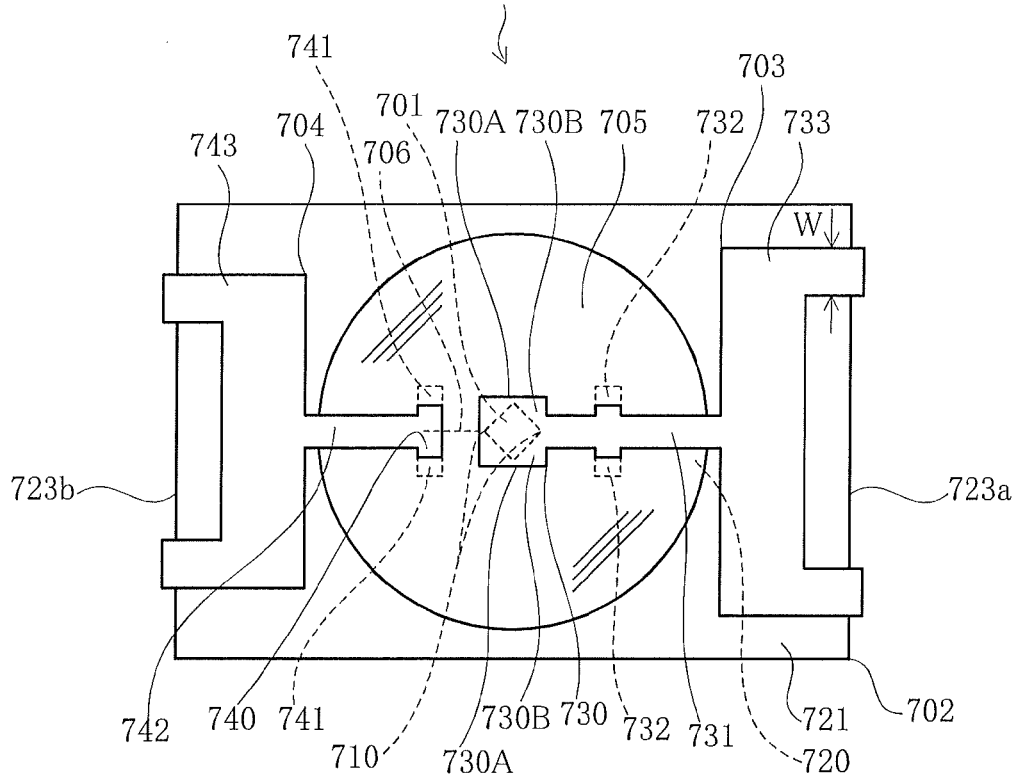
FIG. 42 is a plan view illustrating a light emitting device according to an eighth embodiment of the present invention.
Figure 43:
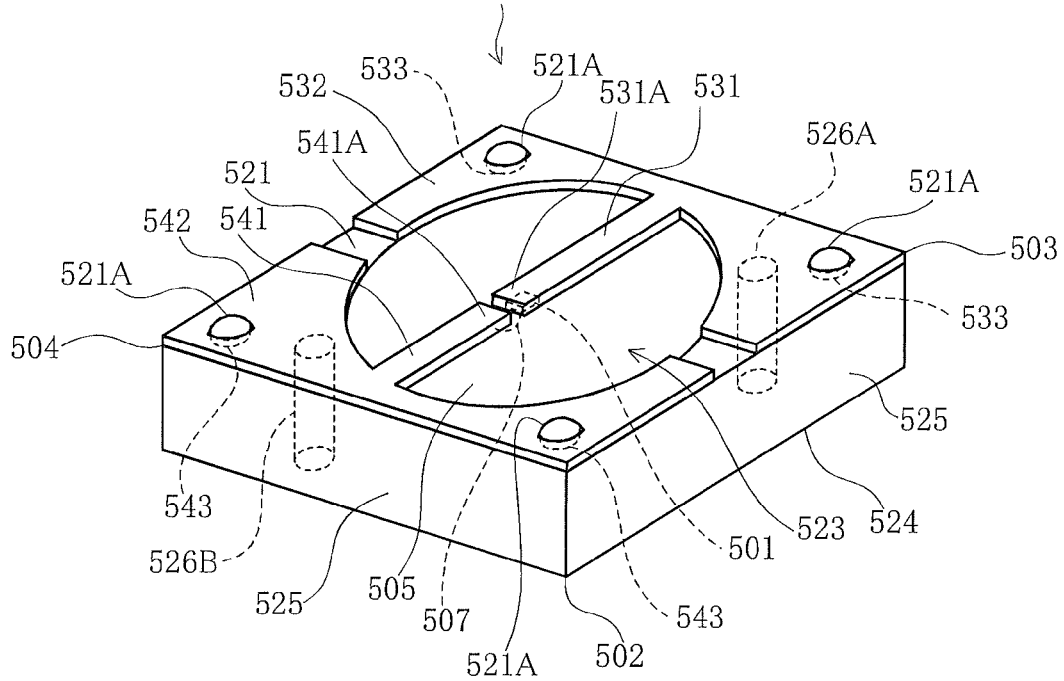
FIG. 43 is a perspective view illustrating a light emitting device according to a ninth embodiment of the present invention.
Figure 44:
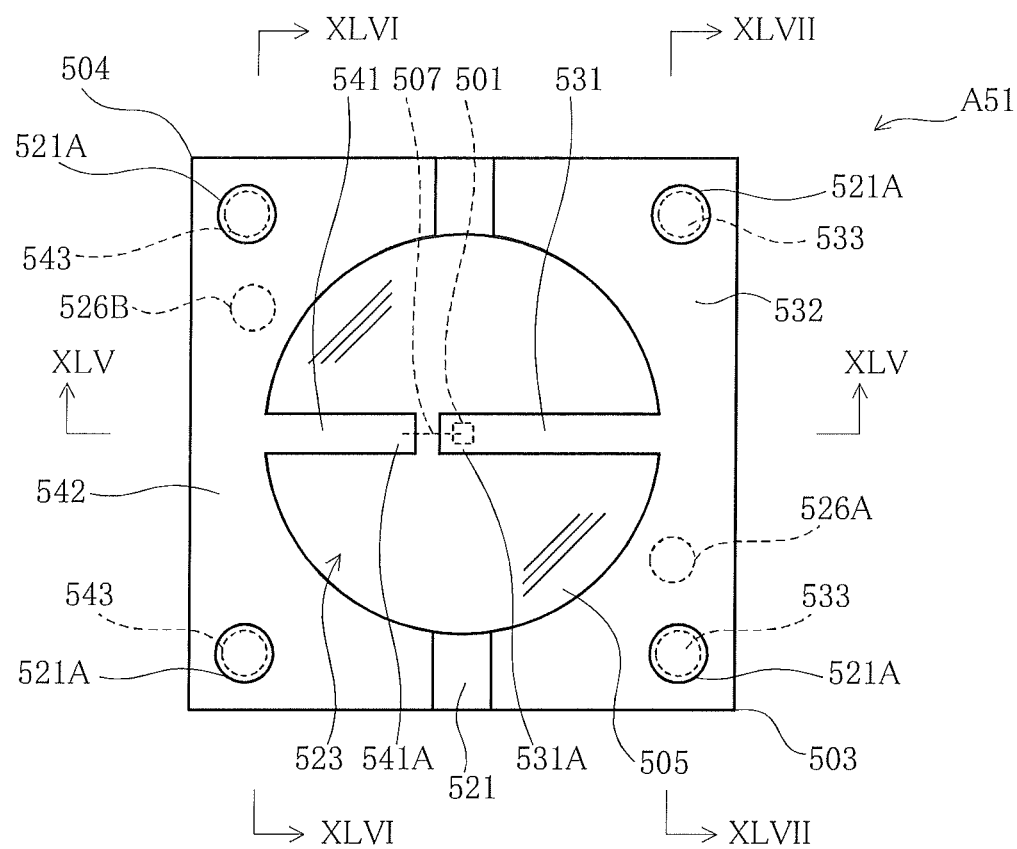
FIG. 44 is a plan view illustrating the light emitting device of FIG. 43.
Figure 45:
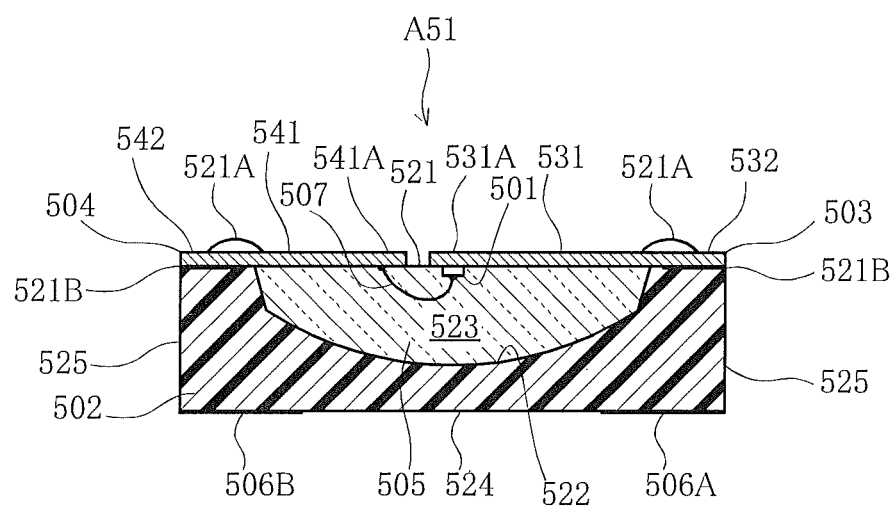
FIG. 45 is a sectional view taken along lines XLV-XLV in FIG. 44.

FIG. 42 illustrates an LED module A76 according to an eighth embodiment of the present invention. In the LED module A76, the die pad portion 730 is arranged in such a manner that a pair of opposite sides 730A of the die pad portion 730 extends in parallel with the longitudinal direction of the inner lead portion 731, whereas the other pair of opposite sides 730A of the die pad portion 730 extends perpendicularly to the longitudinal direction of the inner lead portion 731. One of the sides 730A of the die pad 730 is positioned close to the bonding portion 740 of the second lead 704. In the LED module A76 again, the LED element 701 is oriented in such a manner that each corner 710 faces a respective side 730A of the die pad portion 730. Thus, a relatively large space 730B is secured in the die pad portion 730 at a portion adjacent to each corner thereof. With this arrangement again, the die pad 730 can be made small, so that a larger amount of light can be emitted to the outside.

The specific structure of each part of the LED module can be varied in design in many ways. For instance, the projecting portion or the hole for providing anchoring effect may be formed only in either one of the first and the second leads.

Figure 46:
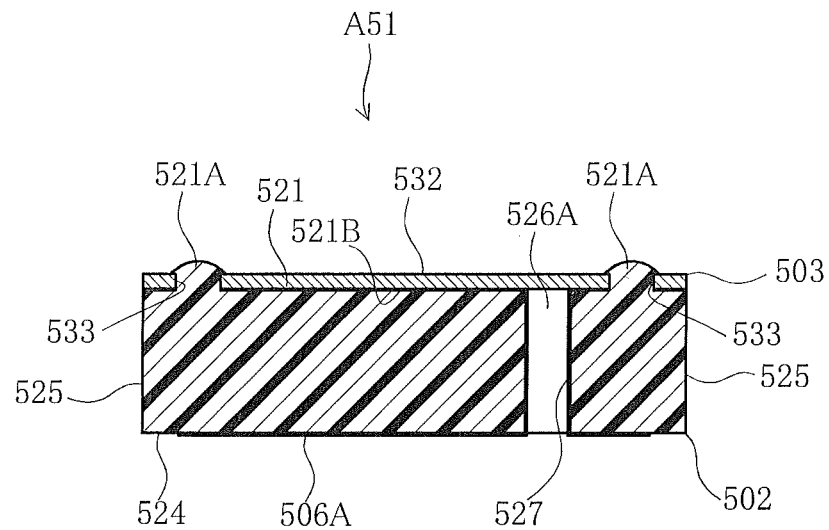
FIG. 46 is a sectional view taken along lines XLVI-XLVI in FIG. 44.
Figure 47:
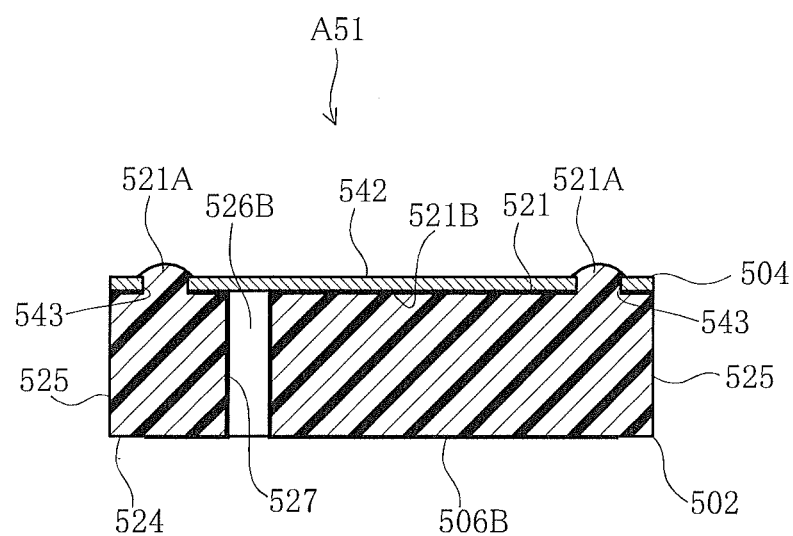
FIG. 47 is a sectional view taken along lines XLVII-XLVII in FIG. 44.
Figure 48:
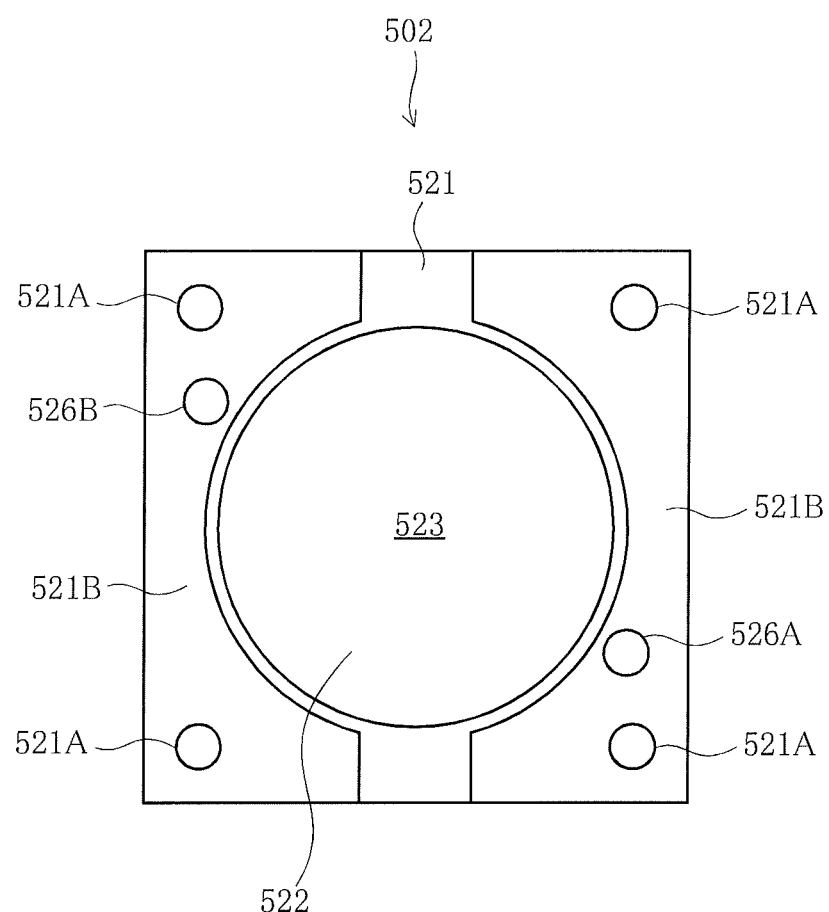
FIG. 48 is a plan view illustrating the case constituting the light emitting device of FIG. 43.

FIGS. 43-47 illustrate a light emitting device (LED module) according to a ninth embodiment of the present invention. FIG. 48 illustrates a case constituting the LED module. The LED module A51 of this embodiment is a reflective-type LED module for reflecting the light from the LED element 501 to guide the light to the outside. The LED module A51 includes an LED element 501, a case 502, a first lead 503, a second lead 504, a light transmitting resin 505, and a first and a second electrode terminals 506A, 506B (see FIG. 45).

The LED element 501 is a semiconductor device including an n-type semiconductor layer, a p-type semiconductor layer, and an active layer interposed between the semiconductor layers. The active layer emits e.g. infrared light. The LED element 501 is designed to emit much light from the outer surface. On the obverse surface of the LED element 501, a partial electrode is provided, to which an end of the wire 507 is electrically connected. On the bottom surface of the LED element 501, a full-surface electrode (not shown) is formed, which is electrically connected to the first lead 503.

The case 502 illustrated in FIG. 48 is formed by e.g. hardening non-light-transmitting epoxy resin or liquid crystal polymer. The case 502 includes a main surface 521 through which light is emitted. The main surface 521 has a size of e.g. about 2×2 mm. The main surface 521 is formed, at the center thereof, with a recess 523 which is circular in plan view. The recess 523 includes a concave inner surface (see FIG. 45) which is processed by e.g. gold plating and thereby serves as a reflective surface 522 for reflecting light. The recess 523 is filled with light transmitting resin 505.

The remaining portion of the main surface 521 is formed with a plating layer 521B, and engagement projections 521A engaging the first lead 503 or the second lead 504. As illustrated in FIGS. 46 and 47, each of the engagement projections 521A includes a body penetrating the lead 503 or 504 and an enlarged portion integrally formed on an end of the body. The plating layer 521B has a laminated structure of metals such as Cu, Ni and Au. The plating layer 521B is considerably thinner than the first and the second leads 503 and 504. The plating layer 521B is provided at regions corresponding to the first lead 503 and the second lead 504 and held in contact with the first lead 503 and the second lead 504. The case 502 includes a bottom surface 524 which is opposite to the main surface 521, and four side surfaces 525 which are substantially perpendicular to the main surface 521 and the bottom surface 524.

The case 502 is formed with a first and a second via holes 526A and 526B. The via holes 526A and 526B are provided by forming a through-hole extending from the main surface 521 to the bottom surface 524 in the thickness direction and then forming a conductive layer 527 on the inner surface and the periphery of the opening of the through-hole. The conductive layer 527 is connected to the plating layer 521B. The conductive layer 527 has e.g. a laminated structure made up of the same metals as those of the plating layer 521B. The conductive layer 521 is considerably thinner than the first and the second leads 503 and 504. The first via hole 526A (conductive layer 527) is electrically connected to the first lead 503 by way of the plating layer 521B, whereas the second via hole 526B is electrically connected to the second lead 504 by way of the plating layer 521B. The interior of the via holes may be completely filled with a conductive material.

The first lead 503 is made of a metal such as Fe—Ni alloy or Cu alloy. The first lead 503 is made by processing a lead frame into a predetermined size corresponding to about a half of the main surface 521. The first lead 503 is entirely thin. The first lead 503 is disposed to face about a half of the main surface 521. The first lead 503 includes an inner lead portion 531 and an outer lead portion 532.

The inner lead portion 531 extends from the periphery of the opening of the recess 523 to a position near the center of the recess 523 and lies over part of the reflective surface 522. The leading end of the inner lead portion 531, which is close to the center of the recess 523, constitutes a die pad portion 531A. The die pad portion 531A has a lower surface, on which the LED element 501 is bonded to face the reflective surface 522.

The outer lead portion 532 faces about a half portion, excluding the recess 523, of the main surface 521. The outer lead portion 532 is in contact with the plating layer 521B covering the half portion of the main surface 521. Thus, the outer lead portion 532 is electrically connected to the first via hole 526A. The outer lead portion 532 is formed with a plurality of holes 533 at locations corresponding to the engagement projections 521A. The engagement projections 521A are brought into engagement with the holes 533 by thermal caulking. Thus, the outer lead portion 532 is fixed to the main surface 521.

Similarly to the first lead 503, the second lead 504 is made by processing a lead frame into a predetermined size corresponding to about a half of the main surface 521. The second lead 504 is entirely thin. The second lead 504 is insulated from the first lead 503 and disposed to face about a half of the main surface 521. The second lead 504 includes an inner lead portion 541 and an outer lead portion 542.

The inner lead portion 541 extends from the periphery of the opening of the recess 523 toward the die pad portion 531A of the first lead 503 and lies over part of the reflective surface 522. The leading end of the inner lead portion 541, which is close to the die pad portion 531A, constitutes a bonding portion 541A. The bonding portion 541A has a lower surface, to which an end of the wire 507 connected to the LED element 501 is bonded.

The outer lead portion 542 faces about a half portion, excluding the recess 523, of the main surface 521 on the side opposite to the first lead 503 side. The outer lead portion 542 is in contact with the plating layer 521B covering the half portion of the main surface 521. Thus, the outer lead portion 542 is electrically connected to the second via hole 526B. The outer lead portion 542 is formed with a plurality of holes 543 at locations corresponding to the engagement projections 521A. The engagement projections 521A are brought into engagement with the holes 543 by thermal caulking. Thus, the outer lead portion 542 is fixed to the main surface 521.

Figure 49A:
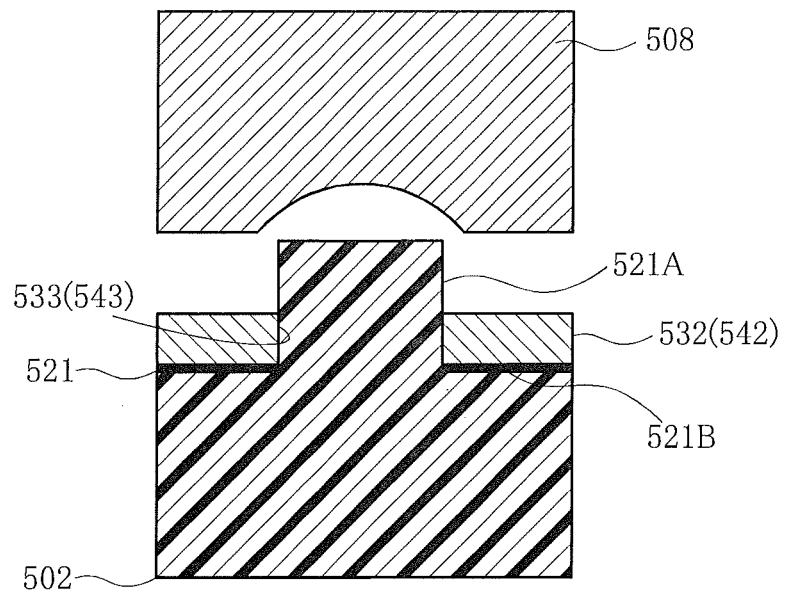
FIG. 49A illustrates a step of forming an engagement projection by using a pressing member.

Specifically, the first and the second leads 503 and 504 are fixed to the main surface 521 as follows. As illustrated in FIG. 49A, the engagement projection 521A of the main surface 521 initially has a simple columnar shape. The hole 533 or 543 of the outer lead portion 532 or 542 is fit around the simple columnar engagement projection 521A.

Figure 49B:
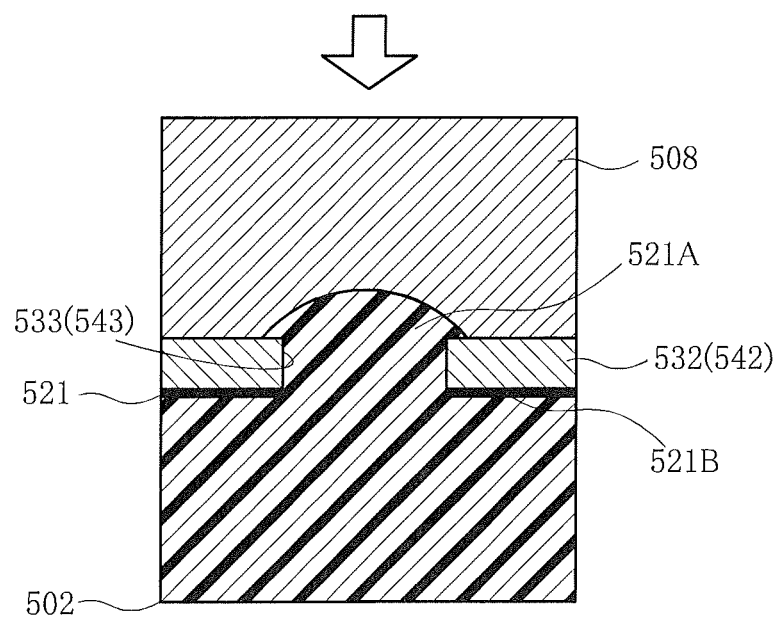
FIG. 49B illustrates a step subsequent to the step of FIG. 49A.

Then, as illustrated in FIG. 49B, the head of the engagement projection 521A is pressed with a pressing member 508. In this process, the pressing member 508 is heated with a non-illustrated heater. By this thermal caulking, the engagement projection 521A is deformed to spread beyond the periphery of the opening of the hole 533 or 543, so that the head (enlarged portion) is brought into engagement with the hole 533 or 543 (outer lead portion 532 or 542). In this way, the outer lead portions 532 and 542 are reliably fixed to the main surface 521.

The light transmitting resin 505 comprises e.g. epoxy resin or silicone resin loaded into the recess 523 and hardened. To efficiently guide the light from the LED element 501, it is preferable that the light transmitting resin 505 is transparent. To the surface of the light transmitting resin 505, inner lead portions 531 and 541 are bonded. The light emitted from the LED element 501 passes through the light transmitting resin 505 and is then reflected by the reflective surface 522. The light reflected by the reflective surface 522 again passes through the light transmitting resin 505 to be emitted to the outside through the surface of the light transmitting resin 505. In this process, the inner lead portions 531 and 541 act as a light shielding portion which blocks light traveling from the reflective surface 522 toward the outside.

In mounting the LED module A51 on a non-illustrated board, the first and the second electrode terminals 506A and 506B serve as an electrical connection portion. The first and the second electrode terminals 506A and 506B may have a laminated structure made up of the same metals as those of the plating layer 521B and the conductive layer 527. The first electrode terminal 506A is electrically connected to the first via hole 526A at an end of the bottom surface 524. Thus, the first electrode terminal 506A is electrically connected to the first lead 503. The second electrode terminal 506B is electrically connected to the second via hole 526B at an end of the bottom surface 524. Thus, the second electrode terminal 506B is electrically connected to the second lead 504.

The advantages of the LED module A51 are described below.

After the outer lead portions 532 and 542 are fixed to the main surface 521 by bringing the engagement projections 521A into engagement with the holes 533 and 543 by thermal caulking, light transmitting resin 505 is loaded into the recess 523. When the light transmitting resin 505 hardens, the inner lead portions 531 and 541 are fixed to the surface of the light transmitting resin 505. During this process, the inner lead portions 531 and 541 lie within the same plane as the outer lead portions 532 and 542 connected to the inner lead portions 531 and 541. Thus, inner lead portions 532 and 541 do not receive from the outer lead portions 532 and 542 a resilient force which hinders the fixation. Thus, inner lead portions 531 and 541 are strongly fixed to the surface of the light transmitting resin 505.

In the LED module A51 manufactured in the above-described way, the first and the second leads 503 and 504 are connected to the first and the second electrode terminals 506A and 506B through the via holes 526A and 526B, respectively. Thus, to manufacture the LED module A51, it is not necessary to perform the forming process to bend the first and the second leads 503 and 504 along the bottom surface 524 or the side surface 525 of the case 502. Thus, the manufacture of the LED module A51 is relatively easy, and a larger number of leads can be obtained from a single lead frame.

In the LED module A51, most part of the light emitted from the LED element 501 reaches the reflective surface 522 through the light transmitting resin 505 and is efficiently reflected by the reflective surface 522. The reflected light is emitted to the outside of the case 502 through the light transmitting resin 505.

In this process, part of the light traveling toward the outside is blocked or reflected again toward the reflective surface 522 by the inner lead portion 531 or 541. According to this embodiment, however, since the separation of the inner lead portions 531 and 541 is prevented due to its arrangement within the same plane as the outer lead portions 532 and 542 as described above, it is possible to make the inner lead portions 531 and 541 relatively narrow.

In this way, in the LED module A51 according to the present embodiment, since the first and the second leads 503 and 504 fixed to the main surface 521 do not include any bent portion, and hence, do not generate elastic recovery force, separation of the leads 50 and 504 from the case 502 is reliably prevented. Consequently, the inner lead portions 531 and 541, which act as a light shielding portion, can be made narrow, which leads to emission of a large amount of light to the outside of the case 502.

Figure 50:
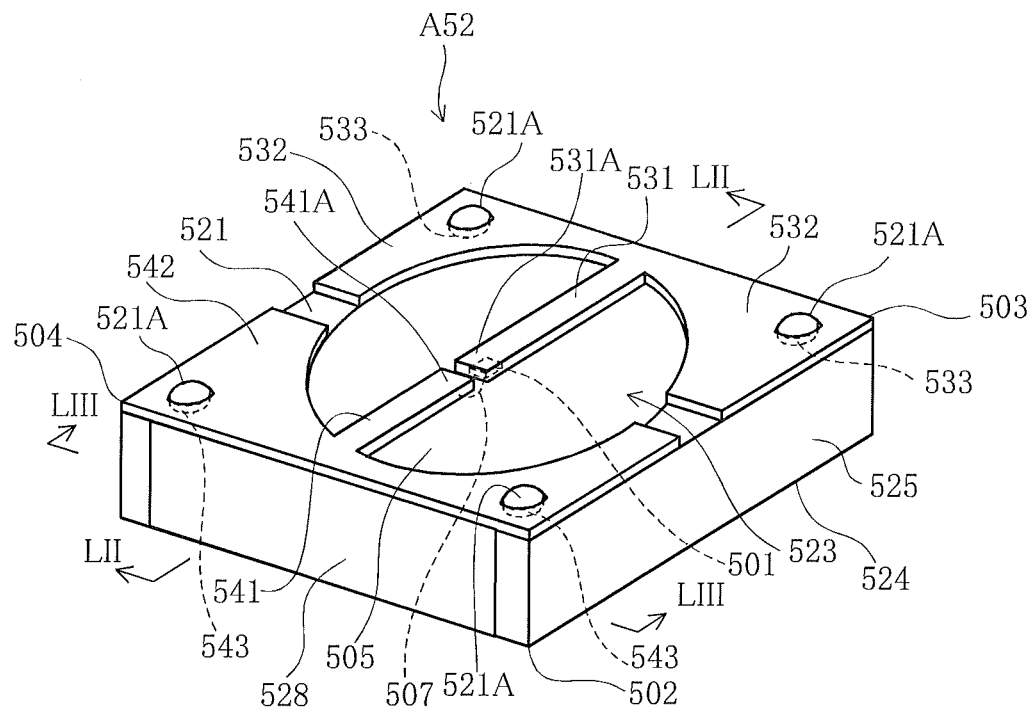
FIG. 50 is a perspective view illustrating a light emitting device according to a tenth embodiment of the present invention.
Figure 51:
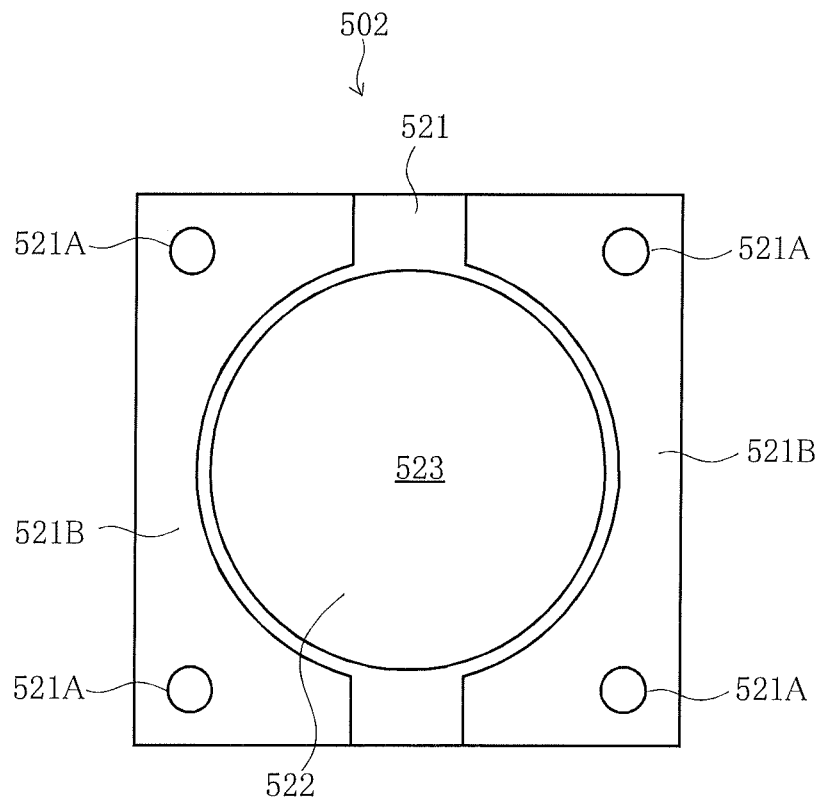
FIG. 51 is a plan view illustrating the case constituting the light emitting device of FIG. 50.
Figure 52:
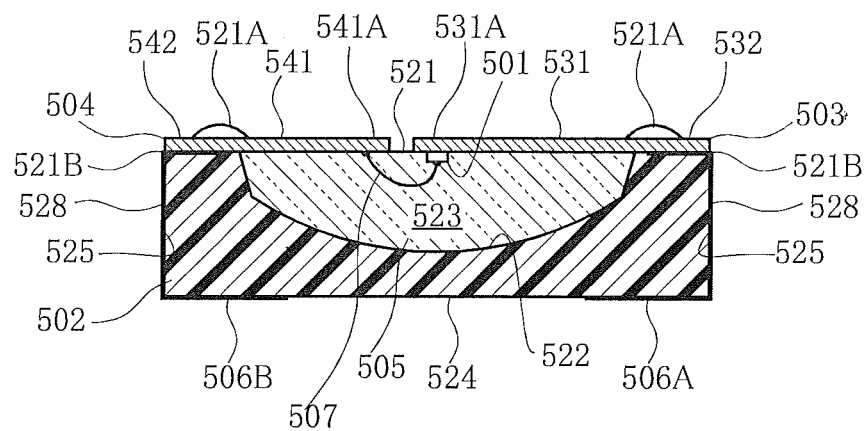
FIG. 52 is a sectional view taken along lines LII-LII in FIG. 50.
Figure 53:
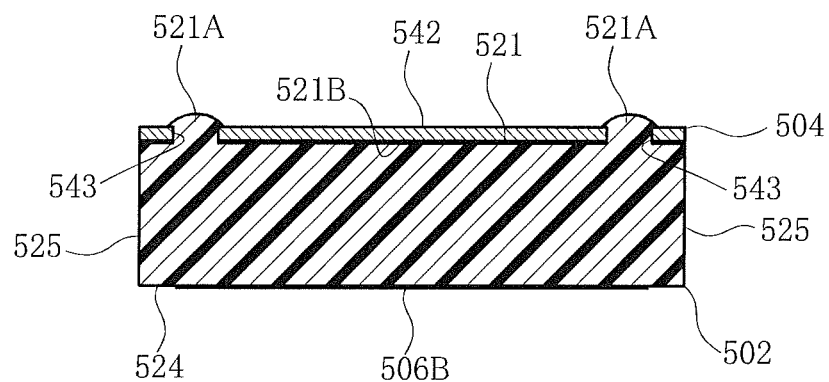
FIG. 53 is a sectional view taken along lines LIII-LIII in FIG. 50.

FIGS. 50, 52 and 53 illustrate a light emitting device (LED module) according to a tenth embodiment of the present invention. FIG. 51 illustrates a case constituting the LED module. In these figures, the elements which are identical or similar to those of the ninth embodiment are designated by the same reference signs as those used for the ninth embodiment, and the description thereof is omitted.

As illustrated in FIGS. 50 and 52, the LED module A52 of the tenth embodiment includes a pair of plating layers 528 formed on a pair of opposite side surfaces 525 of the case 502. The plating layers 528 are connected to the first and the second electrode terminals 506A and 506B, respectively. The plating layers 528 are made of the metal which forms the first and the second electrode terminals 506A and 506B, and utilized as part of the first and the second electrode terminals 506A and 506B. The plating layers 528 are connected to the plating layer 521B on the main surface 521. Thus, the f first and the second electrode terminals 506A and 506B are electrically connected to the first and the second leads 503 and 504, respectively.

In the LED module A52 again, the outer lead portions 532 and 542 are reliably fixed to the main surface 521 due to the engagement of the engagement projections 521A with the holes 533 and 543. The outer lead portions 532 and 542 lie within the same plane as the inner lead portions 531 and 541, face the main surface 521 only, and do not include any bent portion. Thus, a large number of leads can be obtained from a single lead frame, and separation of the first and the second leads 503 and 504 from the case 502 is reliably prevented. Thus, in the LED module A52 of this embodiment again, the inner lead portions 531 and 541, which act as a light shielding portion, can be made narrow, which leads to emission of a large amount of light to the outside of the case 502.

Figure 54:
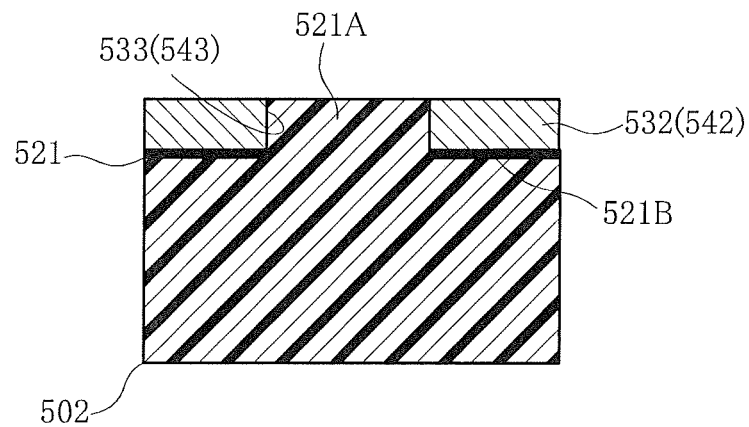
FIG. 54 is a sectional view illustrating a light emitting device according to an eleventh embodiment of the present invention.
Figure 55:
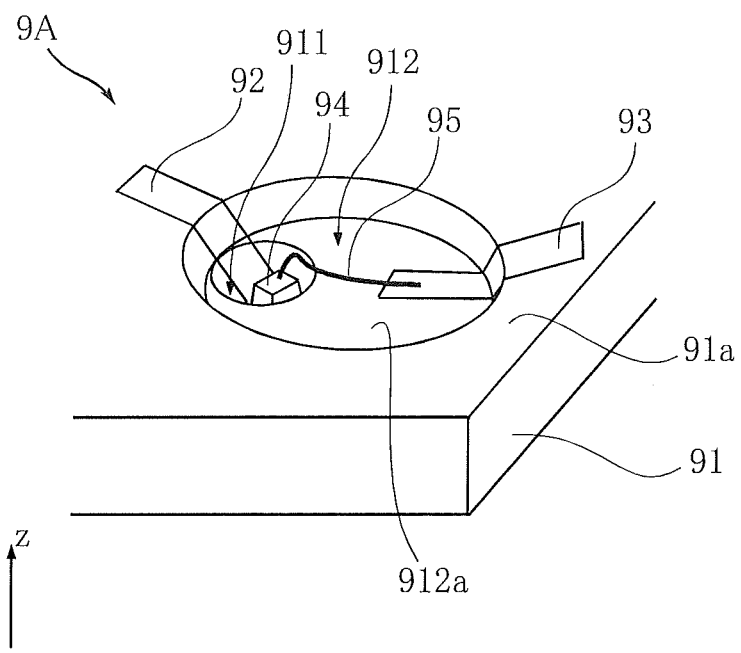
FIG. 55 is a perspective view illustrating an example of conventional light emitting device.
Figure 56:
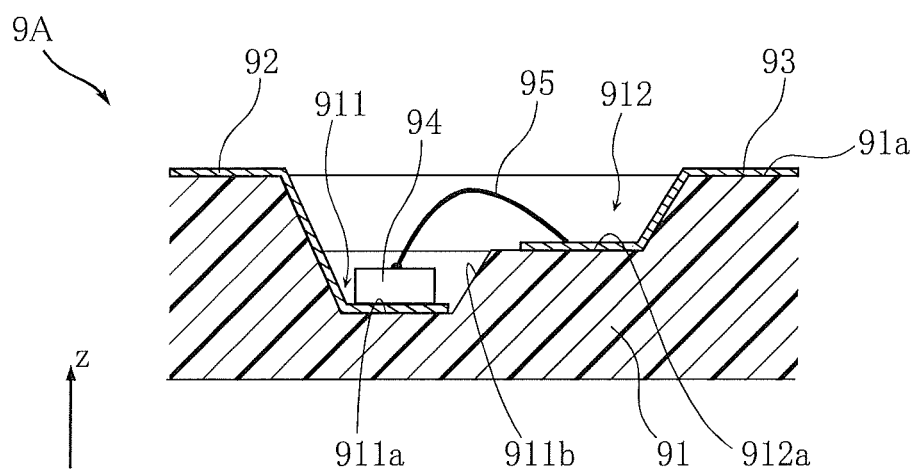
FIG. 56 is a sectional view illustrating the light emitting device of FIG. 55.
Figure 57:
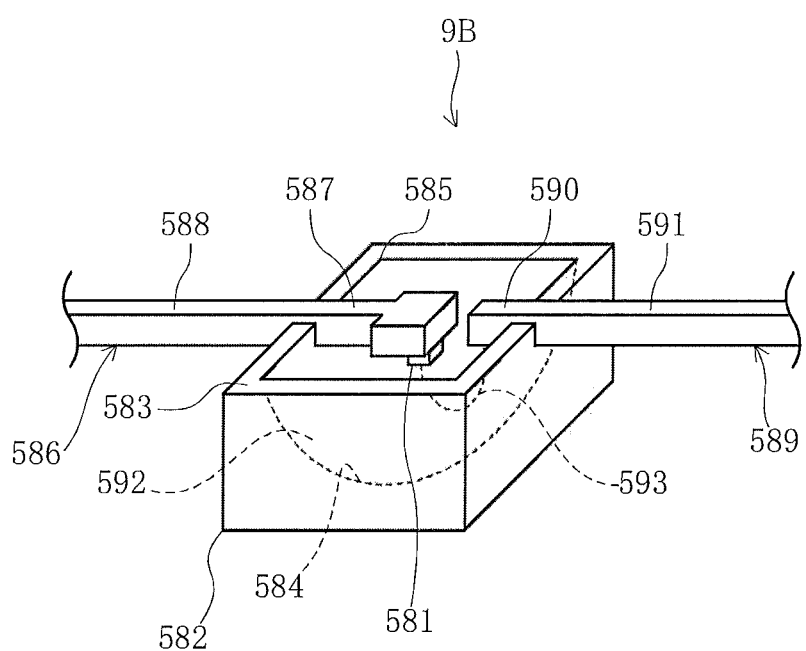
FIG. 57 is a perspective view illustrating another example of conventional light emitting device.

As illustrated in FIG. 54, the engagement projection 521A may be pressed until its top surface is flush with the opening surface of the hole 533 or 543. In pressing the engagement projection 521A, the inner surface of the hole 533 or 543 and the engagement projection 521A bond together due to heat. Thus, the engagement projection 521A engages with the hole 533 or 543, so that the outer lead portions 532 and 542 are reliably fixed to the main surface 521.

In the above-described LED modules, the LED element may be mounted on the upper surface of a lead which faces outside so that light from the LED element is directly emitted toward the outside without reflection.

The structure of the third through the eleventh embodiments described above and the variations will be presented as the invention described in the following appendixes.

APPENDIX 1

An LED module comprising:
an LED element that is rectangular in plan view;
a case including a concave reflective surface; and
a first lead lying over part of the reflective surface, wherein:
the first lead includes a die pad portion that is rectangular in plan view; and
the LED element is bonded to the die pad portion to face the reflective surface, with each of corners of the LED element facing a respective one of sides of the die pad portion.

APPENDIX 2

The LED module according to appendix 1, wherein the first lead further includes an elongated first inner lead portion extending from the die pad portion; and the sides of the die pad portion extend obliquely to the first inner lead portion.

APPENDIX 3

The LED module according to appendix 2, further comprising a second lead lying over part of the reflective surface; wherein the second lead includes a bonding portion connected to the LED element by a wire; and one of corners of the die pad portion faces the bonding portion.

APPENDIX 4

The LED module according to appendix 1, wherein the first lead further includes an elongated first inner lead portion extending from the die pad portion; and the sides of the die pad portion extend in parallel or perpendicularly to the first inner lead portion.

APPENDIX 5

The LED module according to appendix 4, further comprising a second lead lying over part of the reflective surface; wherein the second lead includes a bonding portion connected to the LED element by a wire; and one of the sides of the die pad portion is close to the bonding portion.

APPENDIX 6

The LED module according to appendix 3, further comprising a light transmitting resin;
wherein the second lead further includes an elongated second inner lead portion extending from the bonding portion; and the light transmitting resin is loaded between the first inner lead portion and the reflective surface and between the second inner lead portion and the reflective surface.

APPENDIX 7

The LED module according to appendix 6, wherein at least one of the first inner lead portion and the second inner lead portion includes a projecting portion inclined with respect to a surface of the light transmitting resin and embedded in the light transmitting resin.

APPENDIX 8

The LED module according to appendix 6, wherein at least one of the first inner lead portion and the second inner lead portion includes a recess embedded in the light transmitting resin.

APPENDIX 9

The LED module according to appendix 6, wherein at least one of the first inner lead portion and the second inner lead portion is formed with a hole in which the light transmitting resin enters.

APPENDIX 10

The LED module according to appendix 6, wherein the bonding portion includes a projecting portion inclined with respect to a surface of the light transmitting resin and embedded in the light transmitting resin.

APPENDIX 11

The LED module according to appendix 6, wherein at least one of the first lead and the second lead includes an outer lead portion connected to the inner lead portion and extending along the case; and the outer lead portion is branched into two portions.

APPENDIX 12

The LED module according to appendix 11, wherein the case includes a bottom surface opposite to the reflective surface; and the outer lead portion of at least one of the first lead and the second lead includes a leading end on the bottom surface of the case.

APPENDIX 13

The LED module according to appendix 11, wherein the case includes a side surface facing in a different direction from the reflective surface; and the outer lead portion of at least one of the first lead and the second lead includes a leading end on the side surface.

APPENDIX 14

An LED module comprising:
an LED element;
a case including a main surface; and
a first lead which is disposed along the main surface and to which the LED element is bonded;
wherein part of the main surface and part of the first lead engage with each other.

APPENDIX 15

The LED module according to appendix 14, further comprising a second lead disposed along the main surface and connected to the LED element by a wire;
wherein part of the main surface and part of the second lead engage with each other.

APPENDIX 16

The LED module according to appendix 15, wherein each of the first lead and the second lead is formed with a hole in which part of the main surface enters.

APPENDIX 17

The LED module according to appendix 16, further comprising:
a first electrode terminal;
a second electrode terminal;
a first via hole penetrating the case; and
a second via hole penetrating the case;
wherein the case includes a bottom surface opposite to the main surface; both of the first electrode terminal and the second electrode terminal are formed on the bottom surface; the first via hole is electrically connected to both of the first lead and the first electrode terminal; and the second via hole is electrically connected to both of the second lead and the second electrode terminal.

APPENDIX 18

The LED module according to appendix 16, further comprising:
a first electrode terminal; and
a second electrode terminal;
wherein the case includes two side surfaces opposite to each other; the first electrode terminal is formed on one of the side surfaces and electrically connected to the first lead; and the second electrode terminal is formed on the other one of the side surfaces and electrically connected to the second lead.

APPENDIX 19

The LED module according to appendix 15, wherein the first lead includes a die pad portion to which the LED element is bonded; the second lead includes a bonding portion to which the wire is bonded; and the case includes a concave reflective surface facing the LED element.

APPENDIX 20

The LED module according to appendix 19, further comprising a light transmitting resin covering the reflective surface and the LED element.

The invention claimed is:

1. A light emitting device comprising:
a substrate including an obverse surface and a reverse surface spaced apart from each other in a thickness direction of the substrate, the substrate being formed with a recessed portion having an opening flush with the obverse surface, the obverse surface including a neighboring area surrounding the opening;
a light emitting element disposed in the recessed portion; and
a lens fixed to the substrate and spaced apart from the light emitting element, the lens overlapping the entirety of the opening as viewed in the thickness direction,
wherein the lens includes a convex portion and a surrounding portion formed integral with the convex portion, the surrounding portion surrounding the convex portion as viewed in the thickness direction,
wherein the surrounding portion of the lens is fixed to the neighboring area of the obverse surface of the substrate in a manner such that the convex portion of the lens is located above the light emitting element,
wherein the light emitting device further comprises an air vent that allows the recessed portion to communicate with an outside of the light emitting device,
wherein the recessed portion includes a first recess and a second recess, the first recess including a first bottom surface and a first side surface connected to the first bottom surface, the light emitting element being disposed on the first bottom surface, the second recess including a second bottom surface and a second side surface connected to the second bottom surface,
wherein both of the first side surface and the second side surface reach the obverse surface of the substrate, the first side surface being connected to both of the second bottom surface and the second side surface,
wherein an opening area of the first recess is larger than an opening area of the second recess,
wherein the light emitting device further comprises a wire including a first end and a second end opposite to each other, the first end being connected to the light emitting element, the second end being bonded to the second bottom surface, and
wherein the air vent, the second end of the wire, and the light emitting element are aligned along a straight line as viewed in the thickness direction of the substrate.

2. The light emitting device according to claim 1, wherein the convex portion of the lens and the surrounding portion of the lens are made of a same resin material.

3. The light emitting device according to claim 1, wherein the substrate includes a side surface disposed between the obverse surface and the reverse surface, the surrounding portion of the lens includes a side surface, and the side surface of the lens and the side surface of the surrounding portion are flush with each other.

4. The light emitting device according to claim 1, wherein the air vent is disposed between the substrate and the lens.

5. The light emitting device according to claim 1, further comprising an adhesive layer for bonding the lens to the obverse surface of the substrate.

6. The light emitting device according to claim 1, further comprising a wiring pattern formed on the obverse surface of the substrate and connected to the light emitting element, wherein the wiring pattern is disposed outside of the air vent.

7. The light emitting device according to claim 1, wherein the air vent is rectangular in cross section.

8. The light emitting device according to claim 5, wherein the adhesive is disposed outside of the air vent.

9. A light emitting device, comprising:
a substrate including an obverse surface and a reverse surface spaced apart from each other in a thickness direction of the substrate, the substrate being formed with a recessed portion having an opening flush with the obverse surface, the obverse surface including a neighboring area surrounding the opening;
a light emitting element disposed in the recessed portion; and a lens fixed to the substrate and spaced apart from the light emitting element, the lens overlapping the entirety of the opening as viewed in the thickness direction, wherein the lens includes a convex portion and a surrounding portion formed integral with the convex portion, the surrounding portion surrounding the convex portion as viewed in the thickness direction, wherein the surrounding portion of the lens is fixed to the neighboring area of the obverse surface of the substrate in a manner such that the convex portion of the lens is located above the light emitting element, wherein the light emitting device further comprises an air vent that allows the recessed portion to communicate with an outside of the light emitting device, wherein the recessed portion includes a first recess and a second recess, the first recess including a first bottom surface and a first side surface connected to the first bottom surface, the light emitting element being disposed on the first bottom surface, the second recess including a second bottom surface and a second side surface connected to the second bottom surface, wherein both of the first side surface and the second side surface reach the obverse surface of the substrate, the first side surface being connected to both of the second bottom surface and the second side surface, wherein an opening area of the first recess is larger than an opening area of the second recess, and wherein the air vent is adjacent to the second recess.

* * * * *